(12) United States Patent
Akimoto et al.

(10) Patent No.: US 9,852,926 B2
(45) Date of Patent: Dec. 26, 2017

(54) MANUFACTURING METHOD FOR SEMICONDUCTOR DEVICE

(71) Applicant: Semiconductor Energy Laboratory Co., Ltd., Atsugi-shi, Kanagawa-ken (JP)

(72) Inventors: Kengo Akimoto, Isehara (JP); Yukinori Shima, Tatebayashi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/295,016

(22) Filed: Oct. 17, 2016

(65) Prior Publication Data
US 2017/0110337 A1 Apr. 20, 2017

(30) Foreign Application Priority Data

Oct. 20, 2015 (JP) .................................. 2015-206186

(51) Int. Cl.
*H01L 21/385* (2006.01)
*H01L 27/12* (2006.01)
(Continued)

(52) U.S. Cl.
CPC .......... *H01L 21/385* (2013.01); *H01L 27/127* (2013.01); *H01L 29/66969* (2013.01); *H01L 29/7869* (2013.01)

(58) Field of Classification Search
CPC combination set(s) only.
See application file for complete search history.

(56) References Cited

U.S. PATENT DOCUMENTS 5,528,032 A 6/1996 Uchiyama
5,731,856 A 3/1998 Kim et al.
(Continued)

FOREIGN PATENT DOCUMENTS

EP 1737044 A 12/2006
EP 2226847 A 9/2010
(Continued)

OTHER PUBLICATIONS

Asakuma.N. et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

(Continued)

*Primary Examiner* — Mamadou Diallo
(74) *Attorney, Agent, or Firm* — Robinson Intellectual Property Law Office; Eric J. Robinson

(57) ABSTRACT

A semiconductor device including an oxide conductor with high conductivity and high transmittance is provided. A manufacturing method for a semiconductor device includes the steps of: forming an oxide semiconductor over a first insulator; forming a second insulator over the first insulator and the oxide semiconductor; forming a first conductor over the second insulator; forming an etching mask over the first conductor; forming a second conductor including a region overlapping with the oxide semiconductor by etching the first conductor with use of the etching mask as a mask; removing the etching mask; and performing heat treatment after forming a hydrogen-containing layer over the second insulator and the second conductor.

32 Claims, 51 Drawing Sheets

(51) Int. Cl.
*H01L 29/66* (2006.01)
*H01L 29/786* (2006.01)

(56) References Cited

U.S. PATENT DOCUMENTS

| | | | |
|---|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0062436 A1 | 3/2011 | Yamazaki et al. |
| 2011/0089419 A1* | 4/2011 | Yamazaki ........ H01L 27/10873 257/43 |
| 2012/0194262 A1* | 8/2012 | Uochi ............... H01L 21/28273 327/534 |
| 2014/0077205 A1* | 3/2014 | Yamazaki ........ H01L 29/66969 257/43 |
| 2014/0175436 A1 | 6/2014 | Yamazaki |
| 2014/0239294 A1* | 8/2014 | Yamazaki .......... H01L 29/7869 257/43 |
| 2014/0241487 A1 | 8/2014 | Yamazaki et al. |
| 2014/0299874 A1 | 10/2014 | Yamazaki |
| 2014/0306219 A1 | 10/2014 | Yamazaki et al. |
| 2015/0062477 A1 | 3/2015 | Hatsumi et al. |
| 2015/0076492 A1 | 3/2015 | Kubota et al. |
| 2015/0109553 A1 | 4/2015 | Kubota |
| 2015/0155169 A1 | 6/2015 | Oota et al. |
| 2015/0311260 A1 | 10/2015 | Senda et al. |
| 2015/0333088 A1 | 11/2015 | Yamazaki et al. |
| 2016/0005873 A1 | 1/2016 | Jintyou et al. |
| 2016/0070131 A1 | 3/2016 | Kimura et al. |
| 2016/0190331 A1 | 6/2016 | Miyake et al. |
| 2016/0260837 A1 | 9/2016 | Koezuka et al. |
| 2016/0274394 A1 | 9/2016 | Yamazaki et al. |
| 2016/0274398 A1 | 9/2016 | Hirakata et al. |
| 2016/0276486 A1 | 9/2016 | Koezuka et al. |
| 2016/0322395 A1 | 11/2016 | Koezuka et al. |
| 2016/0343868 A1 | 11/2016 | Koezuka et al. |
| 2016/0349904 A1 | 12/2016 | Miyake et al. |
| 2017/0019972 A1 | 1/2017 | Kimura et al. |
| 2017/0075155 A1 | 3/2017 | Oikawa et al. |
| 2017/0104089 A1 | 4/2017 | Koezuka et al. |
| 2017/0104090 A1 | 4/2017 | Koezuka et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |

(56) References Cited

FOREIGN PATENT DOCUMENTS

| JP | 2004-103957 A | 4/2004 |
|---|---|---|
| JP | 2004-273614 A | 9/2004 |
| JP | 2004-273732 A | 9/2004 |
| JP | 2011-086923 A | 4/2011 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electronic Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono,H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc-Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YBFE2O4, and YB2FE3O7 Types of Structures for Compounds in the In2O3 and Sc2O3-A2O3-BO Systems [A; Fe, Ga, or Al; B: Mg, Mn, Fe, Ni, Cu, or Zn] at Temperatures over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Physics. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, pp. 1673-1676.

(56) References Cited

OTHER PUBLICATIONS

Mo.Y et al, "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B. (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science and Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letter), Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner 400  413  404  406

412 406 413 400

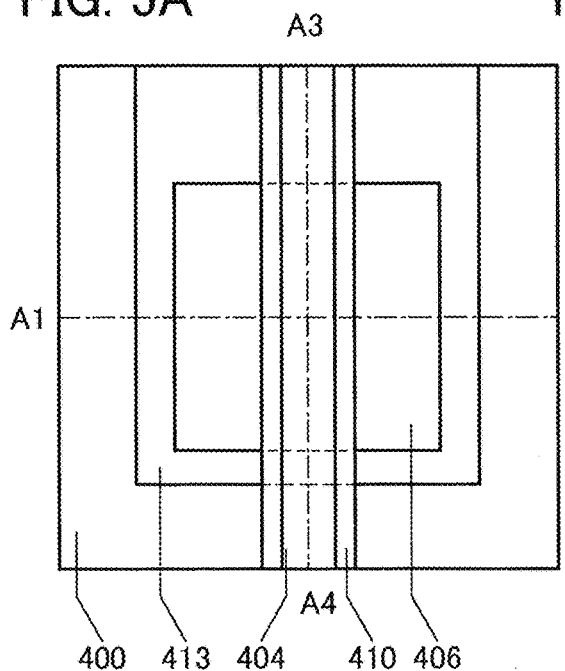
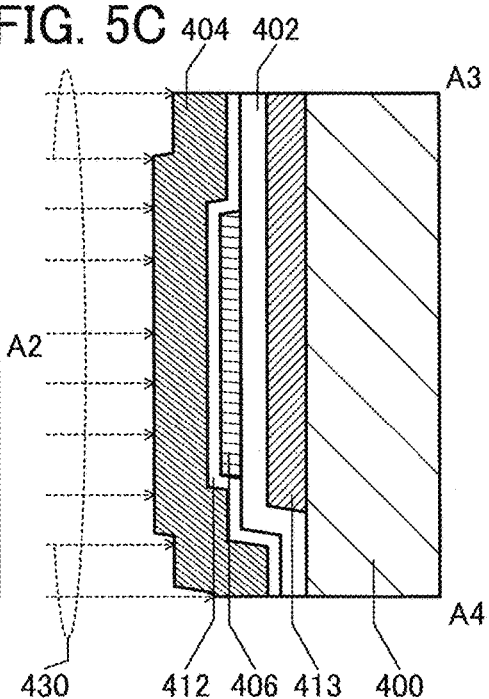
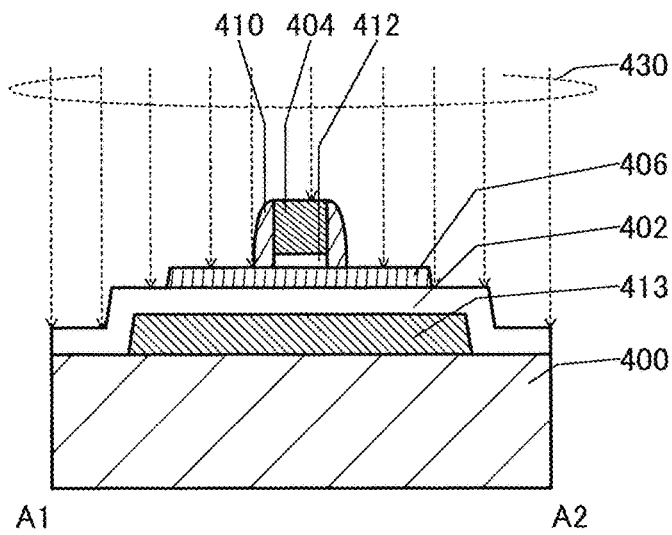

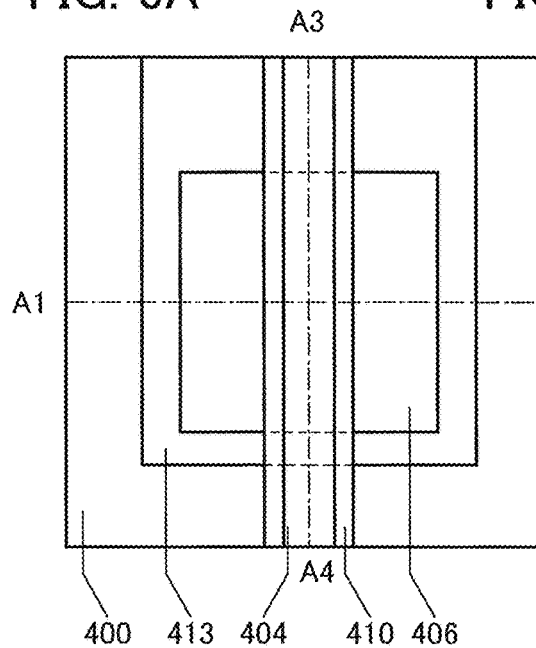
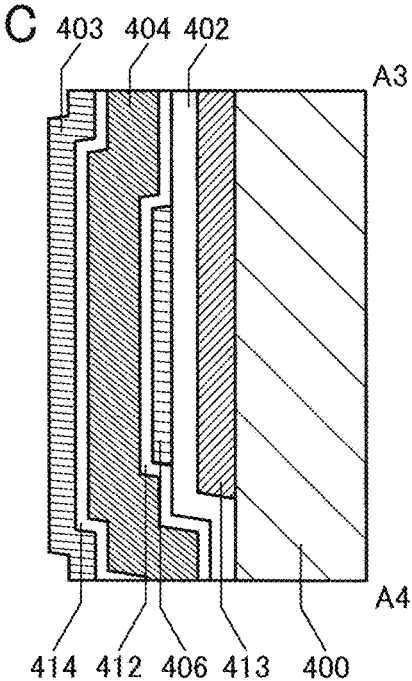
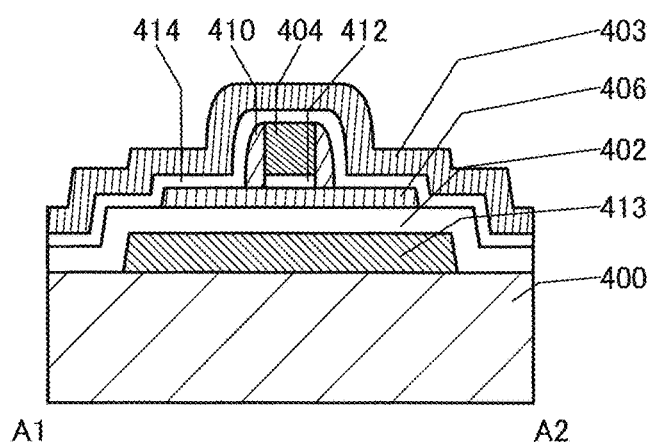

400  413  404    410  406

412 406 413  400

504  506          507  505  500

550

516a 504 506 516b 507 505 518, 520, 508

MANUFACTURING METHOD FOR SEMICONDUCTOR DEVICE

BACKGROUND OF THE INVENTION

1. Field of the Invention

One embodiment of the present invention relates to a semiconductor device and a manufacturing method thereof.

The present invention relates to, for example, a transistor, a semiconductor device, and manufacturing methods thereof. The present invention relates to, for example, a display device, a light-emitting device, a lighting device, a power storage device, a memory device, an imaging device, a processor, or an electronic device. The present invention relates to a method for manufacturing a display device, a liquid crystal display device, a light-emitting device, a memory device, or an electronic device. The present invention relates to a driving method of a semiconductor device, a display device, a liquid crystal display device, a light-emitting device, a memory device, or an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an imaging device, an electro-optical device, a semiconductor circuit, and an electronic device include a semiconductor device in some cases.

2. Description of the Related Art

A technique for forming a transistor by using a semiconductor over a substrate having an insulating surface has attracted attention. The transistor is applied to a wide range of semiconductor devices such as an integrated circuit and a display device. Silicon is known as a semiconductor applicable to a transistor.

As silicon which is used as a semiconductor of a transistor, either amorphous silicon or polycrystalline silicon is used depending on the purpose. For example, in a transistor included in a large display device, it is preferable to use amorphous silicon, which can be used to form a film on a large substrate with the established technique. In a transistor included in a high-performance display device where a driver circuit and a pixel circuit are formed over the same substrate, it is preferred to use polycrystalline silicon, which can form a transistor having high field-effect mobility. As a method for forming polycrystalline silicon, high-temperature heat treatment and laser light treatment which are performed on amorphous silicon have been known.

In recent years, transistors containing oxide semiconductors (typically, In—Ga—Zn oxide) have been actively developed.

Oxide semiconductors have been researched since early times. In 1988, it was disclosed to use a crystal In—Ga—Zn oxide for a semiconductor element (see Patent Document 1). In 1995, a transistor containing an oxide semiconductor was invented, and its electrical characteristics were disclosed (see Patent Document 2).

In 2010, a transistor containing a crystalline In—Ga—Zn oxide that has more excellent electrical characteristics and higher reliability than a transistor containing an amorphous In—Ga—Zn oxide has been developed (see Patent Document 3). The crystalline In—Ga—Zn oxide has c-axis alignment and thus is called a c-axis-aligned crystalline oxide semiconductor (CAAC-OS) or the like.

REFERENCE

Patent Documents

[Patent Document 1] Japanese Published Patent Application No. S63-239117
[Patent Document 2] Japanese translation of PCT international application No. H11-505377
[Patent Document 3] Japanese Publication Patent Application No. 2011-86923

SUMMARY OF THE INVENTION

An object is to provide an oxide conductor with high conductivity. Another object is to provide an oxide conductor with high transmittance. Another object is to provide a stable oxide conductor. Another object is to provide a transistor including the oxide conductor. Another object is to provide a transistor with excellent electrical characteristics. Another object is to provide a transistor having stable electrical characteristics. Another object is to provide a transistor with low parasitic capacitance. Another object is to provide a transistor having a miniaturized structure. Another object is to provide a transistor with high frequency characteristics. Another object is to provide a transistor having low off-state current. Another object is to provide a capacitor having visible light permeability. Another object is to provide a semiconductor device including the transistor or the capacitor. Another object is to provide a module including the semiconductor device or the capacitor. Another object is to provide an electronic device including the semiconductor device, the capacitor, or the module.

Note that the descriptions of these objects do not disturb the existence of other objects. In one embodiment of the present invention, there is no need to achieve all the objects. Other objects will be apparent from and can be derived from the description of the specification, the drawings, the claims, and the like.

(1) One embodiment of the present invention is a manufacturing method for a semiconductor device, which includes the steps of: forming an oxide semiconductor over a first insulator; forming a second insulator over the first insulator and the oxide semiconductor; forming a first conductor over the second insulator; forming an etching mask over the first conductor; forming a second conductor including a region overlapping with the oxide semiconductor by etching the first conductor with use of the etching mask as a mask; removing the etching mask; and performing heat treatment after forming a hydrogen-containing layer over the second insulator and the second conductor.

(2) One embodiment of the present invention is the manufacturing method for the semiconductor device in (1), which includes the step of forming a third insulator in contact with a side surface of the second conductor before forming the hydrogen-containing layer.

(3) One embodiment of the present invention is the manufacturing method for the semiconductor device in (1) or (2), in which the second insulator includes silicon oxide.

(4) One embodiment of the present invention is a manufacturing method for a semiconductor device, which includes the steps of: forming a first conductor over a first insulator; forming a second insulator over the first insulator and the first conductor; forming a first oxide semiconductor and a second oxide semiconductor over the second insulator;

forming a third insulator over the second insulator and the first oxide semiconductor; forming a fourth insulator over the second oxide semiconductor and the third insulator; and performing heat treatment after forming a hydrogen-containing layer over the fourth insulator.

(5) One embodiment of the present invention is the manufacturing method for the semiconductor device in (4), which includes the steps of: removing the hydrogen-containing layer after the heat treatment; forming a second conductor over the fourth insulator; forming an etching mask over the second conductor; and forming a third conductor including a region overlapping with the second oxide semiconductor by etching the second conductor with use of the etching mask as a mask.

(6) One embodiment of the present invention is the manufacturing method for the semiconductor device in (4), which includes the steps of: forming an etching mask over the hydrogen-containing layer after the heat treatment; and forming a hydrogen-containing layer including a region overlapping with the second oxide semiconductor by etching the hydrogen-containing layer with use of the etching mask as a mask.

(7) One embodiment of the present invention is the manufacturing method for the semiconductor device in any one of (1) to (6), in which hydrogen concentration of the hydrogen-containing layer measured by secondary ion mass spectrometry is higher or equal to $1\times10^{21}$ atoms/cm$^3$ and lower than or equal to $5\times10^{22}$ atoms/cm$^3$.

(8) One embodiment of the present invention is the manufacturing method for the semiconductor device in any one of (1) to (7), in which the hydrogen-containing layer includes amorphous silicon.

An oxide conductor with high conductivity can be provided. An oxide conductor with high transmittance can be provided. A stable oxide conductor can be provided. A transistor including the oxide conductor can be provided. A transistor with excellent electrical characteristics can be provided. A transistor having stable electrical characteristics can be provided. A transistor with low parasitic capacitance can be provided. A transistor having a miniaturized structure can be provided. A transistor with high frequency characteristics can be provided. A transistor having low off-state current can be provided. A capacitor having visible light permeability can be provided. A semiconductor device including the transistor or the capacitor can be provided. A module including the semiconductor device or the capacitor can be provided. An electronic device including the semiconductor device, the capacitor, or the module can be provided.

Note that the description of these effects does not preclude the existence of other effects. One embodiment of the present invention does not have to have all the effects listed above. Other effects will be apparent from and can be derived from the description of the specification, the drawings, the claims, and the like.

BRIEF DESCRIPTION OF THE DRAWINGS

FIGS. 5A to 5C are a top view and cross-sectional views illustrating a method for manufacturing a transistor according to one embodiment of the present invention.

FIGS. 6A to 6C are a top view and cross-sectional views illustrating a method for manufacturing a transistor according to one embodiment of the present invention.

DETAILED DESCRIPTION OF THE INVENTION

Figure 1A:
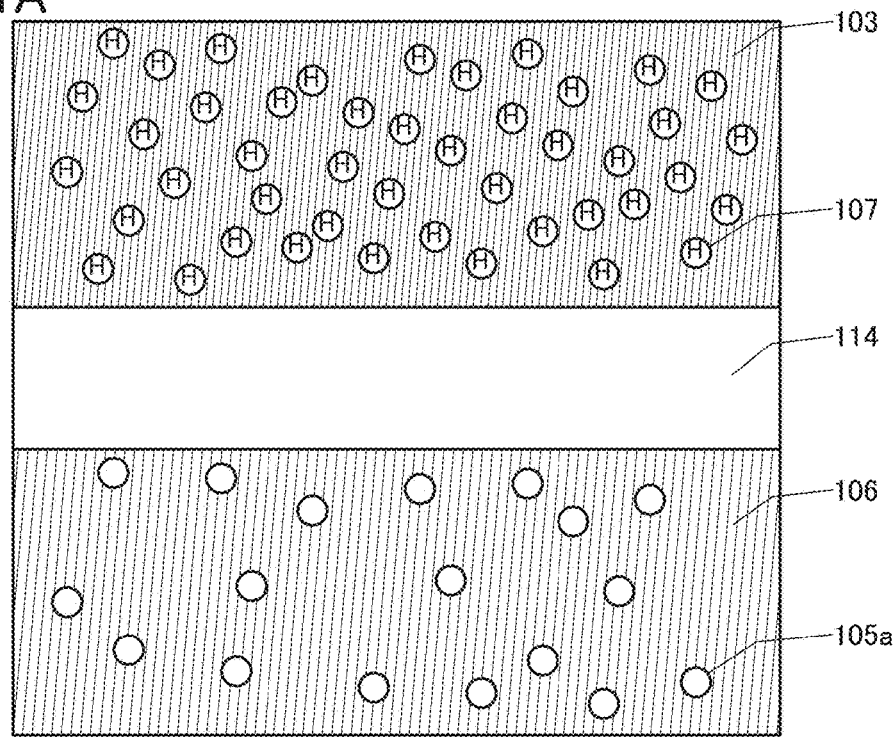
FIGS. 1A and 1B are cross-sectional views illustrating a method for forming an oxide conductor according to one embodiment of the present invention.

Hereinafter, embodiments of the present invention will be described in detail with the reference to the drawings. However, the present invention is not limited to the description below, and it is easily understood by those skilled in the art that modes and details disclosed herein can be modified in various ways. Furthermore, the present invention is not construed as being limited to description of the embodiments. In describing structures of the invention with reference to the drawings, common reference numerals are used for the same portions in different drawings. Note that the same hatched pattern is applied to similar parts, and the similar parts are not denoted by reference numerals in some cases. In the case where the description of a component denoted by a different reference numeral is referred to, the description of the thickness, composition, structure, shape, or the like of the component can be used as appropriate.

Note that the size, the thickness of films (layers), or regions in drawings is sometimes exaggerated for simplicity.

In this specification, the terms "film" and "layer" can be interchanged with each other.

A voltage usually refers to a potential difference between a given potential and a reference potential (e.g., a source potential or a ground potential (GND)). A voltage can be referred to as a potential. Note that in general, a potential (a voltage) is relative and is determined depending on the amount relative to a reference potential. Therefore, a potential that is represented as a "ground potential" or the like is not always 0 V. For example, the lowest potential in a circuit may be represented as a "ground potential." Alternatively, a substantially intermediate potential in a circuit may be represented as a "ground potential." In these cases, a positive potential and a negative potential are set using the potential as a reference.

Note that the ordinal numbers such as "first" and "second" are used for convenience and do not denote the order of steps or the stacking order of layers. Therefore, for example, the term "first" can be replaced with the term "second," "third," or the like as appropriate. In addition, the ordinal numbers in this specification and the like do not correspond to the ordinal numbers which specify one embodiment of the present invention in some cases.

Note that impurities in a semiconductor refer to, for example, elements other than the main components of the semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased. In the case where the semiconductor is an oxide semiconductor, examples of an impurity which changes characteristics of the semiconductor include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, oxygen vacancies may be formed by entry of impurities such as hydrogen. In the case where the semiconductor is silicon, examples of an impurity which changes characteristics of the semiconductor include oxygen, Group 1 elements except hydrogen, Group 2 elements, Group 13 elements, and Group 15 elements. Note that as well as the impurity, a main component element that is excessively contained might cause DOS. In that case, DOS can be lowered in some cases by a slight amount of an additive (e.g., greater than or equal to 0.001 atomic % and less than 3 atomic %). The above-described element that might serve as an impurity can be used as the additive.

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value in a region where a channel is formed.

Note that depending on a transistor structure, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width or an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values might be different from those calculated by using an effective channel width.

When some figures include top and cross-sectional views and symbols such as A1, B1, and A2 and dashed lines between such symbols are shown in the figures, the positions of the symbols and the dashed lines of the top views correspond to the positions of the symbols of the cross-sectional views. In this specification, the expression "A has a shape such that an end portion extends beyond an end portion of B" may indicate the case where at least one end portion of A is positioned on an outer side than at least one end portion of B in a top view or a cross-sectional view. Therefore, the expression "A has a shape such that an end portion extends beyond an end portion of B" can also be expressed as "an end portion of A is positioned on an outer side than an end portion of B in a top view," for example.

In this specification, the term "parallel" indicates that the angle formed between two straight lines is greater than or equal to $-10°$ and less than or equal to $10°$, and accordingly also includes the case where the angle is greater than or equal to $-5°$ and less than or equal to $5°$. The term "substantially parallel" indicates that the angle formed between two straight lines is greater than or equal to $-30°$ and less than or equal to $30°$. The term "perpendicular" indicates that the angle formed between two straight lines is greater than or equal to $80°$ and less than or equal to $100°$, and accordingly also includes the case where the angle is greater than or equal to $85°$ and less than or equal to $95°$. The term "substantially perpendicular" indicates that the angle formed between two straight lines is greater than or equal to $60°$ and less than or equal to $120°$.

In this specification, trigonal and rhombohedral crystal systems are included in a hexagonal crystal system.

In this specification, the term "semiconductor" can be replaced with any term for various semiconductors in some cases. For example, the term "semiconductor" can be replaced with the term for a Group 14 semiconductor such as silicon or germanium; an oxide semiconductor; a compound semiconductor such as silicon carbide, germanium silicide, gallium arsenide, indium phosphide, zinc selenide, or cadmium sulfide; or an organic semiconductor.

Here, an example of a method for etching part of a component when the semiconductor device of one embodiment of the present invention is manufactured is described. First, a layer of a photosensitive organic or inorganic substance is formed over the component by a spin coating method or the like. Then, the layer of the photosensitive organic or inorganic substance is irradiated with light with the use of a photomask. As such light, KrF excimer laser light, ArF excimer laser light, extreme ultraviolet (EUV) light, or the like may be used. Alternatively, a liquid immersion technique may be employed in which a portion between a substrate and a projection lens is filled with liquid (e.g., water) to perform light exposure. The layer of the photosensitive organic or inorganic substance may be irradiated with an electron beam or an ion beam instead of the above light. Note that no photomask is needed in the case of using an electron beam or an ion beam. After that, a region of the layer of the photosensitive organic or inorganic substance that has been exposed to light is removed or left with the use of a developer, so that an etching mask including a resist is formed.

Note that a bottom anti-reflective coating (BARC) may be formed under the etching mask. In the case where the BARC is used, first, the BARC is etched using the etching mask. Next, the component is etched using the etching mask and the BARC. Note that an organic or inorganic substance which does not function as an anti-reflective layer may be used instead of the BARC.

After the etching of the component, the etching mask or the like is removed. For the removal of the etching mask or the like, plasma treatment and/or wet etching are/is used. Note that as the plasma treatment, plasma ashing is preferable. In the case where the removal of the etching mask or the like is not enough, the remaining etching mask or the like may be removed using ozone water and/or hydrofluoric acid at a concentration higher than or equal to 0.001 volume % and lower than or equal to 1 volume %, and the like. In this specification, the above process is called photolithography step in some cases.

In this specification, the conductors, the insulators, and the semiconductors can be formed by a sputtering method, a chemical vapor deposition (CVD) method, a molecular beam epitaxy (MBE) method, a pulsed laser deposition (PLD) method, an atomic layer deposition (ALD) method, a thermal oxidation method, a plasma oxidation method, or the like.

CVD methods can be classified into a plasma enhanced CVD (PECVD) method using plasma, a thermal CVD (TCVD) method using heat, a photo CVD method using light, and the like. Moreover, the CVD method can include a metal CVD (MCVD) method and a metal organic CVD (MOCVD) method depending on a source gas.

In the case of a plasma CVD method, a high quality film can be obtained at relatively low temperature. Furthermore, a thermal CVD method does not use plasma and thus causes less plasma damage to an object. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. Such plasma damage is not caused in the case of using a thermal CVD method, and thus the yield of a semiconductor device can be increased. In addition, since plasma damage does not occur in the deposition by a thermal CVD method, a film with few defects can be obtained.

An ALD method also causes less plasma damage to an object. Since an ALD method does not cause plasma damage either during deposition, a film with few defects can be obtained.

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by the CVD method or the ALD method, a film with a desired composition can be formed by adjusting the flow ratio of a source gas. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the deposition can be reduced because time taken for transfer and pressure adjustment is omitted. Thus, semiconductor devices can be manufactured with improved productivity.

<Method for Forming Oxide Conductor>

A method for forming an oxide conductor according to one embodiment of the present invention will be described below with reference to FIGS. 1A and 1B.

FIG. 1A illustrates a stacked structure of an oxide semiconductor 106, an insulator 114, and a hydrogen-containing layer 103. Note that in FIG. 1A, the oxide semiconductor 106, the insulator 114, and the hydrogen-containing layer 103 are stacked in order from the bottom; however, the upper layer and the lower layer may be reversed.

The oxide semiconductor 106 includes a defect 105a. For example, in the case where the defect 105a is an oxygen vacancy, a donor level is formed in some cases when hydrogen enters the defect 105a.

The insulator 114 is an insulator having a hydrogen-transmitting property.

Because a hydrogen atomic radius is small, a diffusion coefficient of hydrogen is large. Since the diffusion coefficient of hydrogen is large, a low-density insulator has a high hydrogen-transmitting property, for example. The density of the low-density insulator is not always low throughout the insulator; a material including a low-density part is also referred to as the low-density insulator. This is because the low-density part serves as a hydrogen path. Although a density of the material capable of transmitting hydrogen is not limited, it is typically lower than 2.6 g/cm$^3$. Examples of the low-density insulator include inorganic insulators such as silicon oxide or silicon oxynitride and organic insulators such as polyester, polyolefin, polyamide (e.g., nylon or aramid), polyimide, polycarbonate, or acrylic. Note that the low-density insulator is not limited to these insulators. For example, the insulators may contain one or more of boron, nitrogen, fluorine, neon, phosphorus, chlorine, and argon.

An insulator containing crystal grain boundaries can have a high hydrogen-transmitting property. For example, a polycrystalline insulator has a higher hydrogen-transmitting property than a non-polycrystalline insulator (e.g., an amorphous insulator).

The hydrogen-containing layer 103 is a layer including excess hydrogen 107. The hydrogen-containing layer 103 may be any of an insulator, a semiconductor, and a conductor. Excess hydrogen is hydrogen that is released easily by heat treatment or the like. Note that excess hydrogen cannot be distinguished from other hydrogen in some cases.

The hydrogen-containing layer 103 is a layer including a region where the amount of released gas having a mass-to-charge ratio of 2 is more than or equal to $1\times10^{16}/cm^2$, preferably more than or equal to $5\times10^{16}/cm^2$, further preferably more than or equal to $1\times10^{17}/cm^2$ when measured by thermal desorption spectroscopy (TDS) analysis at the surface temperature from 50° C. to 580° C. The hydrogen-containing layer 103 is a layer including a region where the amount of released gas having a mass-to-charge ratio of 18 is more than or equal to $1\times10^{14}/cm^2$, preferably more than or equal to $5\times10^{14}/cm^2$, further preferably more than or equal to $1\times10^{15}/cm^2$ when measured by TDS analysis at the surface temperature from 50° C. to 580° C. The hydrogen-containing layer 103 is a layer including a region where the amount of released gas having a mass-to-charge ratio of 2 is more than or equal to $1\times10^{15}/cm^2$, preferably more than or equal to $5\times10^{15}/cm^2$, further preferably more than or equal to $1\times10^{16}/cm^2$ when measured by TDS analysis at the surface temperature from 50° C. to 250° C. The hydrogen-containing layer 103 is a layer including a region where the amount of released gas having a mass-to-charge ratio of 18 is more than or equal to $1\times10^{14}/cm^2$, preferably more than or equal to $5\times10^{14}/cm^2$, further preferably more than or equal to $1\times10^{15}/cm^2$ when measured by TDS analysis at the surface temperature from 50° C. to 250° C.

The hydrogen-containing layer 103 is a layer including a region where a hydrogen concentration is more than or equal to $1\times10^{21}$ atoms/$cm^3$ and less than or equal to $5\times10^{22}$ atoms/$cm^3$, preferably more than or equal to $5\times10^{21}$ atoms/$cm^3$ and less than or equal to $5\times10^{22}$ atoms/$cm^3$, further preferably more than or equal to $1\times10^{22}$ atoms/$cm^3$ and less than or equal to $5\times10^{22}$ atoms/$cm^3$ when measured by secondary ion mass spectrometry (SIMS).

For example, amorphous silicon, microcrystalline silicon, polycrystalline silicon, silicon nitride, silicon nitride oxide, silicon oxide, silicon oxynitride, or the like may be used as the hydrogen-containing layer 103. A hydrogen compound of a metal may be used as the hydrogen-containing layer 103. Furthermore, the hydrogen-containing layer 103 may contain one or more of boron, nitrogen, fluorine, neon, phosphorus, chlorine, and argon, for example. The hydrogen-containing layer 103 has conductivity when the hydrogen-containing layer 103 is the hydrogen compound of metal, or amorphous silicon, microcrystalline silicon, or polycrystalline silicon each including impurities. The hydrogen-containing layer 103 has an insulating property when the hydrogen-containing layer 103 is silicon nitride, silicon nitride oxide, silicon oxide, or silicon oxynitride.

Figure 1B:
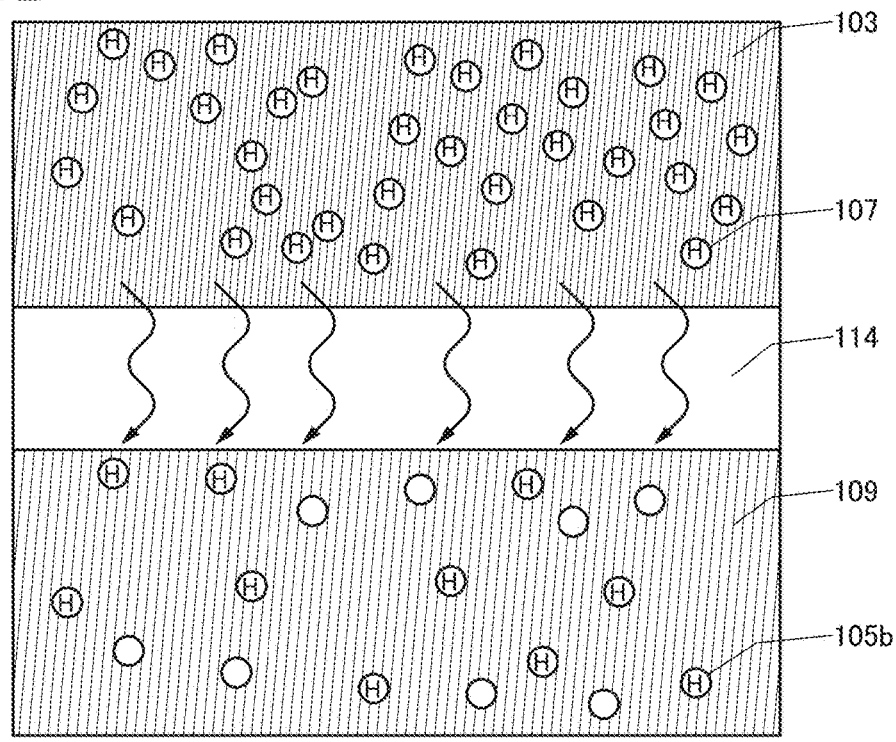

The excess hydrogen 107, which is released from the hydrogen-containing layer 103 by heat treatment or the like, enters the defect 105a in the oxide semiconductor 106 through the insulator 114 and forms a defect 105b as shown in FIG. 1B. The defect 105b forms a donor level in an oxide semiconductor 106. The oxide semiconductor 106 becomes an oxide conductor 109 because the donor level is formed and carrier density is increased. Although the oxide conductor 109 is referred to as a conductor in terms of high conductivity, the oxide conductor 109 has an energy gap.

The insulator 114 is not damaged easily when the oxide conductor 109 is formed because impurities are added by thermal diffusion or the like. In addition, the excess hydrogen 107 can reduce defects in the insulator 114 in some cases. Thus, the insulator 114 can be favorably used as a part of a semiconductor element, a capacitor, or the like. For example, a semiconductor element with stable and excellent electric characteristic can be manufactured when the insulator 114 is used as a part of a semiconductor element. Furthermore, a capacitor which has low leakage current and is hardly damaged even when a high voltage is applied can be manufactured when the insulator 114 is used as a part of a capacitor, for example.

<Method for Manufacturing Transistor>

The oxide conductor according to one embodiment of the present invention can be used for a transistor. An example thereof is described below.

First, a substrate 400 is prepared.

Next, a conductor is formed. Next, an etching mask is formed over the conductor. Next, a part of the conductor is etched with use of the etching mask as a mask, whereby a conductor 413 is formed. Note that the transistor of one embodiment of the present invention does not necessarily include the conductor 413. In that case, this process can be omitted.

Next, an insulator 402 is formed.

Figure 2A:
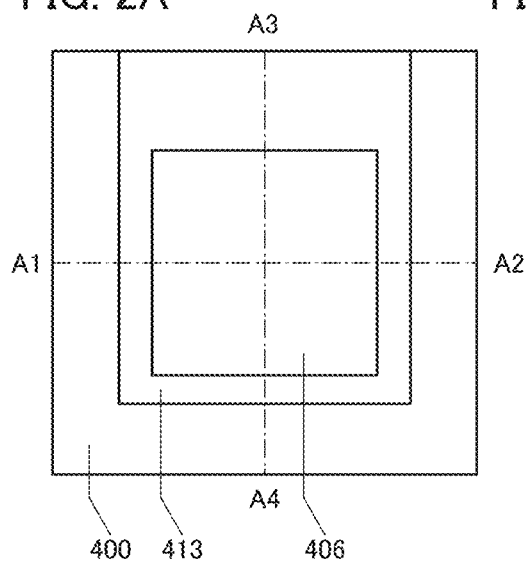
FIGS. 2A to 2C are a top view and cross-sectional views illustrating a method for manufacturing a transistor according to one embodiment of the present invention.
Figure 2C:
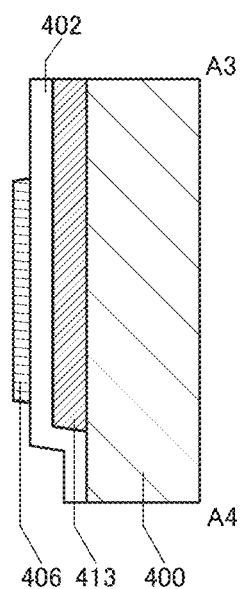
Figure 2B:
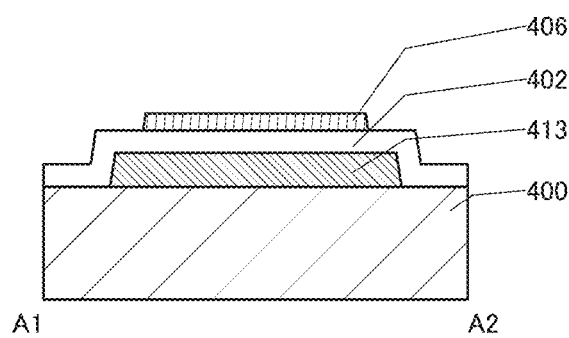

Next, an oxide semiconductor is formed. Next, an etching mask is formed over the oxide semiconductor. Then, a part of the oxide semiconductor is etched with use of the etching mask as a mask, whereby an oxide semiconductor 406 is formed (see FIGS. 2A to 2C).

Next, first heat treatment is preferably performed. The first heat treatment can be performed at a temperature higher than or equal to 150° C. and lower than or equal to 650° C., preferably higher than or equal to 250° C. and lower than or equal to 600° C., further preferably higher than or equal to 350° C. and lower than or equal to 570° C. The first heat treatment is performed in an inert gas atmosphere or an oxidizing gas atmosphere. The oxidizing gas is a gas containing an oxygen atom. For example, the oxidizing gas refers to a gas containing oxygen, ozone, or nitrogen oxide (e.g., nitrogen monoxide, nitrogen dioxide, dinitrogen monoxide, dinitrogen trioxide, dinitrogen tetroxide, or dinitrogen pentoxide). The oxidizing gas atmosphere refers to an atmosphere containing an oxidizing gas at 0.1% or more, 1% or more, or 10% or more. Note that the oxidizing gas atmosphere may contain an inert gas such as nitrogen or a rare gas (e.g., helium, neon, argon, krypton, or xenon). Note that the inert gas atmosphere is an atmosphere containing an inert gas where a reactive gas such as an oxidizing gas is contained at less than 0.1%. The first heat treatment may be performed under a reduced pressure. Alternatively, the first heat treatment may be performed in such a manner that heat treatment is performed in an inert gas atmosphere, and then another heat treatment is performed in an oxidizing gas atmosphere in order to compensate desorbed oxygen. By the first heat treatment, impurities including a hydrogen atom, a carbon atom, or the like (e.g., water and hydrocarbon) or defects can be reduced.

A heat treatment apparatus used in the heat treatment is not limited to an electric furnace; as the heat treatment apparatus, an apparatus which heats an object using thermal conduction or thermal radiation given by a medium such as a heated gas may be used. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas.

As the first heat treatment, high-density plasma treatment which involves heating of a substrate may be performed. The high-density plasma treatment is preferably performed in an oxidizing gas atmosphere. Alternatively, the high-density plasma treatment may be performed in such a manner that high-density plasma treatment is performed in an inert gas atmosphere, and then another high-density plasma treatment is performed in an oxidizing gas atmosphere in order to compensate desorbed oxygen. By the high-density plasma treatment, impurities including a hydrogen atom, a carbon atom, or the like (e.g., water and hydrocarbon) can be removed from the object. The use of high-density plasma can effectively reduce impurities or defects even at low temperatures, compared with the case of simply heating the object.

The high-density plasma is produced using a microwave generated with a high-frequency generator that generates a wave having a frequency of, for example, more than or equal to 0.3 GHz and less than or equal to 3.0 GHz, more than or equal to 0.7 GHz and less than or equal to 1.1 GHz, or more than or equal to 2.2 GHz and less than or equal to 2.8 GHz (typically, 2.45 GHz). The pressure is, for example, more than or equal to 10 Pa and less than or equal to 5000 Pa, more than or equal to 200 Pa and less than or equal to 1500 Pa, or more than or equal to 300 Pa and less than or equal to 1000 Pa. Further, the substrate temperature is, for example, more than or equal to 100° C. and less than or equal to 600° C. (typically 400° C.). For an oxidizing atmosphere, a mixed gas of oxygen and argon may be used, for example. Note that it is preferable to supply an enough amount of gas in order to increase the plasma density. When the gas amount is not enough, the deactivation rate of radicals becomes higher than the generation rate of radicals in some cases. For example, the gas flow rate may be 100 sccm or more, 300 sccm or more, or 800 sccm or more.

High-density plasma treatment is preferably performed under the following conditions: an electron density of higher than or equal to $1\times10^{11}/cm^3$ and lower than or equal to $1\times10^{13}/cm^3$; an electron temperature of 2 eV or lower; an ion energy of 5 eV or lower. Such high-density plasma treatment produces radicals with low kinetic energy and causes little plasma damage to an object, compared with low-density plasma treatment. Thus, formation of a film with few defects is possible. To prevent plasma damage, the distance between an antenna that generates the microwave and the object is longer than or equal to 5 mm and shorter than or equal to 120 mm, preferably longer than or equal to 20 mm and shorter than or equal to 60 mm. The treatment time of the high-density plasma treatment is preferably longer than or equal to 30 seconds and shorter than or equal to 120 minutes, longer than or equal to 1 minute and shorter than or equal to 90 minutes, longer than or equal to 2 minutes and shorter than or equal to 30 minutes, or longer than or equal to 3 minutes and shorter than or equal to 15 minutes.

In the high-density plasma treatment, a bias may be applied to the object side. The application of a bias may be performed with a 13.56 MHz- or 27.12 MHz-radio frequency (RF) power source. The application of a bias to the substrate side allows ions produced by the high-density plasma to be introduced into the object efficiently.

Following the high-density plasma treatment, heat treatment may be successively performed without an exposure to the air. Following the heat treatment, the high-density plasma treatment may be successively performed without an exposure to the air. As for the method of the heat treatment, the description of the first heat treatment may be referred to.

By successively performing the high-density plasma treatment and the heat treatment, impurities or defects can be reduced more effectively. Moreover, entry of impurities between the treatments can be suppressed.

Figure 3A:
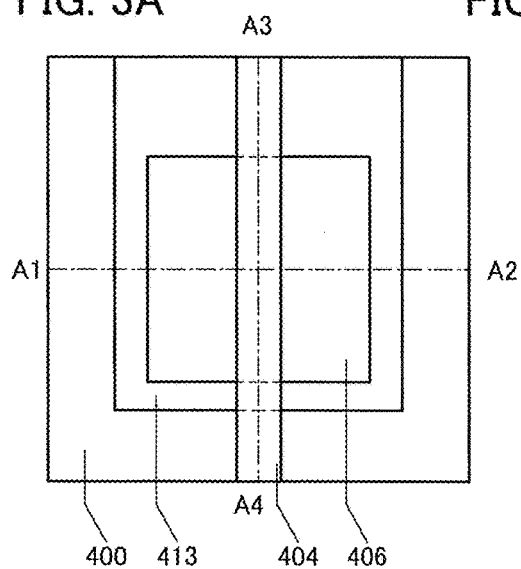
FIGS. 3A to 3C are a top view and cross-sectional views illustrating a method for manufacturing a transistor according to one embodiment of the present invention.
Figure 3C:
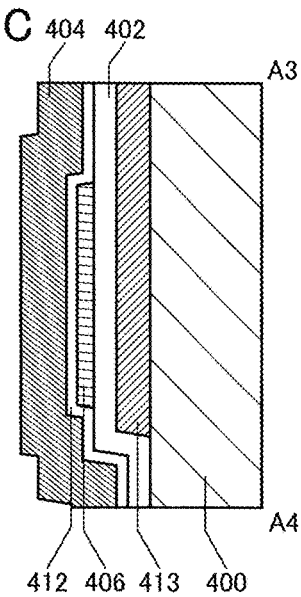
Figure 3B:
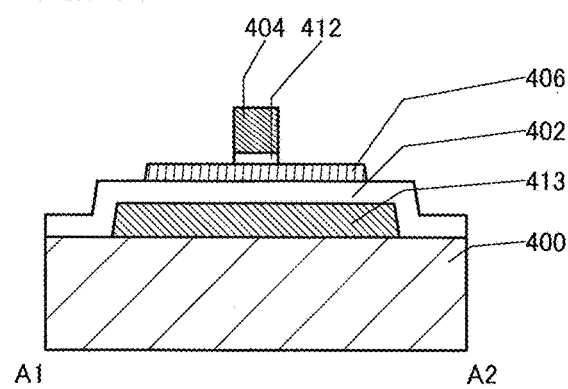

Next, an insulator is formed. Next, a conductor is formed. Next, an etching mask is formed over the conductor. Then, a part of the conductor and a part of the insulator are etched with use of the etching mask as a mask, whereby a conductor 404 and an insulator 412 are formed (see FIGS. 3A to 3C).

Figure 4A:
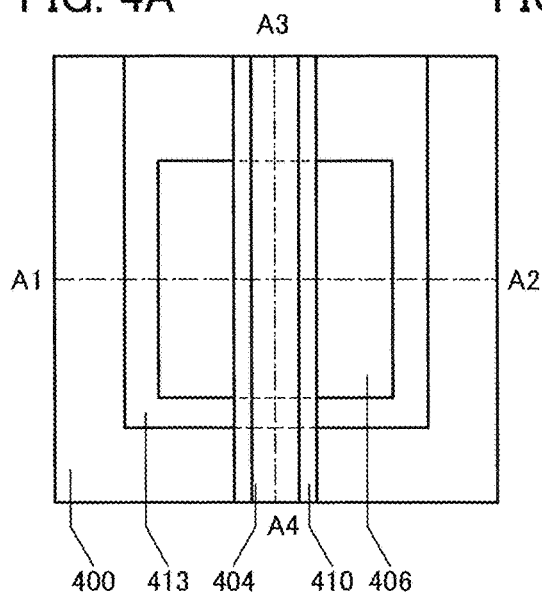
FIGS. 4A to 4C are a top view and cross-sectional views illustrating a method for manufacturing a transistor according to one embodiment of the present invention.
Figure 4C:
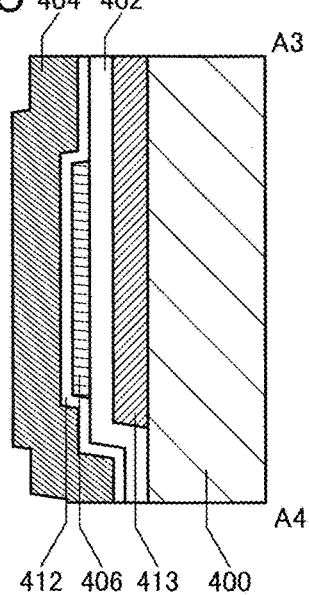
Figure 4B:
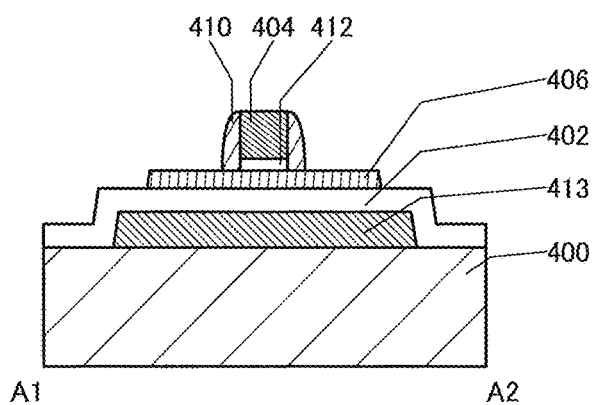

Next, an insulator is formed. Next, a part of the insulator is etched by anisotropic etching, whereby an insulator 410 is formed (see FIGS. 4A to 4C). The insulator 410 is also referred to as a sidewall insulator because the insulator 410 is formed to be in contact with side surfaces of the conductor 404 and the insulator 412. Note that a transistor according to one embodiment of the present invention does not necessarily include the insulator 410. In that case, this process can be omitted.

Next, treatment for forming defects in the oxide semiconductor 406 is preferably performed. For the treatment, for example, an ion implantation method is used. The method for adding ions 430 to the oxide semiconductor 406 by the ion implantation method as shown in FIGS. 5A to 5C will be described below. Note that the treatment for forming defects in the oxide semiconductor 406 is not necessarily performed.

For the ion implantation method, a method by which an ionized source gas is subjected to mass separation and then added, a method by which an ionized source gas is added without mass separation, or the like can be used. In the case of performing mass separation, ion species to be added and its concentration can be controlled properly. On the other hand, in the case of not performing mass separation, ions at a high concentration can be added in a short time. Alternatively, an ion implantation method in which atomic or molecular clusters are generated and ionized may be employed. Instead of the term "ions 430", the term "dopant," "donor," "acceptor," "impurity," or "element" may be used.

The addition of the ions 430 may be controlled by setting the addition conditions such as the acceleration voltage and the dosage as appropriate. The dose of the ions 430 is, for example, greater than or equal to $1\times10^{12}$ ions/cm$^2$ and less than or equal to $1\times10^{16}$ ions/cm$^2$, and preferably greater than or equal to $1\times10^{13}$ ions/cm$^2$ and less than or equal to $1\times10^{15}$ ions/cm$^2$. The acceleration voltage at the time of addition of the ions 430 is higher than or equal to 2 kV and lower than or equal to 50 kV, preferably higher than or equal to 5 kV and lower than or equal to 30 kV.

The ions 430 may be added while heating is performed. The ions 430 may be added while heating is performed at, for example, higher than or equal to 200° C. or and lower than or equal to 700° C., preferably higher than or equal to 300° C. and lower than or equal to 500° C., and further preferably higher than or equal to 350° C. and lower than or equal to 450° C.

For example, helium, neon, argon, krypton, xenon, nitrogen, fluorine, phosphorus, chlorine, arsenic, boron, magnesium, aluminum, silicon, titanium, vanadium, chromium, nickel, zinc, gallium, germanium, yttrium, zirconium, niobium, molybdenum, indium, tin, lanthanum, cerium, neodymium, hafnium, tantalum, and tungsten are given as the ions 430. Among these elements, helium, argon, krypton, xenon, nitrogen, phosphorus, and boron are preferable because these elements have less influence on components except the oxide semiconductor 406.

The addition of the ions 430 is not limited to the ion implantation method. For example, the addition of the ions 430 may be performed in such a manner that an object is exposed to plasma including the ions 430. Alternatively, for example, an insulator or the like which includes the ions 430 may be formed and the ions 430 may be diffused by heating or the like. In particular, two or more of the methods of addition of the ions 430 are preferably combined.

After the addition of the ions 430, heat treatment may be performed. The heat treatment may be performed at higher than or equal to 250° C. and lower than or equal to 650° C., preferably higher than or equal to 350° C. and lower than or equal to 450° C. in a nitrogen atmosphere, or under reduced pressure or air (ultra-dry air), for example.

Defects are formed in a part of the oxide semiconductor 406 by adding the ions 430. Here, defects are formed in a region other than the region protected by the conductor 404, the insulator 412, and the insulator 410.

Next, an insulator 414 is formed. Next, a hydrogen-containing layer 403 is formed (see FIGS. 6A to 6C). Note that a transistor of one embodiment of the present invention does not necessarily include the insulator 414. In that case, this process can be omitted.

Next, second heat treatment is performed. The second heat treatment may be performed in a manner similar to that of the first heat treatment. In particular, it is preferable to perform the second heat treatment at a temperature higher than or equal to 150° C. and lower than or equal to 450° C., or higher than or equal to 200° C. and lower than or equal to 300° C. Excess hydrogen moves from the hydrogen-containing layer 403 into the oxide semiconductor 406 through the insulator 414 by the second heat treatment. Then, the excess hydrogen enters defects in the oxide semiconductor 406 and a donor level is formed. As a result, the resistance of a part of the oxide semiconductor 406 is reduced. Here, regions whose resistance is reduced are denoted by a region $406n1$ and a region $406n2$, and a region whose resistance is not reduced is denoted by a region $406i$. This principle is the same as that described in FIGS. 1A and 1B.

Then, the hydrogen-containing layer 403 is removed. Thus, the transistor is completed (see FIGS. 7A to 7C).

Figure 7A:
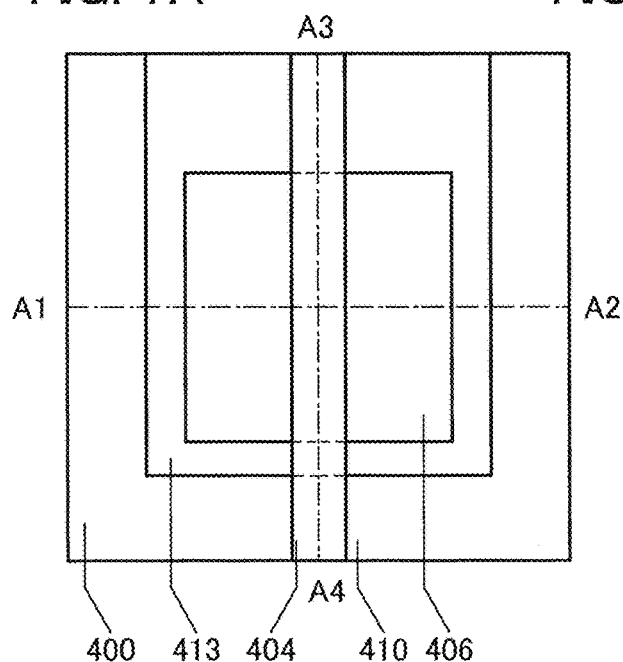
FIGS. 7A to 7C are a top view and cross-sectional views illustrating a method for manufacturing a transistor according to one embodiment of the present invention.
Figure 7C:
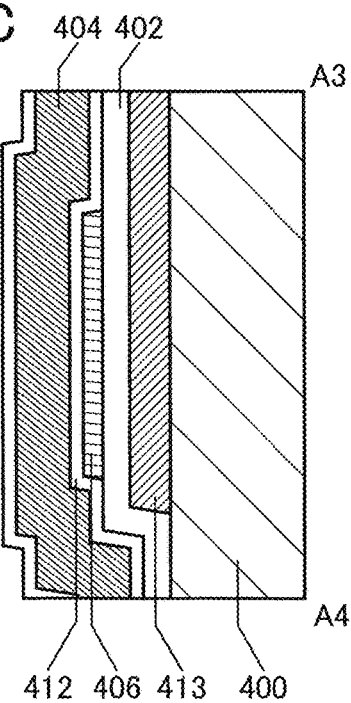
Figure 7B:
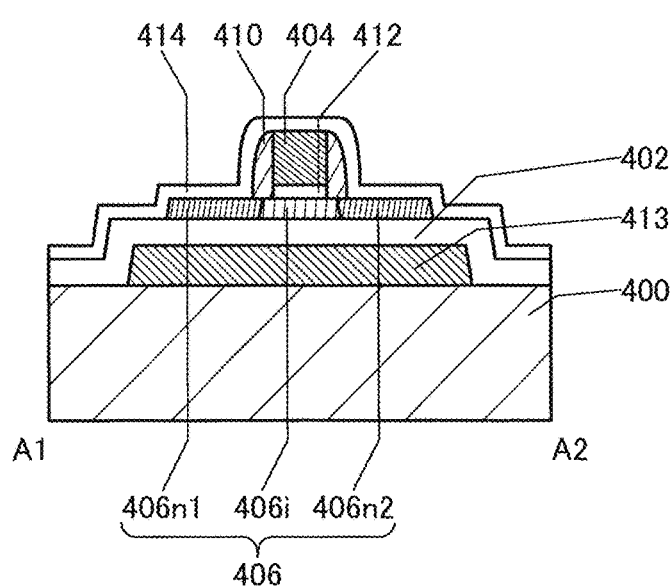

In the transistor illustrated in FIGS. 7A to 7C, the conductor 404 functions as a gate electrode. The insulator 412 functions as a gate insulator. The region $406n1$ and the region $406n2$ in the oxide semiconductor function as a source region and a drain region. The region $406i$ in the oxide semiconductor functions as a channel formation region. The conductor 413 functions as a second gate electrode. The insulator 402 functions as a second gate insulator. Note that functions of the conductor 413 and the insulator 402 may be exchanged for functions of the conductor 404 and the insulator 412. The conductor 413 is not necessarily formed. In that case, switching of the transistor can be controlled by the conductor 404. The conductor 404 is not necessarily formed. In that case, switching of the transistor can be controlled by the conductor 413.

Excess hydrogen is stabilized by entering defects in the oxide semiconductor 406. Thus, the excess hydrogen which enters the defects is hardly diffused into other regions while the second heating treatment is performed. Furthermore, the region $406n1$ and the region $406n2$ are protected by the insulator 414. In other words, the region $406n1$ and the region $406n2$ are stable low-resistance regions. Hence, the transistor can have high on-state current and suffer less deterioration. Excess hydrogen is less likely to enter a region of the oxide semiconductor 406 that overlaps with the conductor 404 and the insulator 410 because of few defects in the oxide semiconductor 406. Thus, the carrier density in the channel formation region can be lowered. Because the carrier density in the channel formation region can be lowered, variations in electrical characteristics of the transistor can be reduced even in the case where the channel length is short. Moreover, the off-state current can be reduced. In addition, deterioration caused by defects can be reduced. The above overlapping region is slightly wider than the region $406i$.

<Modification Example of Manufacturing Method of Transistor>

A modification example of a manufacturing method of a transistor according to one embodiment of the present invention will be described below.

First, a substrate 400 is prepared.

Next, a conductor is formed. Next, an etching mask is formed over the conductor. Next, a part of the conductor is etched with use of the etching mask as a mask, whereby a conductor 413 is formed. Note that the transistor according to one embodiment of the present invention does not necessarily include the conductor 413. In that case, this process can be omitted.

Next, an insulator 402 is formed.

Figure 8A:
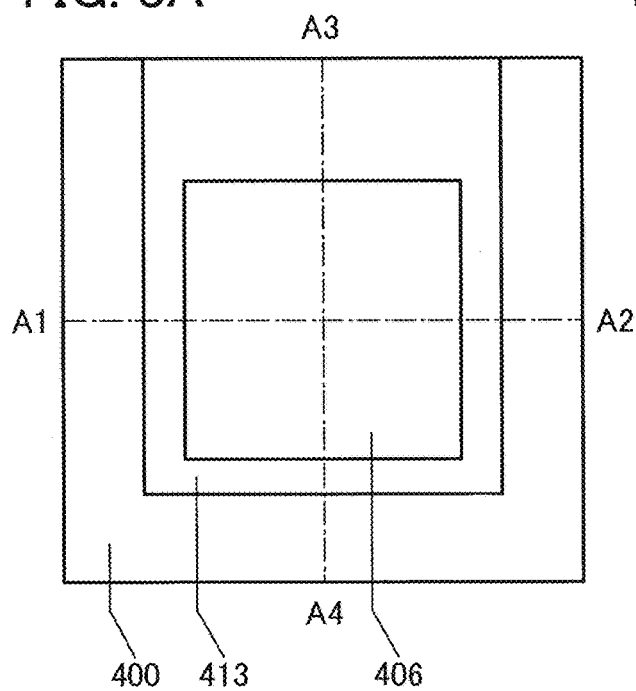
FIGS. 8A to 8C are a top view and cross-sectional views illustrating a method for manufacturing a transistor according to one embodiment of the present invention.
Figure 8C:
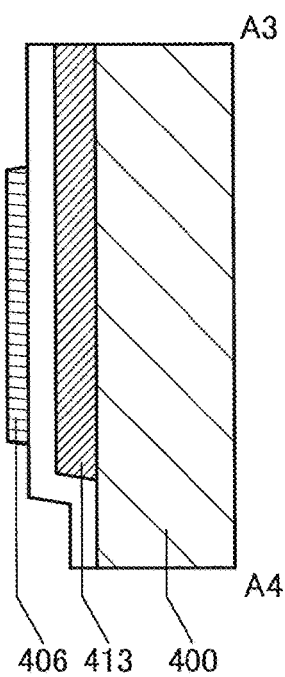
Figure 8B:
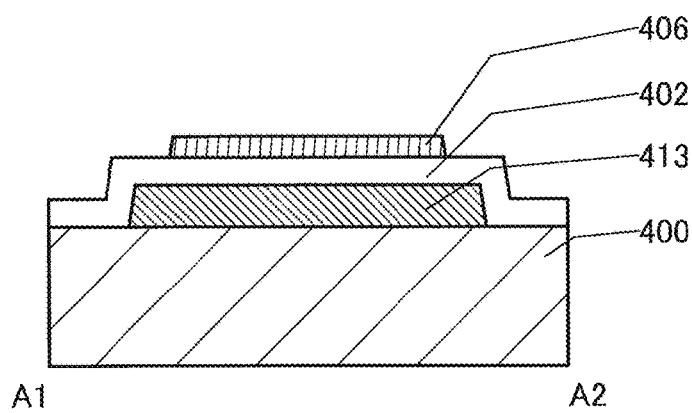

Next, an oxide semiconductor is formed. Next, an etching mask is formed over the oxide semiconductor. Then, a part of the oxide semiconductor is etched with use of the etching mask as a mask, whereby an oxide semiconductor 406 is formed (see FIGS. 8A to 8C).

Next, first heat treatment is preferably performed. For the first heat treatment, the above description can be referred to.

Figure 9A:
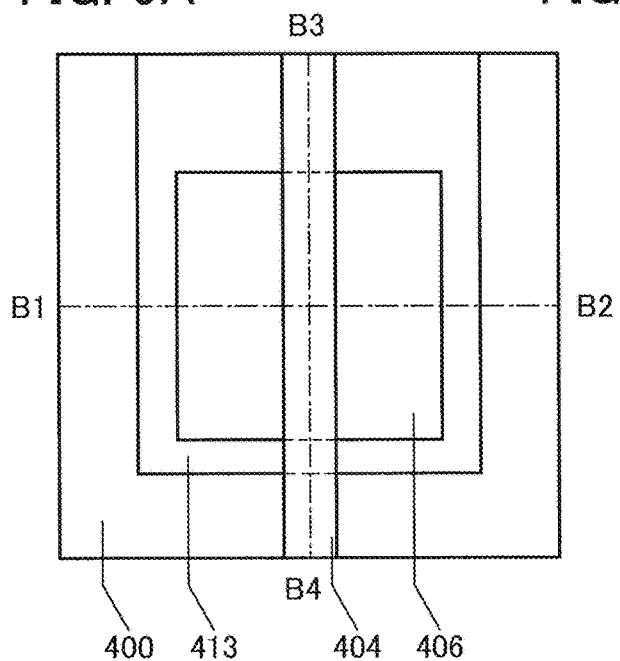
FIGS. 9A to 9C are a top view and cross-sectional views illustrating a method for manufacturing a transistor according to one embodiment of the present invention.
Figure 9C:
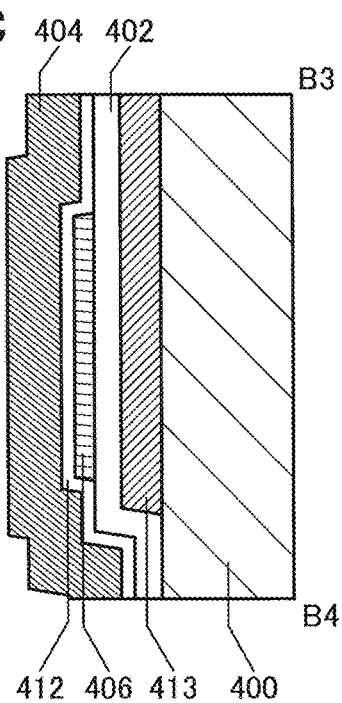
Figure 9B:
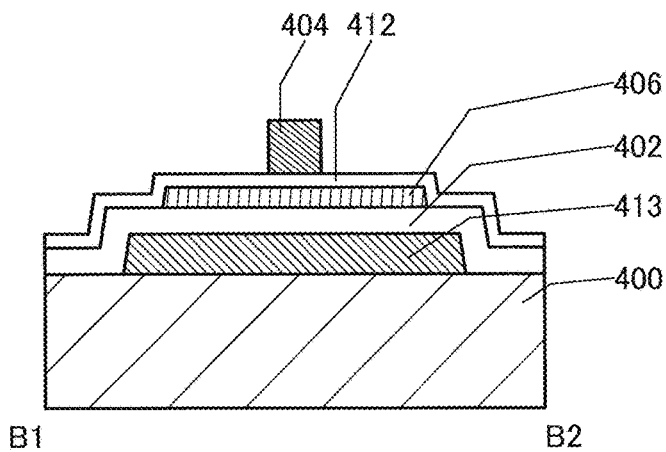

Next, an insulator 412 is formed. Next, a conductor is formed. Next, an etching mask is formed over the conductor. Then, a part of the conductor is etched with use of the etching mask as a mask, whereby a conductor 404 is formed (see FIGS. 9A to 9C).

Figure 10A:
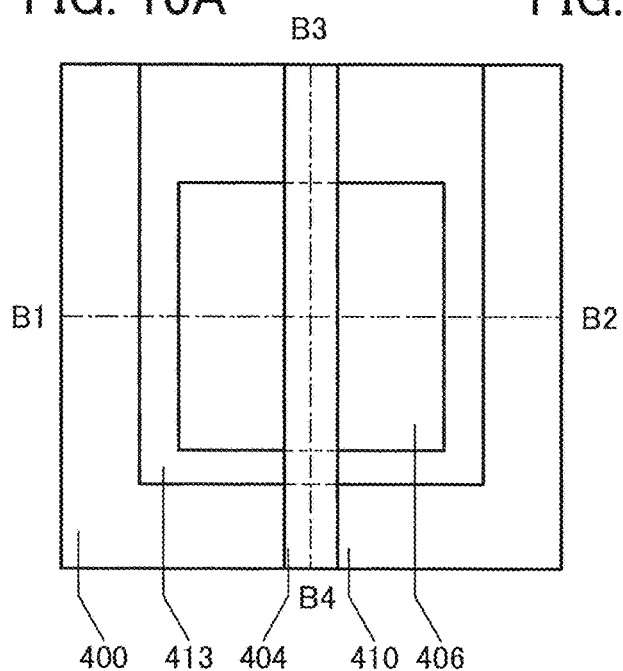
FIGS. 10A to 10C are a top view and cross-sectional views illustrating a method for manufacturing a transistor according to one embodiment of the present invention.
Figure 10C:
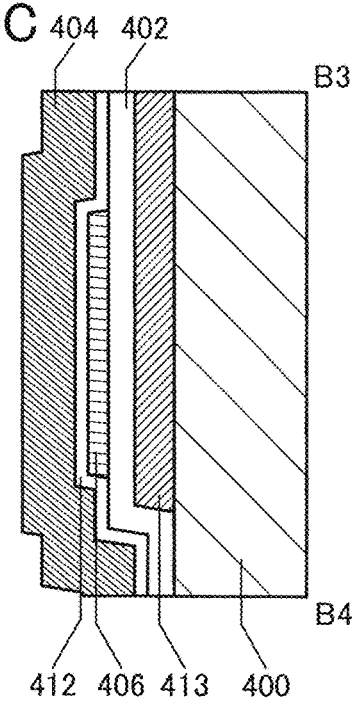
Figure 10B:
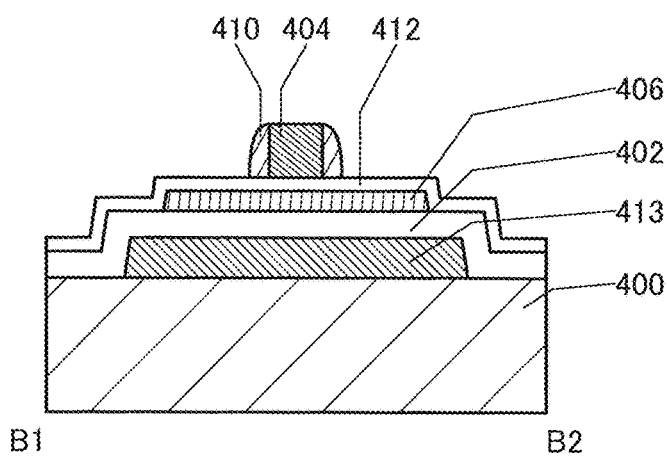

Next, an insulator is formed. Next, a part of the insulator is etched by anisotropic etching, whereby an insulator 410 is formed (see FIGS. 10A to 10C). The insulator 410 is also referred to as a sidewall insulator because the insulator 410 is formed to be in contact with a side surface of the conductor 404. Note that a transistor according to one embodiment of the present invention does not necessarily include the insulator 410. In that case, this process can be omitted.

Figure 11A:
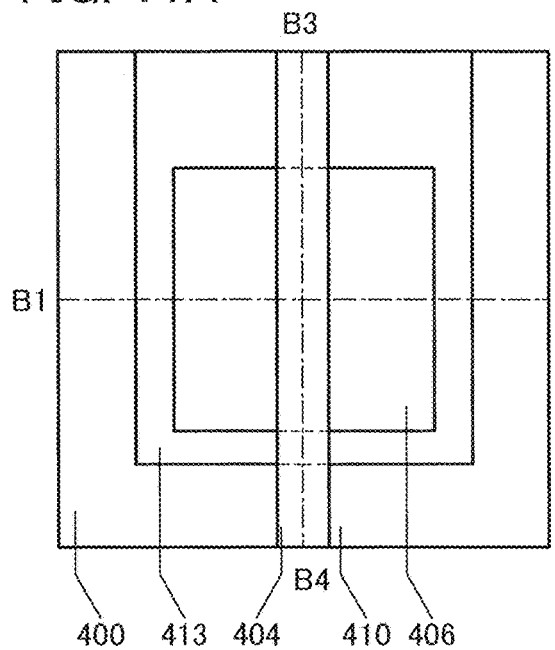
FIGS. 11A to 11C are a top view and cross-sectional views illustrating a method for manufacturing a transistor according to one embodiment of the present invention.
Figure 11C:
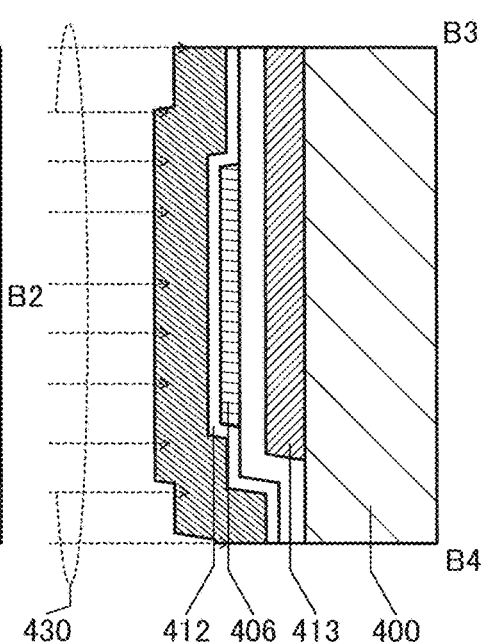
Figure 11B:
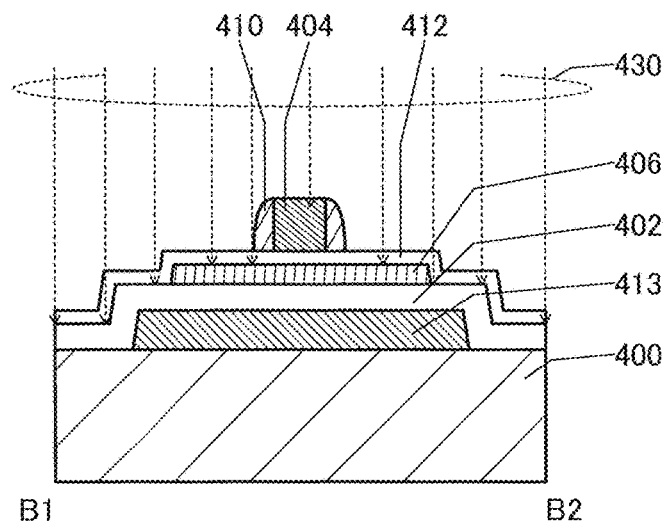

Next, treatment for forming defects in the oxide semiconductor 406 is preferably performed. For the treatment, for example, ions 430 are added by an ion implantation method (see FIGS. 11A to 11C). For the method for adding the ions 430, the above description is referred to.

After the addition of the ions 430, heat treatment may be performed. The heat treatment may be performed at higher than or equal to 250° C. and lower than or equal to 650° C., preferably higher than or equal to 350° C. and lower than or equal to 450° C. in a nitrogen atmosphere, or under reduced pressure or air (ultra-dry air), for example.

Defects are formed in a part of the oxide semiconductor 406 by adding the ions 430. Here, defects are formed in a region other than the region protected by the conductor 404 and the insulator 410.

Figure 12A:
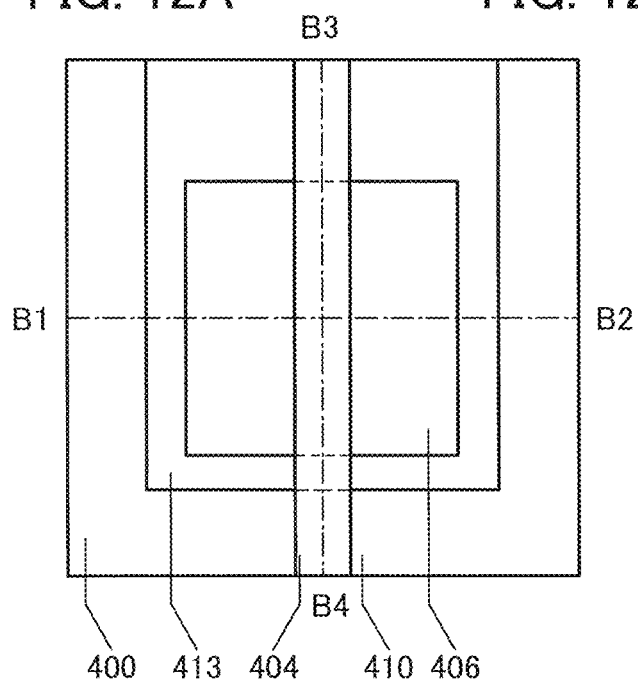
FIGS. 12A to 12C are a top view and cross-sectional views illustrating a method for manufacturing a transistor according to one embodiment of the present invention.
Figure 12C:
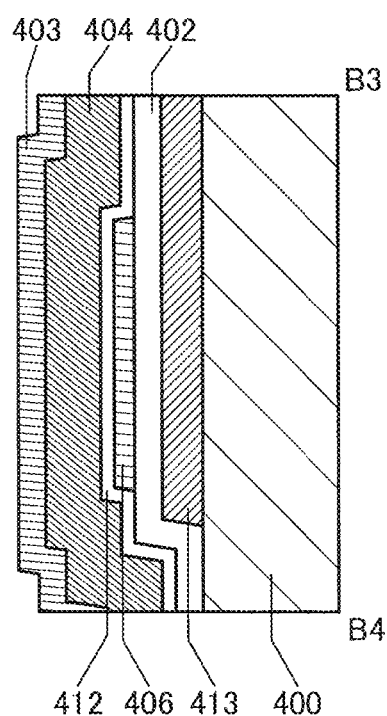
Figure 12B:
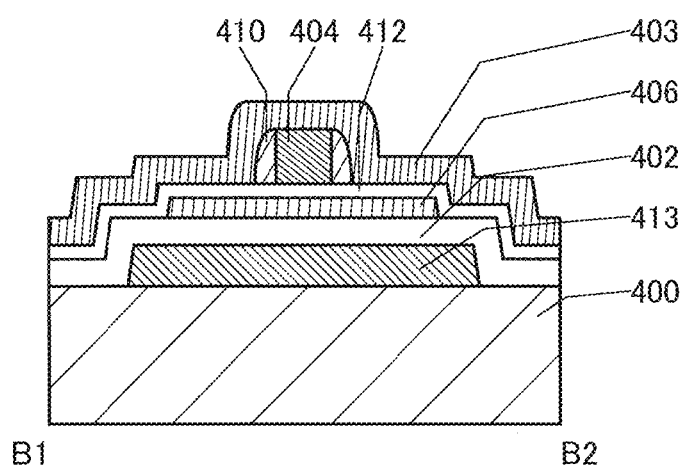

Next, a hydrogen-containing layer 403 is formed (see FIGS. 12A to 12C).

Next, second heat treatment is performed. The second heat treatment may be performed in a manner similar to that of the first heat treatment. In particular, it is preferable to perform the second heat treatment at a temperature higher than or equal to 150° C. and lower than or equal to 450° C., or higher than or equal to 200° C. and lower than or equal to 300° C. Excess hydrogen moves from the hydrogen-containing layer 403 into the oxide semiconductor 406 through the insulator 412 by the second heat treatment. Then, the excess hydrogen enters defects in the oxide semiconductor 406 and a donor level is formed. As a result, the resistance of a part of the oxide semiconductor 406 is reduced. Here, regions whose resistance is reduced are denoted by a region 406n1 and a region 406n2, and a region whose resistance is not reduced is denoted by a region 406i. This principle is the same as that described in FIGS. 1A and 1B.

Then, the hydrogen-containing layer 403 is removed. Thus, the transistor is completed (see FIGS. 13A to 13C).

Figure 13A:
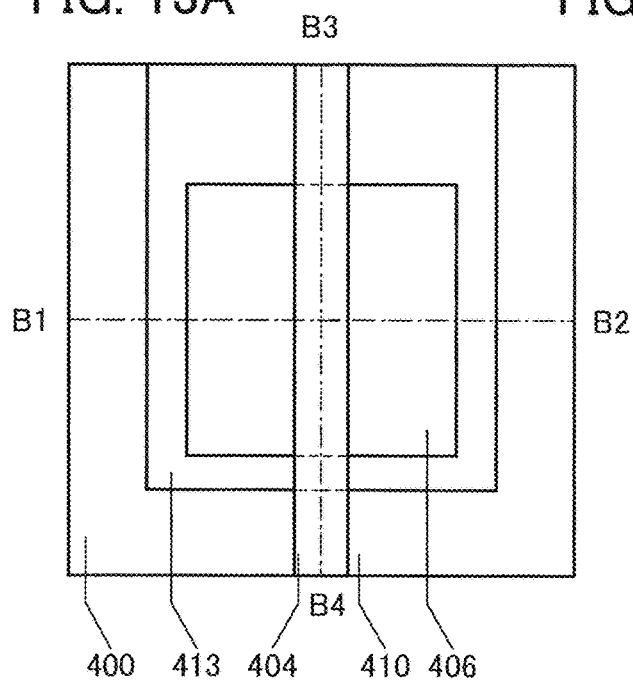
FIGS. 13A to 13C are a top view and cross-sectional views illustrating a method for manufacturing a transistor according to one embodiment of the present invention.
Figure 13C:
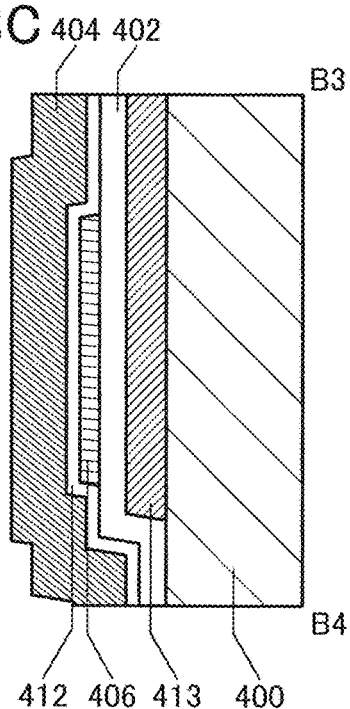
Figure 13B:
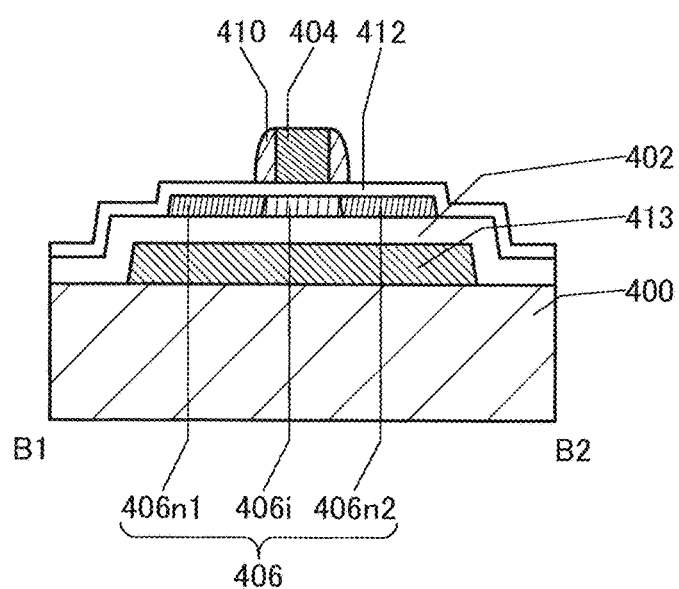

In the transistor illustrated in FIGS. 13A to 13C, the conductor 404 functions as a gate electrode. The insulator 412 functions as a gate insulator. The region 406n1 and the region 406n2 in the oxide semiconductor function as a source region and a drain region. The region 406i in the oxide semiconductor functions as a channel formation region. The conductor 413 functions as a second gate electrode. The insulator 402 functions as a second gate insulator. Note that functions of the conductor 413 and the insulator 402 may be exchanged for functions of the conductor 404 and the insulator 412. The conductor 413 is not necessarily formed. In that case, switching of the transistor can be controlled by the conductor 404. The conductor 404 is not necessarily formed. In that case, switching of the transistor can be controlled by the conductor 413.

Excess hydrogen is stabilized by entering defects in the oxide semiconductor 406. Thus, the excess hydrogen which enters the defects is hardly diffused into other regions while the second heating treatment is performed. Furthermore, the region 406n1 and the region 406n2 are protected by the insulator 412. In other words, the region 406n1 and the region 406n2 are stable low-resistance regions. Hence, the transistor can have high on-state current and suffer less deterioration. Excess hydrogen is less likely to enter a region of the oxide semiconductor 406 that overlaps with the conductor 404 and the insulator 410 because of few defects in the oxide semiconductor 406. Thus, the carrier density in the channel formation region can be lowered. Because the carrier density in the channel formation region can be lowered, variations in electrical characteristics of the transistor can be reduced even in the case where the channel length is short. Moreover, the off-state current can be reduced. In addition, deterioration caused by defects can be reduced. The above overlapping region is slightly wider than the region 406i.

<Components of Transistor>

The components of the transistor will be described below.

For the hydrogen-containing layer 403, the description of the hydrogen-containing layer 103 is referred to.

As the substrate 400, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a single material semiconductor substrate made of silicon, germanium, or the like or a compound semiconductor substrate made of silicon carbide, silicon germanium, gallium arsenide, indium phosphide, zinc oxide, gallium oxide, or the like is used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including an oxide semiconductor, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 400. As a method for providing a device over a flexible substrate, there is a method in which the device is formed over a non-flexible substrate and then the device is separated and transferred to the substrate 400 which is a flexible substrate. In that case, a separation layer is preferably provided between the non-flexible substrate and the device. As the substrate 400, a sheet, a film, or a foil containing a fiber may be used. The substrate 400 may have elasticity. The substrate 400 may have a property of returning to its original shape when bending or pulling is stopped. Alternatively, the substrate 400 may have a property of not returning to its original shape. The thickness of the substrate 400 is, for example, greater than or equal to 5 μm and less than or equal to 700 μm, preferably greater than or equal to 10 μm and less than or equal to 500 μm, or further preferably greater than or equal to 15 μm and less than or equal to 300 μm. When the substrate 400 has a small thickness, the weight of the semiconductor device can be reduced. When the substrate 400 has a small thickness, even in the case of using glass or the like, the substrate 400 may have elasticity or a property of returning to its original shape when bending or pulling is stopped. Therefore, an impact applied to the semiconductor device over the substrate 400, which is caused by dropping or the like, can be reduced. That is, a durable semiconductor device can be provided.

For the substrate 400 which is a flexible substrate, metal, an alloy, resin, glass, or fiber thereof can be used, for example. The flexible substrate 400 preferably has a lower coefficient of linear expansion because deformation due to an environment is suppressed. The flexible substrate 400 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 400 because of its low coefficient of linear expansion.

The insulators 402, 410, and 412 may each be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide can be used.

The insulator 402 and the insulator 412 are preferably insulators containing excess oxygen. Excess oxygen can be used to reduce the amount of oxygen vacancy in the channel formation region in the oxide semiconductor. Note that excess oxygen means oxygen in an insulator or the like which does not bond with (which is liberated from) the insulator or the like or has low bonding energy with the insulator or the like.

Here, an insulator including excess oxygen may release oxygen, the amount of which is higher than or equal to $1\times10^{18}$ atoms/cm$^3$, higher than or equal to $1\times10^{19}$ atoms/cm$^3$, or higher than or equal to $1\times10^{20}$ atoms/cm$^3$ (converted into the amount of oxygen atoms) in TDS analysis in the range of a surface temperature of 100° C. to 700° C. or 100° C. to 500° C.

A method for measuring the amount of released oxygen using TDS analysis is described below.

The total amount of gas released from a measurement sample in TDS analysis is proportional to the integral value of the ion intensity of the released gas. Then, comparison with a standard sample is made, whereby the total amount of released gas can be calculated.

For example, the amount of oxygen molecules ($N_{O2}$) released from a measurement sample can be calculated according to the following formula using the TDS results of a silicon substrate containing hydrogen at a predetermined density, which is a standard sample, and the TDS results of the measurement sample. Here, all gases having a mass-to-charge ratio of 32 which are obtained in the TDS analysis are assumed to originate from an oxygen molecule. Note that CH$_3$OH, which is a gas having a mass-to-charge ratio of 32, is not taken into consideration because it is unlikely to be present. Further, an oxygen molecule including an oxygen atom having a mass number of 17 or 18 which is an isotope of an oxygen atom is also not taken into consideration because the proportion of such a molecule in the natural world is minimal.

$$N_{O2}=N_{H2}/S_{H2}\times S_{O2}\times\alpha$$

A value $N_{H2}$ is obtained by conversion of the amount of hydrogen molecules released from the standard sample into densities. A value $S_{H2}$ is the integral value of ion intensity when the standard sample is subjected to TDS analysis. Here, the reference value of the standard sample is set to $N_{H2}/S_{H2}$. $S_{O2}$ is the integral value of ion intensity when the measurement sample is analyzed by TDS analysis. $\alpha$ is a coefficient which influences the ion intensity in the TDS analysis. The amount of released oxygen was measured with a thermal desorption spectroscopy apparatus produced by ESCO Ltd., EMD-WA1000S/W, using a silicon substrate containing a certain amount of hydrogen atoms as the standard sample.

Further, in the TDS analysis, oxygen is partly detected as an oxygen atom. The ratio of oxygen molecules to oxygen atoms can be calculated from the ionization rate of the oxygen molecules. Note that since the above $\alpha$ includes the ionization rate of the oxygen molecules, the amount of the released oxygen atoms can also be estimated through the measurement of the amount of the released oxygen molecules.

Note that $N_{O2}$ is the amount of the released oxygen molecules. The amount of released oxygen in the case of being converted into oxygen atoms is twice the amount of the released oxygen molecules.

Furthermore, the insulator from which oxygen is released by heat treatment may contain a peroxide radical. Specifically, the spin density attributed to the peroxide radical is greater than or equal to $5\times10^{17}$ spins/cm$^3$. Note that the insulator containing a peroxide radical may have an asymmetric signal with a g factor of approximately 2.01 in electron spin resonance (ESR).

The insulator 410 preferably contains an insulator having a function of blocking (a function of not transmitting) oxygen and impurities such as hydrogen. As described above, the transistor according to one embodiment of the present invention reduce the resistance of a part of the oxide semiconductor 406 by diffusing hydrogen from the hydrogen-containing layer 403. On the other hand, the transistor has normally-on characteristics in some cases when the resistance of the channel formation region of the transistor is reduced, so it is preferable not to diffuse hydrogen into the channel region in the transistor. Therefore, the insulator 410, which is provided near the channel region in the transistor, preferably has a function of blocking hydrogen. Further, in the case where the insulator 412 contains excess oxygen, outward diffusion of excess oxygen can be inhibited when the insulator 410 has a function of blocking oxygen. Thus, the amount of oxygen vacancy in the channel formation region can be reduced efficiently.

Because the hydrogen atomic radius or the like is small, hydrogen is likely to be diffused in an insulator (i.e., the diffusion coefficient of hydrogen is large). For example, a low-density insulator has a high hydrogen-transmitting property. In other words, a high-density insulator has a low hydrogen-transmitting property. The density of a low-density insulator is not always low throughout the insulator; a material including a low-density part is also referred to as a low-density insulator. This is because the low-density part serves as a hydrogen path. Although a density that allows hydrogen to be transmitted is not limited, it is typically lower than 2.6 g/cm$^3$. Examples of a low-density insulator include inorganic insulators such as silicon oxide or silicon oxynitride and organic insulators such as polyester, polyolefin, polyamide (e.g., nylon or aramid), polyimide, polycarbonate, or acrylic. Examples of a high-density insulator include magnesium oxide, aluminum oxide, germanium oxide, gallium oxide, yttrium oxide, zirconium oxide, lanthanum oxide, neodymium oxide, hafnium oxide, and tantalum oxide. Note that a low-density insulator and a high-density insulator are not limited to these insulators. For example, the insulators may contain one or more of boron, nitrogen, fluorine, neon, phosphorus, chlorine, and argon.

An insulator containing crystal grain boundaries can have a high hydrogen-transmitting property. In other words, hydrogen is less likely transmitted through an insulator containing no grain boundaries or few grain boundaries. For example, a non-polycrystalline insulator (e.g., an amorphous insulator) has a lower hydrogen-transmitting property than a polycrystalline insulator.

An insulator having a high hydrogen-bonding energy has a low hydrogen-transmitting property in some cases. For example, when an insulator which forms a hydrogen compound by bonding with hydrogen has bonding energy at which hydrogen is not released at temperatures in fabrication and operation of the device, the insulator can be in the category of an insulator having a low hydrogen-transmitting property. For example, an insulator which forms a hydrogen compound at higher than or equal to 200° C. and lower than or equal to 1000° C., higher than or equal to 300° C. and lower than or equal to 1000° C., or higher than or equal to 400° C. and lower than or equal to 1000° C. has a low hydrogen-transmitting property in some cases. An insulator which forms a hydrogen compound and which releases hydrogen at higher than or equal to 200° C. and lower than or equal to 1000° C., higher than or equal to 300° C. and lower than or equal to 1000° C., or higher than or equal to 400° C. and lower than or equal to 1000° C. has a low hydrogen-transmitting property in some cases. An insulator which forms a hydrogen compound and which releases hydrogen at higher than or equal to 20° C. and lower than or equal to 400° C., higher than or equal to 20° C. and lower than or equal to 300° C., or higher than or equal to 20° C. and lower than or equal to 200° C. has a high hydrogen-transmitting property in some cases. Hydrogen which is released easily and liberated can be referred to as excess hydrogen.

The conductor 413 and the conductor 404 may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound may also be used, for example, and an alloy containing aluminum, an alloy containing copper and titanium, an alloy containing copper and manganese, a compound containing indium, tin, and oxygen, a compound containing titanium and nitrogen, or the like may be used.

An oxide conductor can be used as the conductor 404. Further, an oxide semiconductor is formed and changed to an oxide conductor by treatment after the oxide semiconductor formation, and the oxide conductor can be used as the conductor 404. For example, an oxide semiconductor can be changed to an oxide conductor in the process where excess hydrogen is moved from the hydrogen-containing layer 403. For the oxide semiconductor, the oxide semiconductor 406 described later is referred to.

<Oxide Semiconductor>

An oxide that can be used as the oxide semiconductor 406 is described below.

An oxide preferably contains at least indium or zinc. In particular, indium and zinc are preferably contained. In addition, aluminum, gallium, yttrium, tin, or the like is preferably contained. Furthermore, one or more selected from boron, silicon, titanium, iron, nickel, germanium, zirconium, molybdenum, lanthanum, cerium, neodymium, hafnium, tantalum, tungsten, magnesium, or the like may be contained.

Here, the case where an oxide contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

First, preferred ranges of the atomic ratio of indium, the element M, and zinc contained in an oxide according to the present invention are described with reference to FIGS. 42A to 42C. Note that the proportion of oxygen atoms is not shown in FIGS. 42A to 42C. The terms of the atomic ratio of indium, the element M, and zinc contained in the oxide are denoted by [In], [M], and [Zn], respectively.

Figure 42A:
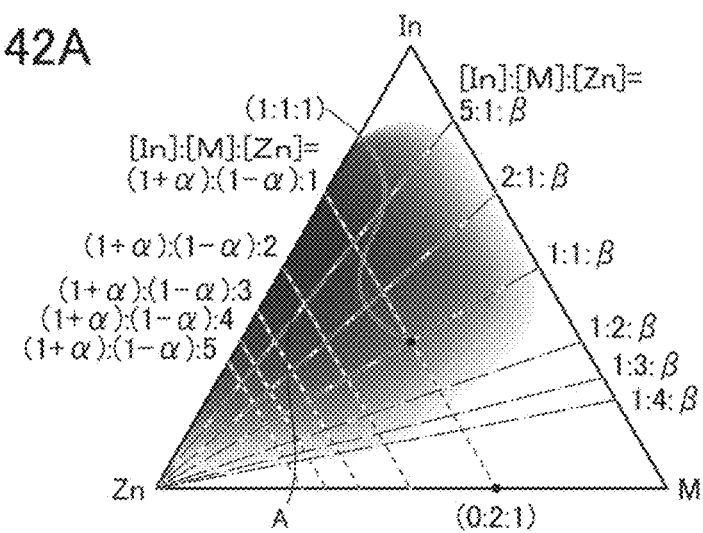
FIGS. 42A to 42C each illustrate an atomic ratio range of an oxide according to the present invention.
Figure 42B:
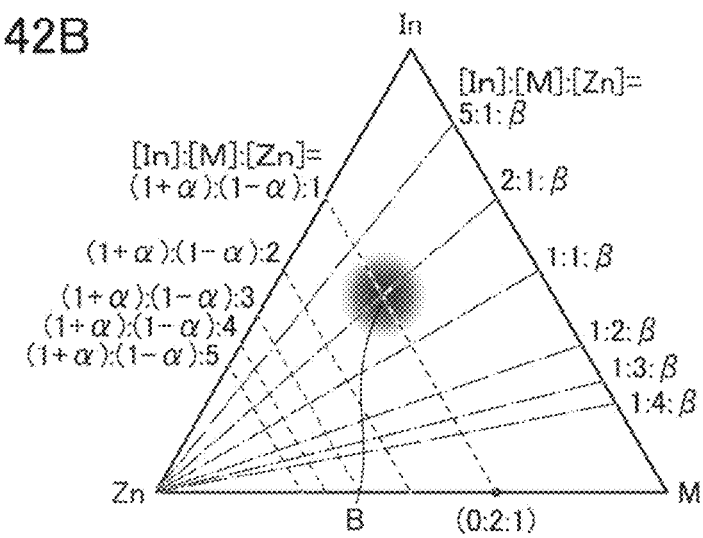
Figure 42C:
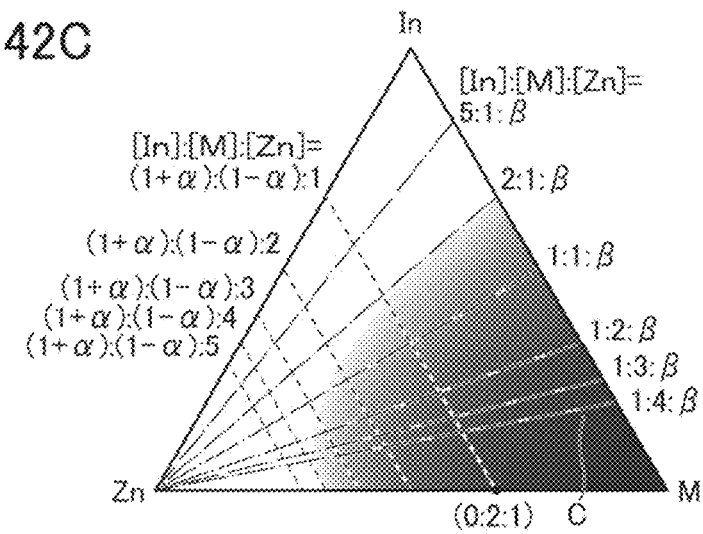

In FIGS. 42A to 42C, broken lines indicate a line where the atomic ratio [In]:[M]:[Zn] is $(1+\alpha):(1-\alpha):1$, where $-1 \leq \alpha \leq 1$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $1:1:\beta$, where $\beta \geq 0$, a line where the atomic ratio [In]:[M]:[Zn] is $1:2:\beta$, a line where the atomic ratio [In]:[M]:[Zn] is $1:3:\beta$, a line where the atomic ratio [In]:[M]:[Zn] is $1:4:\beta$, a line where the atomic ratio [In]:[M]:[Zn] is $2:1:\beta$, and a line where the atomic ratio [In]:[M]:[Zn] is $5:1:\beta$.

FIGS. 42A and 42B illustrate examples of the preferred ranges of the atomic ratio of indium, the element M, and zinc contained in an oxide in one embodiment of the present invention.

Figure 43:
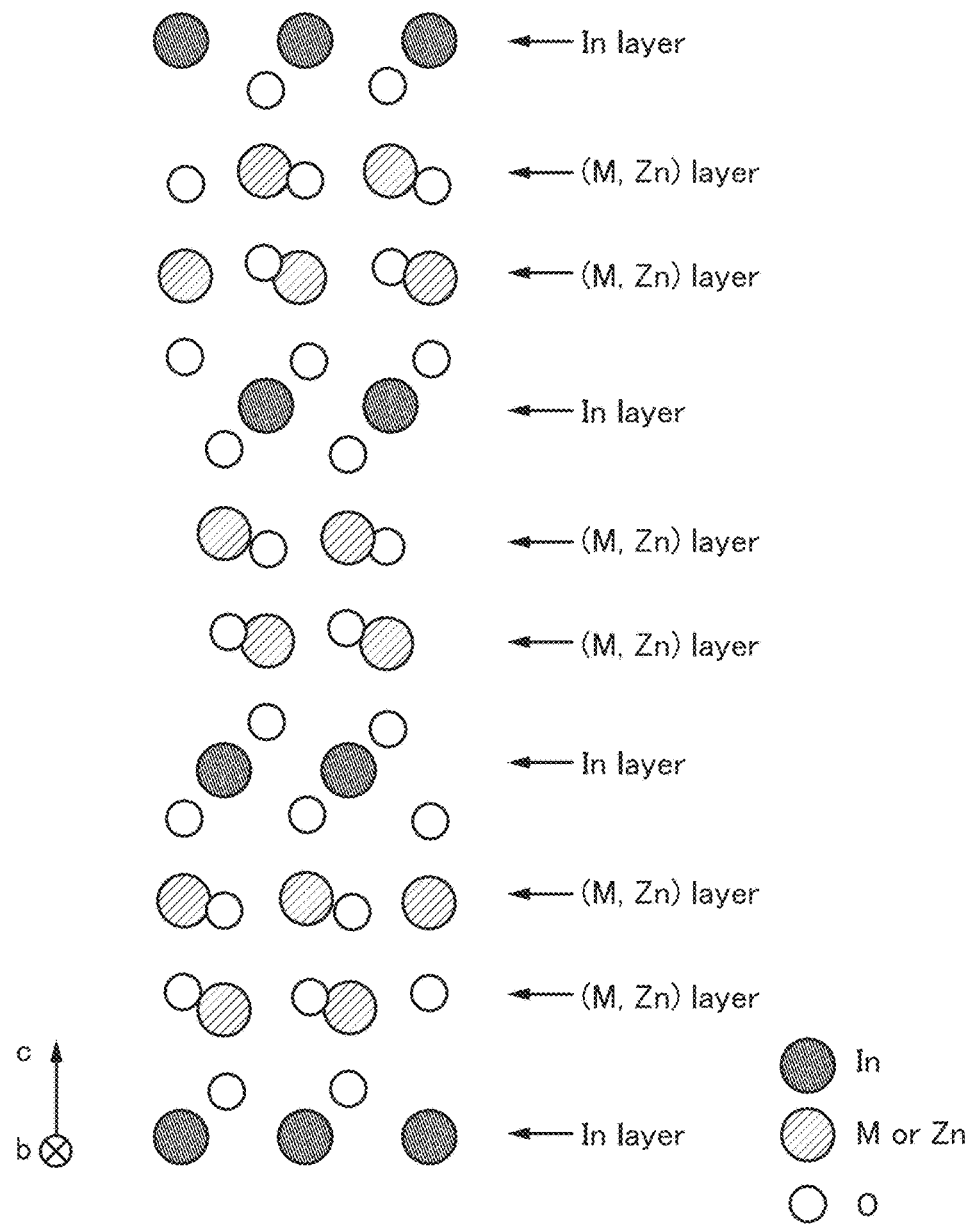
FIG. 43 is a figure illustrating a crystal structure of $InMZnO_4$.

FIG. 43 illustrates an example of the crystal structure of $InMZnO_4$ whose atomic ratio [In]:[M]:[Zn] is 1:1:1. Furthermore, FIG. 43 illustrates the crystal structure of $InMZnO_4$ observed from a direction parallel to the b-axis. Note that a metal element in a layer that contains M, Zn, and oxygen (hereinafter, this layer is referred to as an "(M,Zn) layer") in FIG. 43 represents the element M or zinc. In that case, the proportion of the element M is the same as the proportion of zinc. The element M and zinc can be replaced with each other, and their arrangement is random.

$InMZnO_4$ has a layered crystal structure (also referred to as a layered structure) and includes one layer that contains indium and oxygen (hereinafter referred to as an In layer) for every two (M,Zn) layers that contain the element M, zinc, and oxygen, as illustrated in FIG. 43.

Indium and the element M can be replaced with each other. Therefore, when the element M in the (M,Zn) layer is replaced by indium, the layer can also be referred to as an (In,M,Zn) layer. In that case, a layered structure that includes one In layer for every two (In,M,Zn) layers is obtained.

An oxide whose atomic ratio [In]:[M]:[Zn] is 1:1:2 has a layered structure that includes one In layer for every three (M,Zn) layers. In other words, if [Zn] is larger than [In] and [M], the proportion of the (M,Zn) layer to the In layer becomes higher when the oxide is crystallized.

Note that in the case where the number of (M,Zn) layers for every In layer is not an integer in the oxide, the oxide might have plural kinds of layered structures where the number of (M,Zn) layers for every In layer is an integer. For example, in the case of [In]:[M]:[Zn]=1:1:1.5, the oxide might have the following layered structures: a layered structure that includes one In layer for every two (M,Zn) layers and a layered structure that includes one In layer for every three (M,Zn) layers.

For example, in the case where the oxide is deposited with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide, a grain boundary might be formed between different crystal structures.

In addition, the oxide containing indium in a higher proportion can have high carrier mobility (electron mobility). Therefore, an oxide having a high content of indium has higher carrier mobility than that of an oxide having a low content of indium.

In contrast, when the indium content and the zinc content in an oxide become lower, carrier mobility becomes lower. Thus, with an atomic ratio of [In]:[M]:[Zn]=0:1:0 and the vicinity thereof (e.g., a region C in FIG. 42C), insulation performance becomes better.

Accordingly, an oxide in one embodiment of the present invention preferably has an atomic ratio represented by a region A in FIG. 42A. With the atomic ratio, a layered structure with high carrier mobility and a few grain boundaries is easily obtained.

A region B in FIG. 42B represents an atomic ratio of [In]:[M]:[Zn]=4:2:3 to 4:2:4.1 and the vicinity thereof. The vicinity includes an atomic ratio of [In]:[M]:[Zn]=5:3:4. An oxide with an atomic ratio represented by the region B is an excellent oxide that has particularly high crystallinity and high carrier mobility.

Note that a condition where an oxide has a layered structure is not uniquely determined by an atomic ratio. The atomic ratio affects difficulty in forming a layered structure. Even with the same atomic ratio, whether a layered structure is formed or not depends on a formation condition. Therefore, the illustrated regions each represent an atomic ratio with which an oxide has a layered structure, and boundaries of the regions A to C are not clear.

Next, the case where the oxide is used for a transistor will be described.

Note that when the oxide is used for a transistor, carrier scattering or the like at a grain boundary can be reduced; thus, the transistor can have high field-effect mobility. In addition, the transistor can have high reliability.

An oxide with low carrier density is preferably used for the transistor. For example, an oxide whose carrier density is lower than $8\times10^{11}/cm^3$, preferably lower than $1\times10^{11}/cm^3$, further preferably lower than $1\times10^{10}/cm^3$, and greater than or equal to $1\times10^{9}/cm^3$ is used.

A highly purified intrinsic or substantially highly purified intrinsic oxide has few carrier generation sources and thus can have a low carrier density. The highly purified intrinsic or substantially highly purified intrinsic oxide has a low density of defect states and accordingly has a low density of trap states in some cases.

Charge trapped by the trap states in the oxide takes a long time to be released and may behave like fixed charge. Thus, a transistor whose channel region is formed in an oxide having a high density of trap states has unstable electrical characteristics in some cases.

To obtain stable electrical characteristics of the transistor, it is effective to reduce the concentration of impurities in the oxide. In addition, to reduce the concentration of impurities in the oxide, the concentration of impurities in a film that is adjacent to the oxide is preferably reduced. Examples of impurities include hydrogen, nitrogen, alkali metal, alkaline earth metal, iron, nickel, and silicon.

Here, the influence of impurities in the oxide will be described.

When silicon or carbon that is one of Group 14 elements is contained in the oxide, defect states are formed. Thus, the concentration of silicon or carbon in the oxide and around an interface with the oxide (measured by secondary ion mass spectrometry (SIMS)) is set lower than or equal to $2\times10^{18}$ atoms/cm$^3$, and preferably lower than or equal to $2\times10^{17}$ atoms/cm$^3$.

When the oxide contains alkali metal or alkaline earth metal, defect states are formed and carriers are generated, in some cases. Thus, a transistor including an oxide that contains alkali metal or alkaline earth metal is likely to be normally-on. Therefore, it is preferable to reduce the concentration of alkali metal or alkaline earth metal in the oxide. Specifically, the concentration of alkali metal or alkaline earth metal in the oxide measured by SIMS is set lower than or equal to $1\times10^{18}$ atoms/cm$^3$, and preferably lower than or equal to $2\times10^{16}$ atoms/cm$^3$.

When the oxide contains nitrogen, the oxide easily becomes n-type by generation of electrons serving as carriers and an increase of carrier density. Thus, a transistor whose oxide includes nitrogen is likely to be normally-on. For this reason, nitrogen in the oxide is preferably reduced as much as possible; the nitrogen concentration measured by SIMS is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

Hydrogen contained in an oxide reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide that contains hydrogen is likely to be normally-on. Accordingly, it is preferable that hydrogen in the oxide be reduced as much as possible. Specifically, the hydrogen concentration measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When an oxide with sufficiently reduced impurity concentration is used for a channel formation region in a transistor, the transistor can have stable electrical characteristics.

Next, the case where the oxide has a two-layer structure or a three-layer structure is described. That is, the case where the oxide has a new oxide semiconductor or a new oxide insulator over and/or under the oxide semiconductor 406 is described. Here, the oxide semiconductor 406 is denoted by an oxide S2, an oxide under the oxide semiconductor 406 is denoted by an oxide S1, and an oxide over the oxide semiconductor 406 is denoted by an oxide S3. The oxide S1 may have similar shape to the oxide semiconductor 406 or the insulator 402 when seen form the above. Furthermore, the oxide S3 may have similar shape to the oxide semiconductor 406 or the insulator 412 when seen from the above. A band diagram of insulators that are in contact with a layered structure of the oxide S1, the oxide S2, and the oxide S3 and a band diagram of insulators that are in contact with a layered structure of the oxide S2 and the oxide S3 are described with reference to FIGS. 44A and 44B.

Figure 44A:
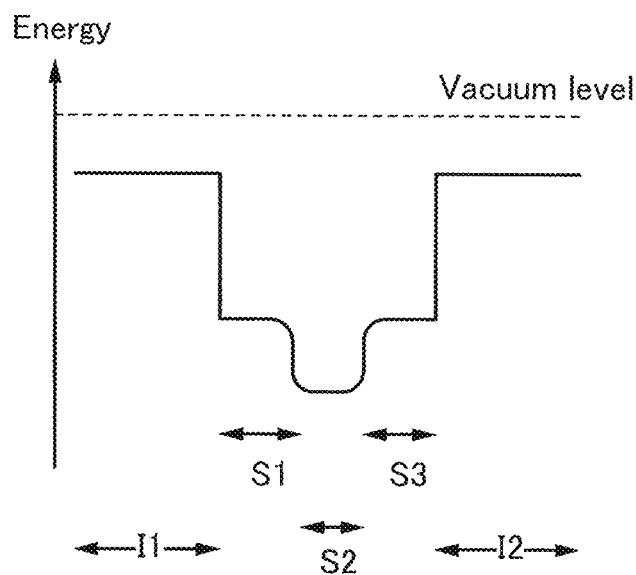
FIGS. 44A and 44B are band diagrams of a layered structure of oxides.
Figure 44B:
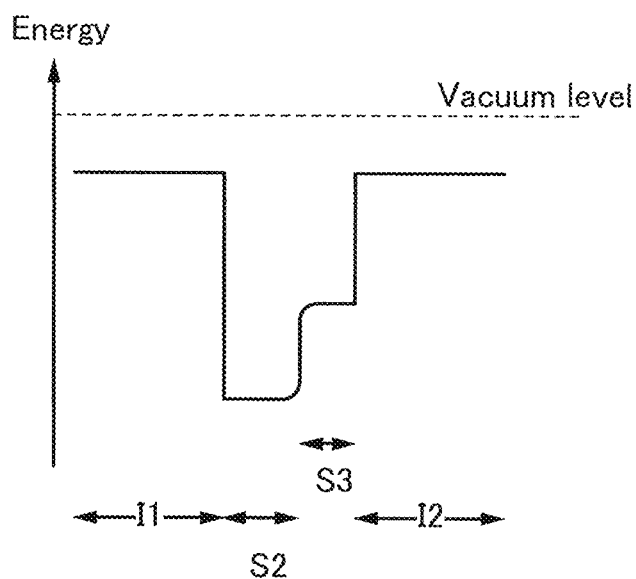

FIG. 44A is an example of a band diagram of a layered structure including an insulator I1, the oxide S1, the oxide S2, the oxide S3, and an insulator I2 in a thickness direction. FIG. 44B is an example of a band diagram of a layered structure including the insulator I1, the oxide S2, the oxide S3, and the insulator I2 in a thickness direction. Note that for easy understanding, the band diagrams show the conduction band minimum (Ec) of each of the insulator I1, the oxide S1, the oxide S2, the oxide S3, and the insulator I2.

The conduction band minimum of each of the oxides S1 and S3 is closer to the vacuum level than that of the oxide S2. Typically, a difference between the conduction band minimum of the oxide S2 and the conduction band minimum of each of the oxides S1 and S3 is preferably greater than or equal to 0.15 eV or greater than or equal to 0.5 eV, and less than or equal to 2 eV or less than or equal to 1 eV. That is, the electron affinity of the oxide S2 is higher than the electron affinity of each of the oxides S1 and S3, and the difference between the electron affinity of each of the oxides S1 and S3 and the electron affinity of the oxide S2 is greater than or equal to 0.15 eV or greater than or equal to 0.5 eV, and less than or equal to 2 eV or less than or equal to 1 eV.

As illustrated in FIGS. 44A and 44B, the conduction band minimum of each of the oxides S1 to S3 is gradually varied. In other words, the conduction band minimum is continuously varied or continuously connected. To obtain such a band diagram, the density of defect states in a mixed layer formed at an interface between the oxides S1 and S2 or an interface between the oxides S2 and S3 is preferably made low.

Specifically, when the oxides S1 and S2 or the oxides S2 and S3 contain the same element (as a main component) in addition to oxygen, a mixed layer with a low density of defect states can be formed. For example, in the case where the oxide S2 is an In—Ga—Zn oxide, it is preferable to use an In—Ga—Zn oxide, a Ga—Zn oxide, gallium oxide, or the like as each of the oxides S1 and S3.

At this time, the oxide S2 serves as a main carrier path. Since the density of defect states at the interface between the oxides S1 and S2 and the interface between the oxides S2 and S3 can be made low, the influence of interface scattering on carrier conduction is small, and a high on-state current can be obtained.

When an electron is trapped in a trap state, the trapped electron behaves like fixed charge; thus, the threshold voltage of the transistor is shifted in a positive direction. The oxides S1 and S3 can make the trap state apart from the oxide S2. This structure can prevent the positive shift of the threshold voltage of the transistor.

A material whose conductivity is sufficiently lower than that of the oxide S2 is used for the oxides S1 and S3. In that case, the oxide S2, the interface between the oxides S1 and S2, and the interface between the oxides S2 and S3 mainly function as a channel region. For example, an oxide with high insulation performance and the atomic ratio represented by the region C in FIG. 42C can be used as the oxides S1 and S3. Note that the region C in FIG. 42C represents the atomic ratio of [In]:[M]:[Zn]=0:1:0 or the vicinity thereof.

In the case where an oxide with the atomic ratio represented by the region A is used as the oxide S2, it is particularly preferable to use an oxide with [M]/[In] of greater than or equal to 1, preferably greater than or equal to 2, as each of the oxides S1 and S3. In addition, it is suitable to use an oxide with sufficiently high insulation performance and [M]/([Zn]+[In]) of greater than or equal to 1 as the oxide S3.

<Structure of Oxide Semiconductor>

A structure of an oxide semiconductor is described below.

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Figure 45A:
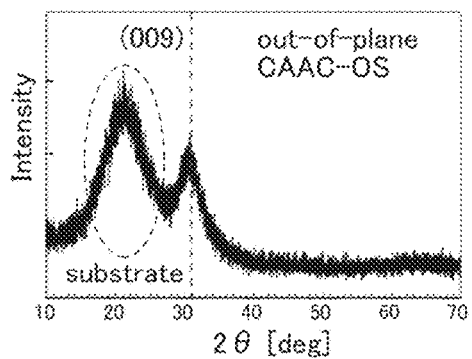
FIGS. 45A to 45E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an $InGaZnO_4$ crystal that is classified into the space group R-3m is analyzed by an out-of-plane method, a peak appears at a diffraction angle (2θ) of around 31° as shown in FIG. 45A. This peak is derived from the (009) plane of the $InGaZnO_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 45B:
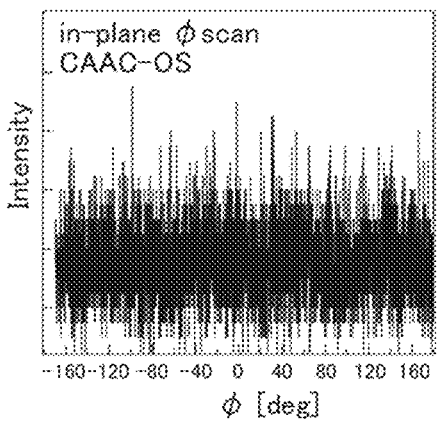
Figure 45C:
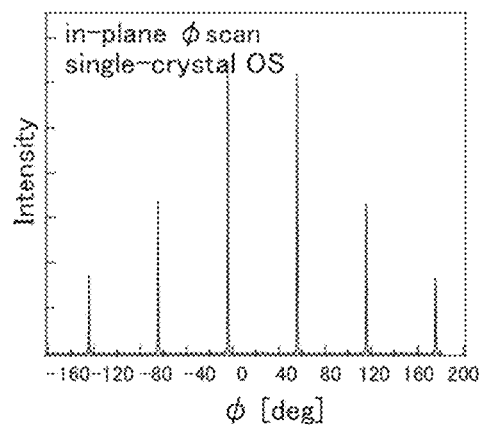

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the $InGaZnO_4$ crystal. When analysis (φ scan) is performed with 2θ fixed at around 56° and with the sample rotated using a normal vector to the sample surface as an axis (φ axis), as shown in FIG. 45B, a peak is not clearly observed. In contrast, in the case where single crystal $InGaZnO_4$ is subjected to φ scan with 2θ fixed at around 56°, as shown in FIG. 45C, six peaks that are derived from crystal planes equivalent to the (110) plane are observed. Accordingly, the structural analysis using XRD shows that the directions of a-axes and b-axes are irregularly oriented in the CAAC-OS.

Figure 45D:
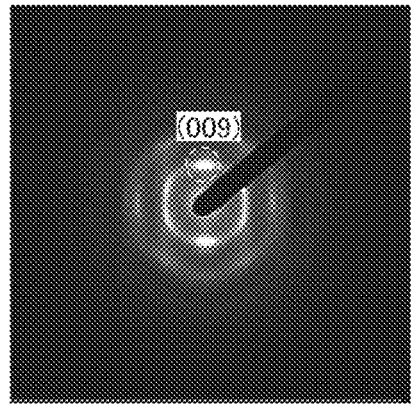
Figure 45E:
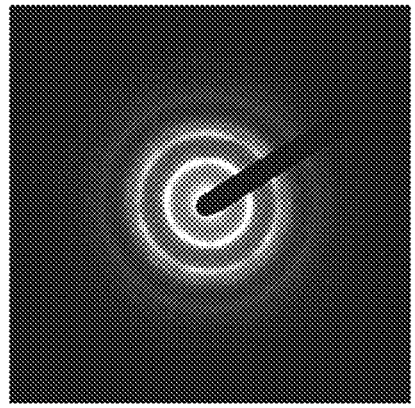

Next, a CAAC-OS analyzed by electron diffraction is described. For example, when an electron beam with a probe diameter of 300 nm is incident on a CAAC-OS including an $InGaZnO_4$ crystal in a direction parallel to the formation surface of the CAAC-OS, a diffraction pattern (also referred to as a selected-area electron diffraction pattern) shown in FIG. 45D can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 45E shows a diffraction pattern obtained in such a manner that an electron beam with a probe diameter of 300 nm is incident on the same sample in a direction perpendicular to the sample surface. As shown in FIG. 45E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 45E is considered to be derived from the (010) plane, the (100) plane, and the like of the InGaZnO$_4$ crystal. The second ring in FIG. 45E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 46A:
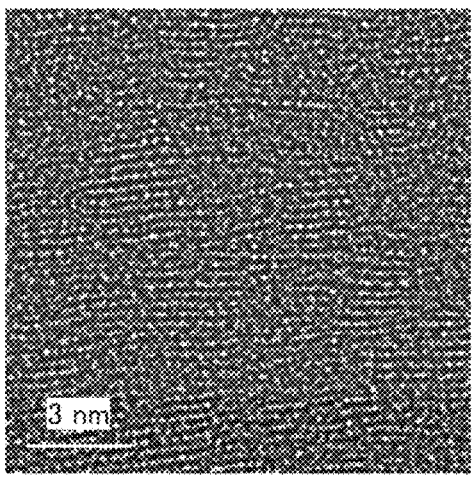
FIGS. 46A to 46E show a cross-sectional TEM image and plan-view TEM images of a CAAC-OS and images obtained through analysis thereof.

FIG. 46A shows a high-resolution TEM image of a cross section of the CAAC-OS that is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 46A shows pellets in which metal atoms are arranged in a layered manner. FIG. 46A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 46B:
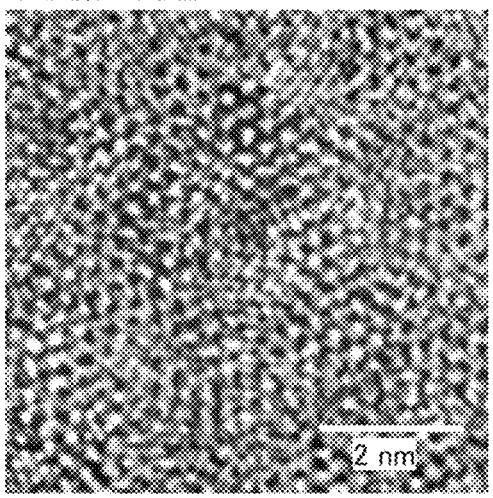
Figure 46C:
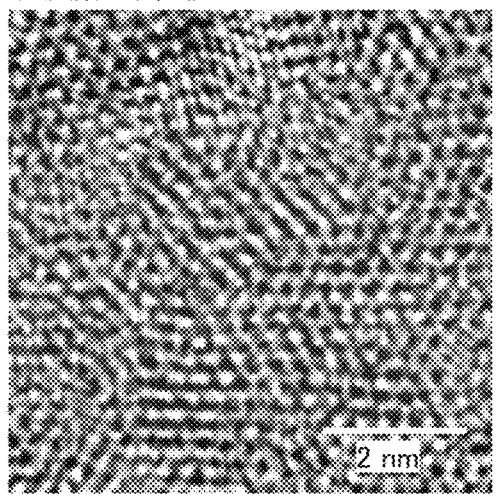
Figure 46D:
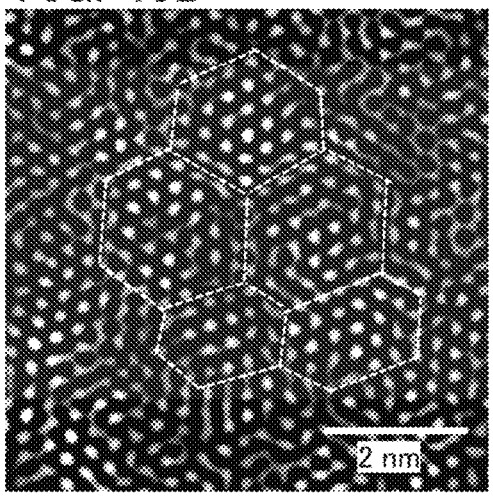
Figure 46E:
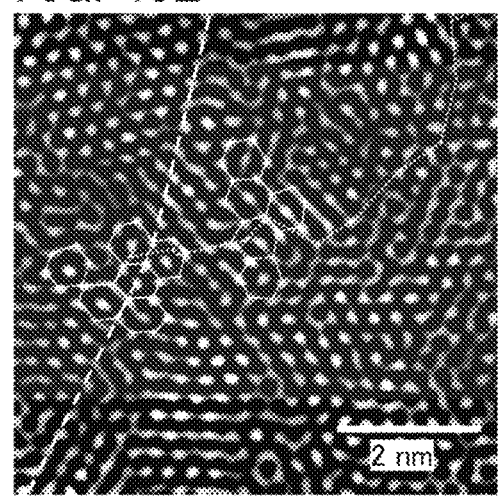

FIGS. 46B and 46C show Cs-corrected high-resolution TEM images of a plane of the CAAC-OS observed from a direction substantially perpendicular to the sample surface. FIGS. 46D and 46E are images obtained through image processing of FIGS. 46B and 46C. The method of image processing is as follows. The image in FIG. 46B is subjected to fast Fourier transform (FFT), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 46D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 46E, a dotted line denotes a portion where the direction of a lattice arrangement changes between a region with a well lattice arrangement and another region with a well lattice arrangement, and a dashed line denotes the change in the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed. That is, a lattice arrangement is distorted so that formation of a crystal grain boundary is inhibited. This is probably because the CAAC-OS can tolerate distortion owing to a low density of the atomic arrangement in an a-b plane direction, the interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities included in the oxide semiconductor might serve as carrier traps or carrier generation sources, for example. For example, oxygen vacancy in the oxide semiconductor might serve as a carrier trap or serve as a carrier generation source when hydrogen is captured therein.

The CAAC-OS having small amounts of impurities and oxygen vacancy is an oxide semiconductor with a low carrier density (specifically, lower than $8 \times 10^{11}/cm^3$, preferably lower than $1 \times 10^{11}/cm^3$, and further preferably lower than $1 \times 10^{10}/cm^3$ and higher than or equal to $1 \times 10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 47A:
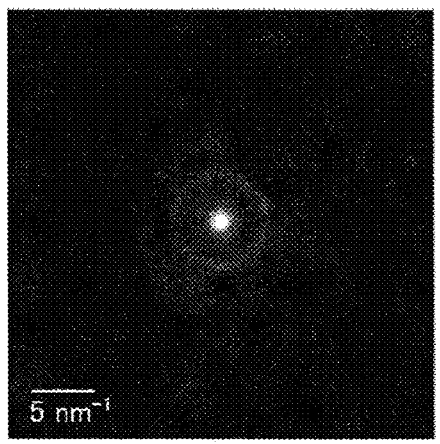
FIGS. 47A to 47D show electron diffraction patterns and a cross-sectional TEM image of an nc-OS.
Figure 47B:
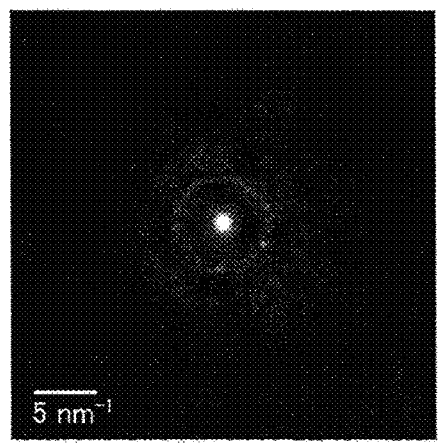

For example, when an electron beam with a probe diameter of 50 nm is incident on a 34-nm-thick region of thinned nc-OS including an InGaZnO$_4$ crystal in a direction parallel to the formation surface, a ring-shaped diffraction pattern (a nanobeam electron diffraction pattern) shown in FIG. 47A is observed. FIG. 47B shows a diffraction pattern obtained when an electron beam with a probe diameter of 1 nm is incident on the same sample. As shown in FIG. 47B, a plurality of spots are observed in a ring-like region. In other words, ordering in an nc-OS is not observed with an electron beam with a probe diameter of 50 nm but is observed with an electron beam with a probe diameter of 1 nm.

Figure 47C:
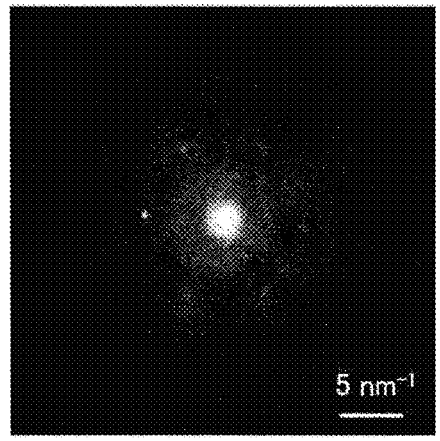

Furthermore, an electron diffraction pattern in which spots are arranged in an approximately regular hexagonal shape is observed in some cases as shown in FIG. 47C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 47D:
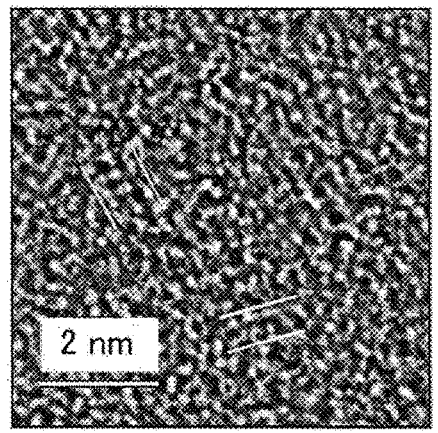

FIG. 47D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 47D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure between those of the nc-OS and the amorphous oxide semiconductor.

Figure 48A:
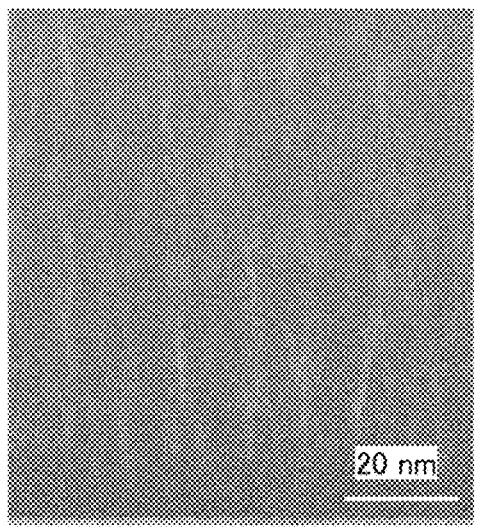
FIGS. 48A and 48B show cross-sectional TEM images of an a-like OS.
Figure 48B:
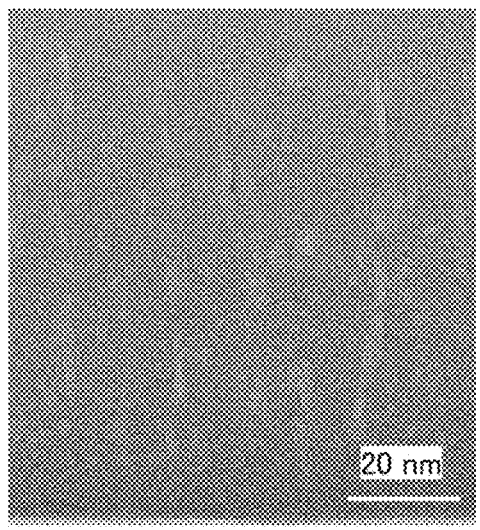

FIGS. 48A and 48B are high-resolution cross-sectional TEM images of an a-like OS. FIG. 48A is the high-resolution cross-sectional TEM image of the a-like OS at the start of the electron irradiation. FIG. 48B is the high-resolution cross-sectional TEM image of a-like OS after the electron ($e^-$) irradiation at $4.3 \times 10^8$ $e^-/nm^2$. FIGS. 48A and 48B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 49:
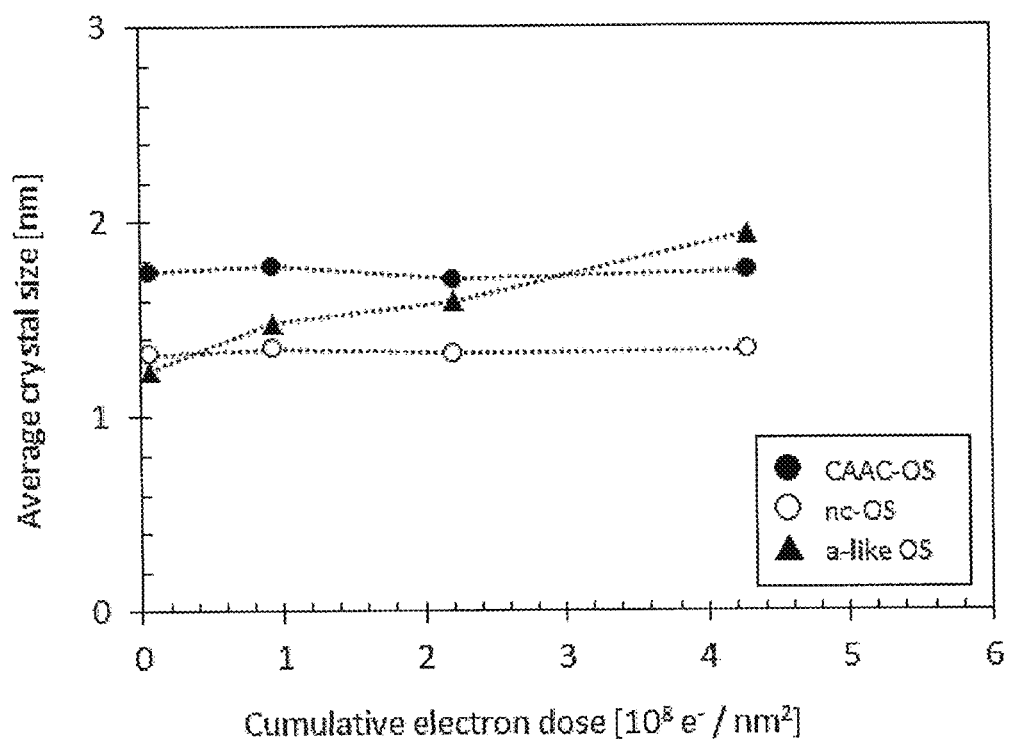
FIG. 49 shows a change in crystal part of an In—Ga—Zn oxide induced by electron irradiation.

FIG. 49 shows change in the average size of crystal parts (at 22 points to 30 points) in each sample. Note that the crystal part size corresponds to the length of a lattice fringe. FIG. 49 indicates that the crystal part size in the a-like OS increases with an increase in the cumulative electron dose in obtaining TEM images, for example. As shown in FIG. 49, a crystal part of approximately 1.2 nm (also referred to as an initial nucleus) at the start of TEM observation grows to a size of approximately 1.9 nm at a cumulative electron ($e^-$) dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. As shown in FIG. 49, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ $e^-/(nm^2 \cdot s)$; and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

<Method for Manufacturing Semiconductor Device>

A method for manufacturing a semiconductor device that includes a transistor and a capacitor according to one embodiment of the present invention is described below.

First, a substrate 500 is prepared.

Next, a conductor is formed. Next, an etching mask is formed over the conductor. Next, a part of the conductor is etched with use of the etching mask as a mask, whereby a conductor 504 and a conductor 505 are formed. Note that the semiconductor device of one embodiment of the present invention does not necessarily include the conductor 504 and the conductor 505 in some cases. In that case, this process can be omitted.

Figure 14A:
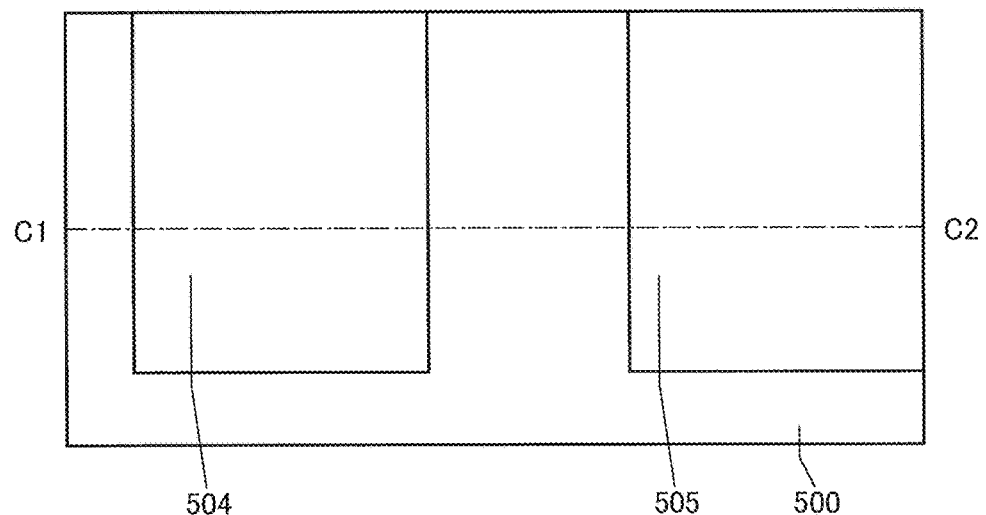
FIGS. 14A and 14B are a top view and a cross-sectional view illustrating a method for manufacturing a semiconductor device according to one embodiment of the present invention.
Figure 14B:
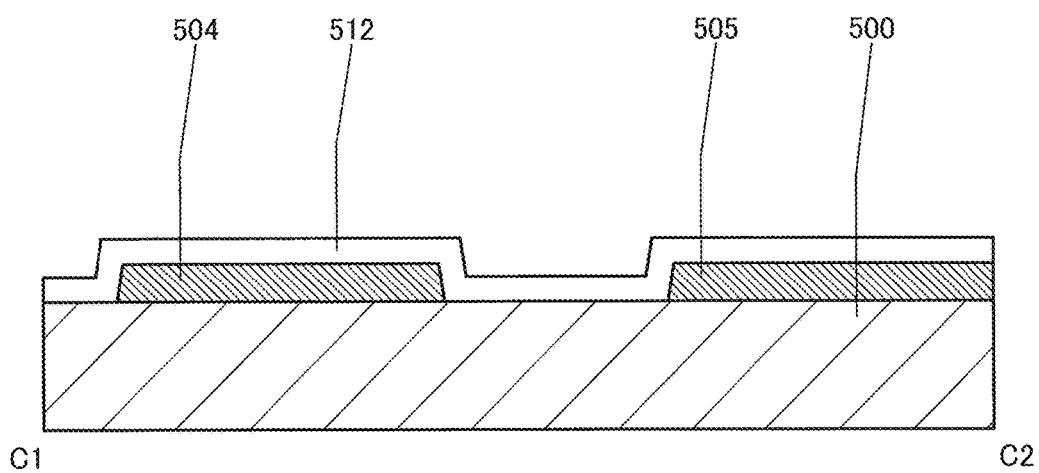

Next, an insulator 512 is formed (see FIGS. 14A and 14B).

Figure 15A:
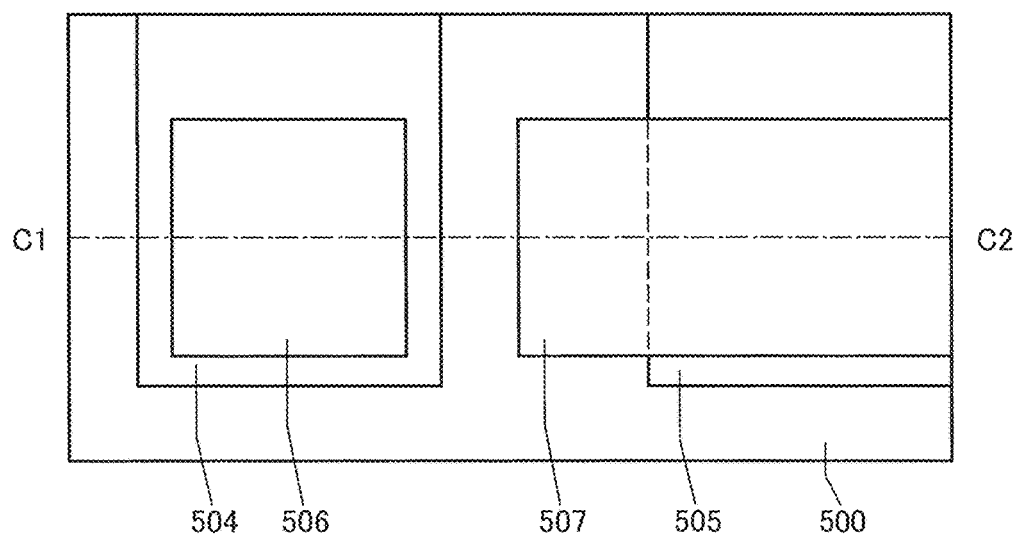
FIGS. 15A and 15B are a top view and a cross-sectional view illustrating a method for manufacturing a semiconductor device according to one embodiment of the present invention.
Figure 15B:
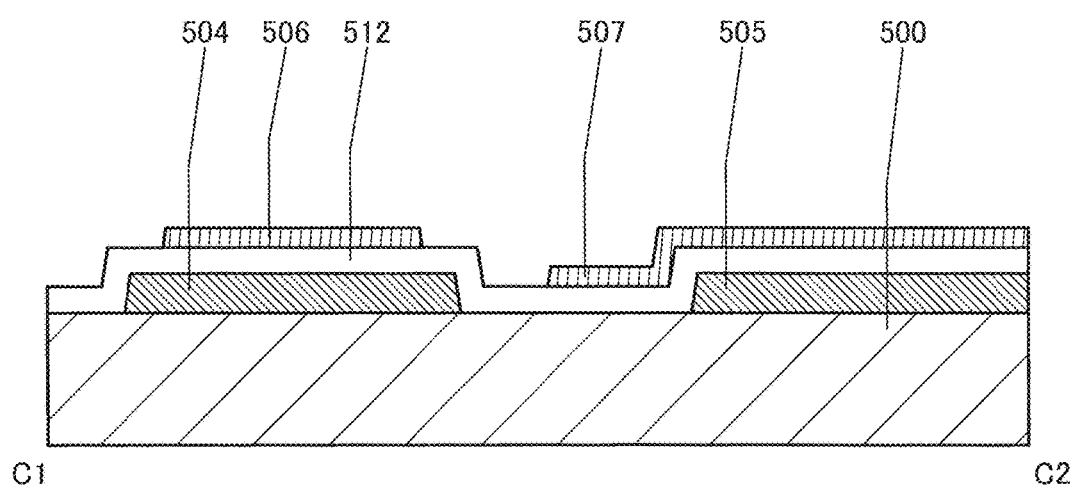

Next, an oxide semiconductor is formed. Next, an etching mask is formed over the oxide semiconductor. Then, a part of the oxide semiconductor is etched with use of the etching mask as a mask, whereby an oxide semiconductor 506 and an oxide semiconductor 507 are formed (see FIGS. 15A and 15B).

Next, first heat treatment is preferably performed. For the first heat treatment, the description of the above is referred to.

Figure 16A:
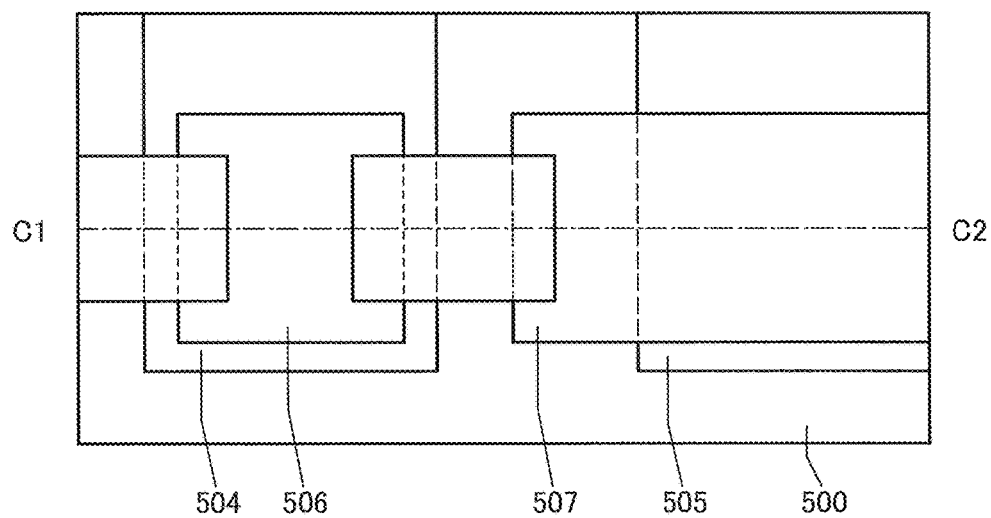
FIGS. 16A and 16B are a top view and a cross-sectional view illustrating a method for manufacturing a semiconductor device according to one embodiment of the present invention.
Figure 16B:
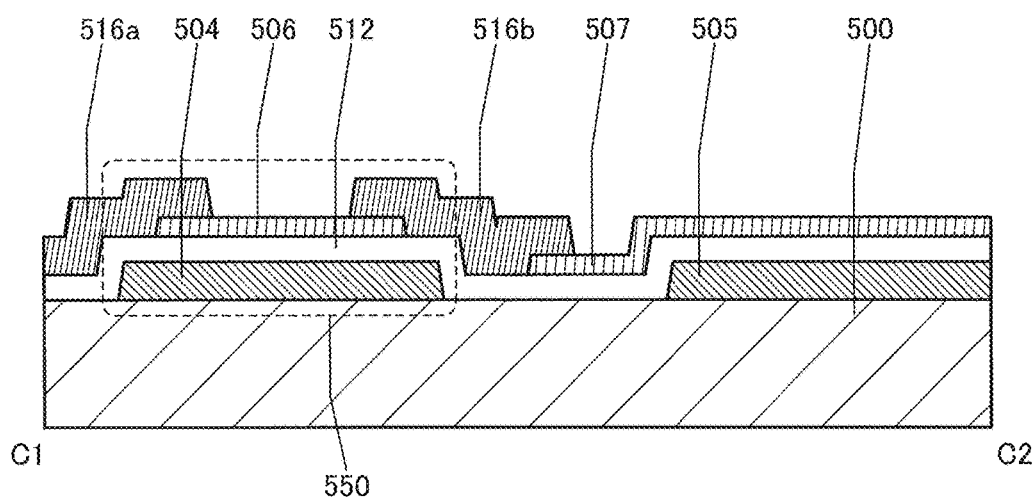

Next, a conductor is formed. Next, an etching mask is formed over the conductor. Then, a part of the conductor is etched with use of the etching mask as a mask, whereby a conductor 516a and a conductor 516b are formed (see FIGS. 16A and 16B). The conductor 516a is electrically isolated from the conductor 516b. In FIGS. 16A and 16B, an example where the oxide semiconductor 506 is electrically connected to the oxide semiconductor 507 through the conductor 516b is shown. Note that the structure of the semiconductor device of one embodiment of the present invention is not limited to that shown in FIGS. 16A and 16B. For example, the semiconductor device does not necessarily include the conductor 516a and the conductor 516b. In that case, this process can be omitted. Further, the oxide semiconductor 506 and the oxide semiconductor 507 may be one continuous oxide semiconductor, for example.

In FIGS. 16A and 16B, the conductor 504 functions as a gate electrode of the transistor. The insulator 512 functions as a gate insulator of the transistor. The oxide semiconductor 506 functions as a channel formation region of the transistor. The conductor 516a and the conductor 516b function as a source electrode and a drain electrode of the transistor. That is, a transistor 550 can be manufactured through the steps up to the step shown in FIGS. 16A and 16B.

Figure 17A:
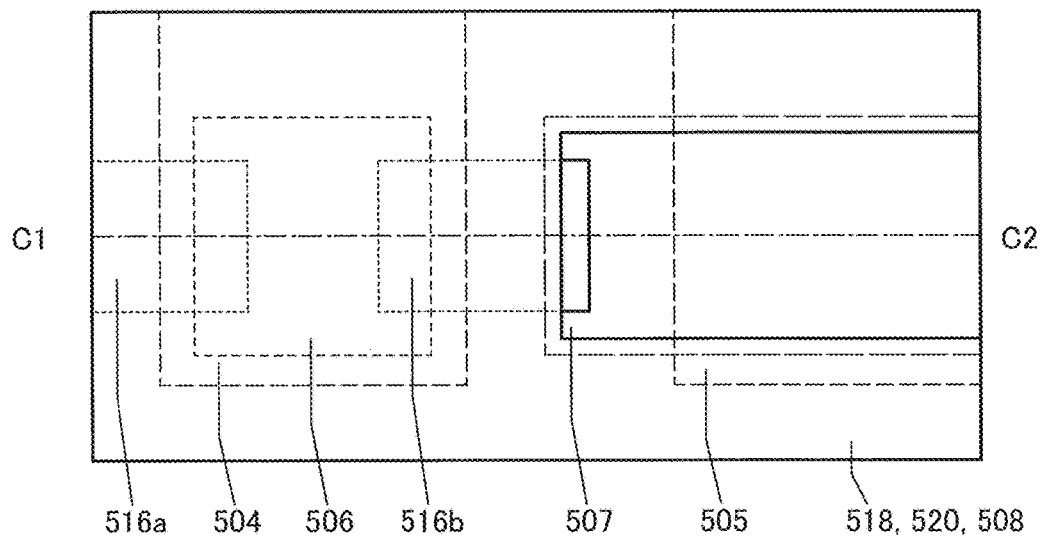
FIGS. 17A and 17B are a top view and a cross-sectional view illustrating a method for manufacturing a semiconductor device according to one embodiment of the present invention.
Figure 17B:
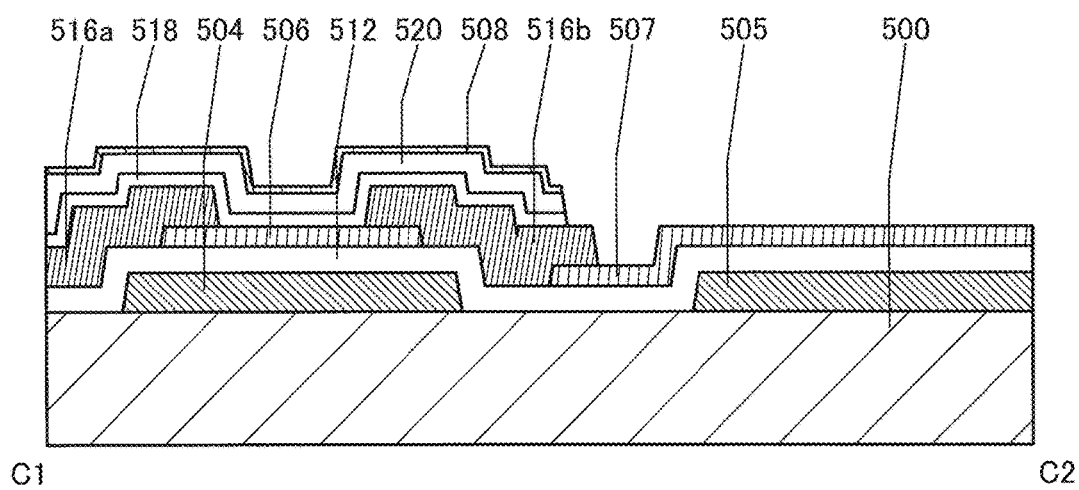

Next, an insulator to be an insulator 518 is formed. Next, an insulator to be an insulator 520 is formed. Next, a protective layer to be a protective layer 508 is formed. Next, an etching mask is formed over the protective layer to be the protective layer 508. Then, parts of the protective layer to be the protective layer 508, the insulator to be the insulator 520, and the insulator to be the insulator 518 are etched with use of the etching mask as a mask, whereby the protective layer 508, the insulator 520, and the insulator 518 are formed (see FIGS. 17A and 17B). Note that the insulator 518, the insulator 520, and the protective layer 508 may be formed to cover the channel formation region of the transistor 550. Furthermore, the insulator 518, the insulator 520, and the protective layer 508 may be formed to expose at least a part of the oxide semiconductor 507. The protective layer 508 has a function of blocking hydrogen. Moreover, the protective layer 508 preferably has a function of blocking oxygen.

The insulator 520 is preferably an insulator containing excess oxygen. The excess oxygen can be moved to the oxide semiconductor 506 through the insulator 518. As a result, oxygen vacancies in the oxide semiconductor 506 can be reduced. At this time, outward diffusion of excess oxygen can be inhibited because the protective layer 508 blocks oxygen. The insulator 518 is preferably an insulator having a low density of defect states. By using the insulator having a low density of defect states as the insulator 518, the interface state density at the interface between the oxide semiconductor 506 and the insulator 518 can be decreased. When the insulator having a low density of defect states is used as the insulator 518, the insulator can reduce the influence even if the insulator 520 has defect states. Note that the insulator 518 and/or the insulator 520 are not necessarily formed. In that case, this process can be omitted.

Figure 18A:
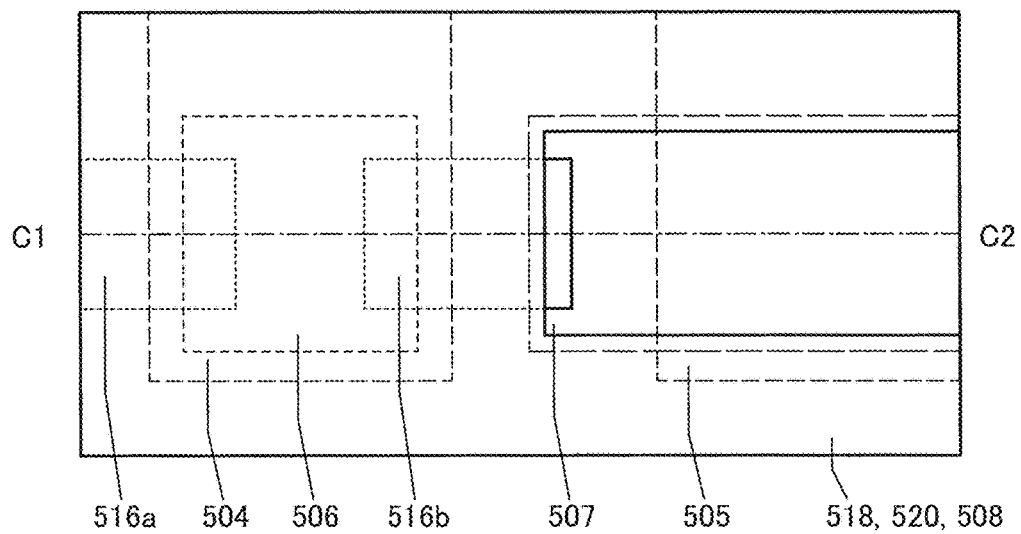
FIGS. 18A and 18B are a top view and a cross-sectional view illustrating a method for manufacturing a semiconductor device according to one embodiment of the present invention.
Figure 18B:
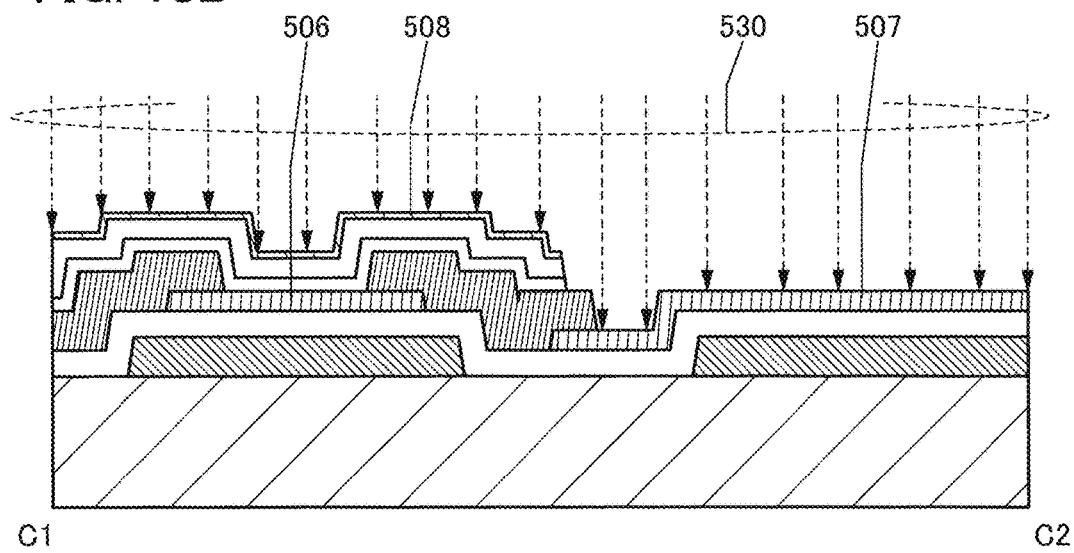

Next, it is preferable to add ions 530 (see FIGS. 18A and 18B). For the addition method of the ions 530, the description of the ions 430 is referred to. The addition method is performed under the condition where the ions 530 are added to the oxide semiconductor 507, not the oxide semiconductor 506. Note that the ions 530 are not necessarily added. Defects in the oxide semiconductor 507 are formed by adding the ions 530.

Figure 19A:
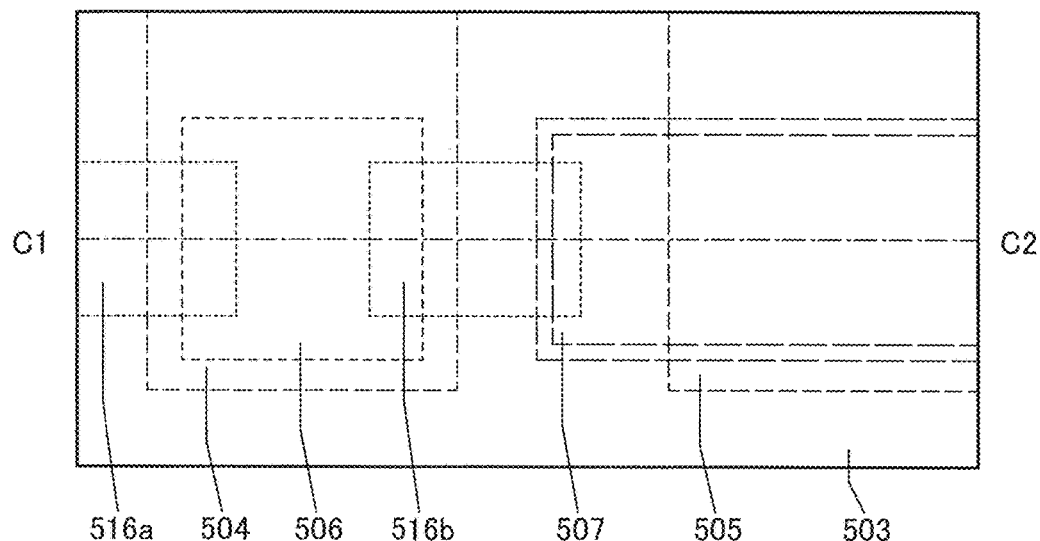
FIGS. 19A and 19B are a top view and a cross-sectional view illustrating a method for manufacturing a semiconductor device according to one embodiment of the present invention.
Figure 19B:
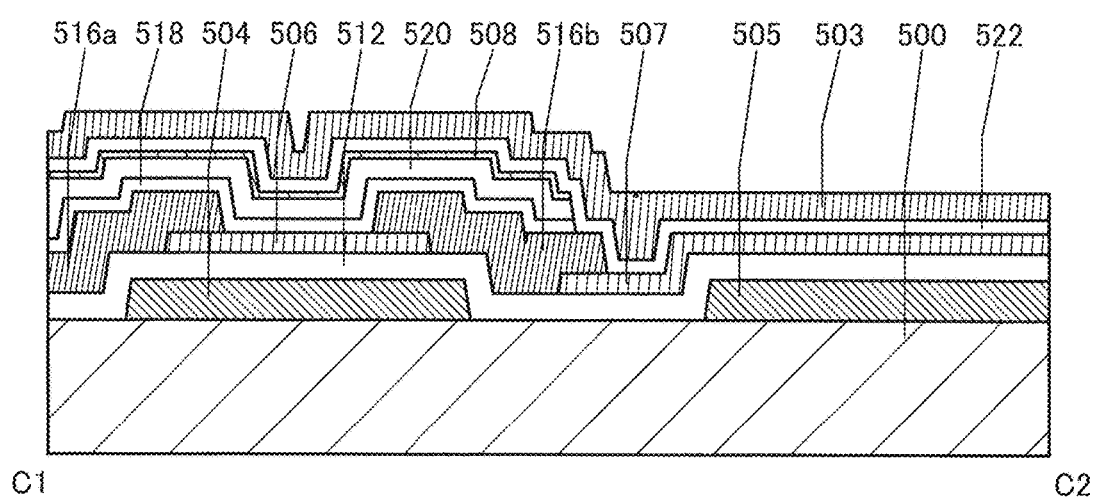

Next, an insulator 522 having a hydrogen-transmitting property is formed. Next, a hydrogen-containing layer 503 having excess hydrogen is formed (see FIGS. 19A and 19B).

Figure 20A:
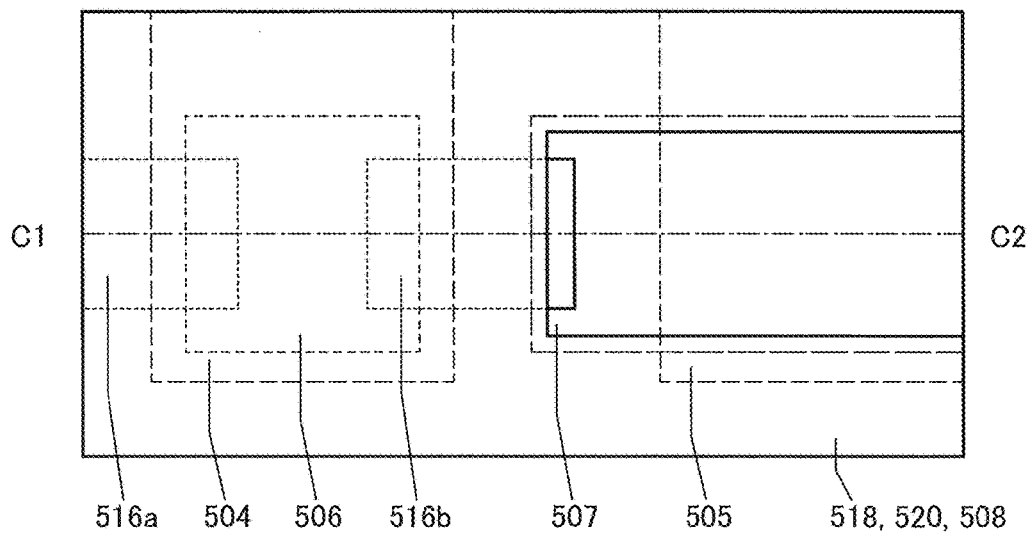
FIGS. 20A and 20B are a top view and a cross-sectional view illustrating a method for manufacturing a semiconductor device according to one embodiment of the present invention.
Figure 20B:
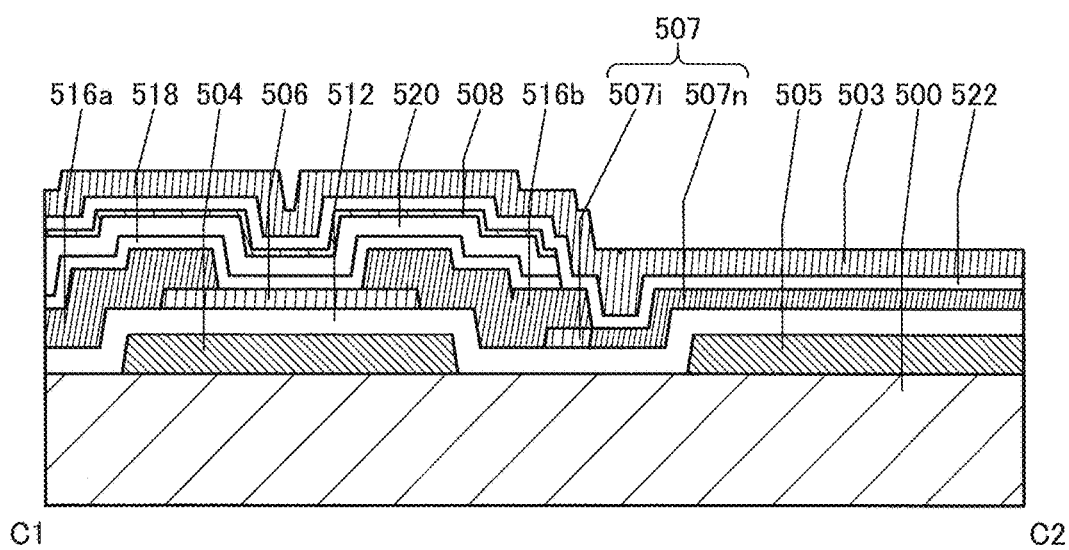

Next, heat treatment is performed. As for the condition of the heat treatment, the above description of the first heat treatment conditions may be referred to. For example, the heat treatment is performed at a temperature of higher than or equal to 150° C. and lower than or equal to 250° C. in an inert gas atmosphere. By the heat treatment, excess hydrogen in the hydrogen-containing layer 503 can be diffused into the insulator 522 and moved to the oxide semiconductor 507. Because of the influence of the conductor 516b and the like, a region 507n that contains hydrogen and a region 507i that does not contain hydrogen are formed in the oxide semiconductor 507 (see FIGS. 20A and 20B). Since the resistance of the region 507n is reduced by containing hydrogen, the region 507n has conductivity. On the other hand, the region 507i remains as the oxide semiconductor.

Hydrogen does not enter the oxide semiconductor 506 because the protective layer 508 is provided between the oxide semiconductor 506 and the hydrogen-containing layer 503.

Next, the hydrogen-containing layer 503 is removed.

Next, a conductor is formed. Next, an etching mask is formed over the conductor. Then, a part of the conductor is etched with use of the etching mask as a mask, whereby the conductor 513 and the conductor 514 are formed. Thus, the transistor 550 and a capacitor 560 are manufactured (see FIGS. 21A and 21B). The conductor 513 includes a region overlapping with the oxide semiconductor 506. The conductor 514 includes a region overlapping with the region 507n.

The conductor 504 functions as a first gate electrode of the transistor 550. The insulator 512 functions as a first gate insulator of the transistor 550. The oxide semiconductor 506 functions as a channel formation region of the transistor 550. The conductor 516a and the conductor 516b function as a source electrode and a drain electrode of the transistor 550. The conductor 513 functions as a second gate electrode of the transistor 550. The insulator 518, the insulator 520, the protective layer 508, and the insulator 522 function as a second gate insulator of the transistor 550. Note that the function of the first gate electrode and the function of the second gate electrode may be exchanged. Alternatively, either one of the electrodes may be used to control the threshold voltage of the transistor.

The conductor 505 functions as one electrode of the capacitor 560. The insulator 512 functions as a dielectric of the capacitor 560. The region 507n functions as the other electrode of the capacitor 560. The insulator 522 functions as a dielectric of the capacitor 560. The conductor 514 functions as one electrode of the capacitor 560. Therefore, it is preferable that the conductor 505 and the conductor 514 be electrically connected.

Figure 22A:
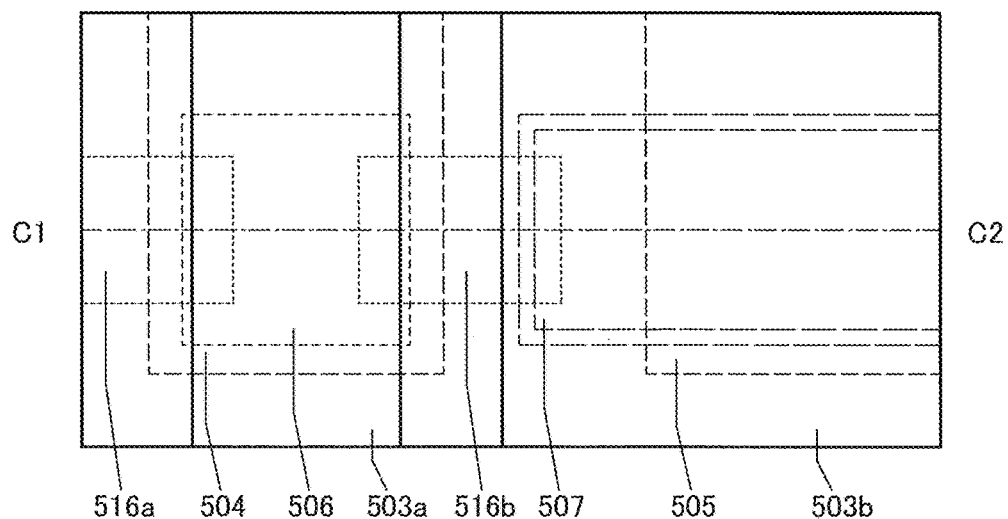
FIGS. 22A and 22B are a top view and a cross-sectional view illustrating a method for manufacturing a semiconductor device according to one embodiment of the present invention.
Figure 22B:
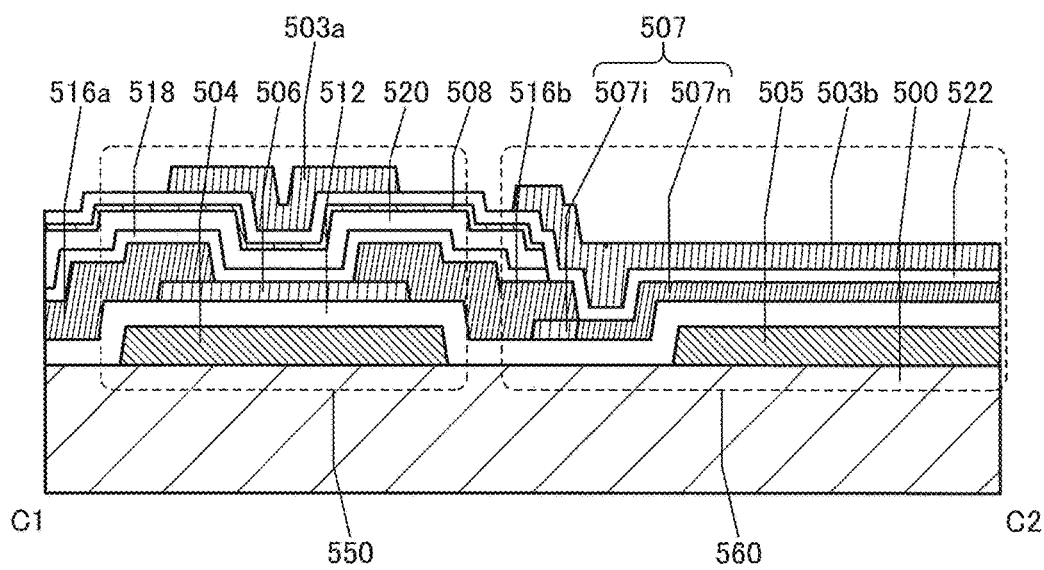

In the above step, the hydrogen-containing layer 503 is removed and the conductor 513 and the conductor 514 are separately formed; however, the hydrogen-containing layer 503 can be used. For example, the hydrogen-containing layer 503 is processed in a manner similar to that of the conductor 513 and the conductor 514; as a result, a conductor 503a and a conductor 503b may be formed (see FIGS. 22A and 22B). The conductor 503a and the conductor 503b can be used without change when the hydrogen-containing layer 503 has conductivity. Note that, in the case where the conductivity of the hydrogen-containing layer 503 is low, treatment which increases the conductivity of the hydrogen-containing layer 503 may be performed.

For example, when the hydrogen-containing layer 503 is amorphous silicon, microcrystalline silicon, polycrystalline silicon, or the like, the conductivity of the hydrogen-containing layer 503 can be increased by adding dopant including a Group 13 element or a Group 15 element. The hydrogen-containing layer 503 is processed to be used as the second gate electrode of the transistor 550 and the other electrode of the capacitor 560. Accordingly, a manufacturing process of the semiconductor device can be shortened. Thus, semiconductor devices can be manufactured with high productivity. Moreover, the yield of the semiconductor device can be improved.

<Photosensor>

As an example of the above semiconductor device, a structure including a photosensor will be described below.

Figure 23A:
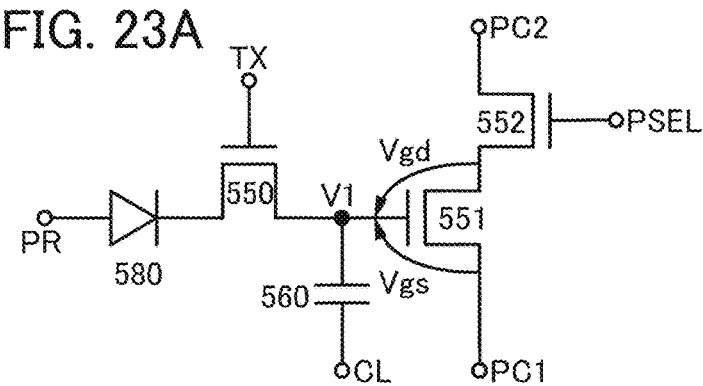
FIGS. 23A and 23B are a circuit diagram and a timing chart of a semiconductor device according to one embodiment of the present invention.

FIG. 23A is a circuit diagram illustrating a part of a semiconductor device including the photosensor. The photosensor includes the transistor 550, a transistor 551, a transistor 552, the capacitor 560, and a photodiode 580.

A first terminal of the photodiode 580 is electrically connected to a wiring PR. A second terminal of the photodiode 580 is electrically connected to a first terminal of the transistor 550. A gate terminal of the transistor 550 is electrically connected to a wiring TX. A second terminal of the transistor 550 is electrically connected to a node V1. One electrode of the capacitor 560 is electrically connected to the node V1. The other electrode of the capacitor 560 is electrically connected to a wiring CL. A first terminal of the transistor 551 is electrically connected to a wiring PC1. A gate terminal of the transistor 551 is electrically connected to the node V1. A second terminal of the transistor 551 is electrically connected to a first terminal of the transistor 552. A gate terminal of the transistor 552 is electrically connected to a wiring PSEL. A second terminal of the transistor 552 is electrically connected to a wiring PC2.

Figure 23B:
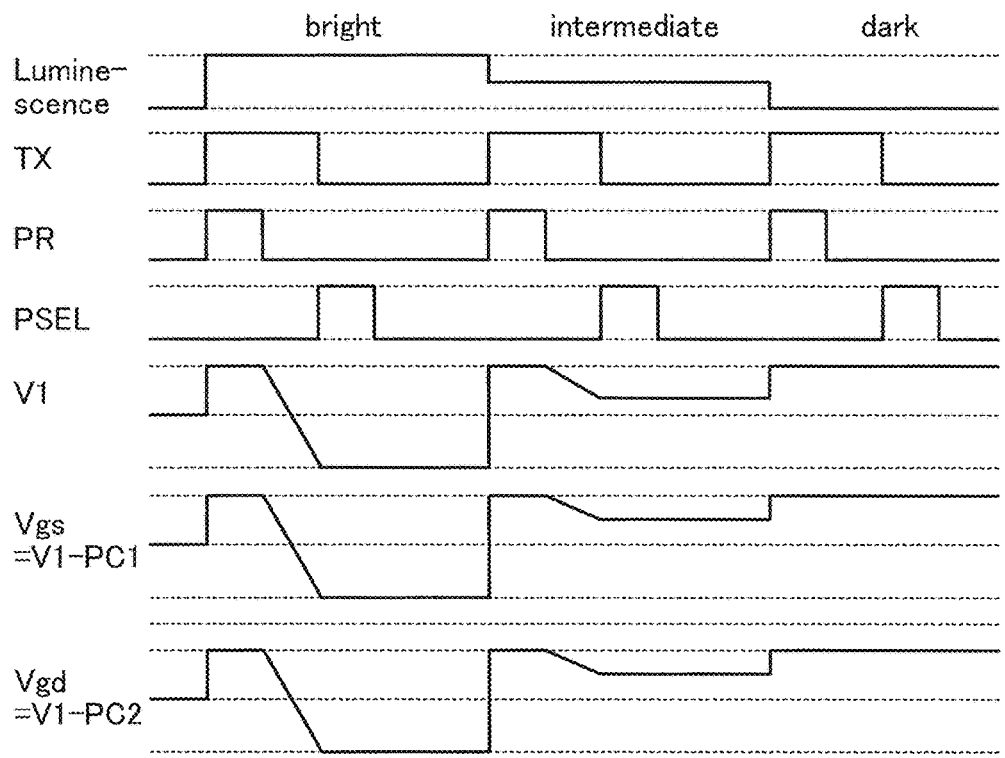

FIG. 23B illustrates an example of a timing chart of the operation of the photosensor when the photosensor is set in a bright environment (referred to as bright), a dark environment (referred to as dark), and the environment of intermediate brightness (referred to as intermediate). Although a vertical axis indicates voltage and a horizontal axis indicates time, a reduction scale is not exactly correct in some cases.

Figure 24:
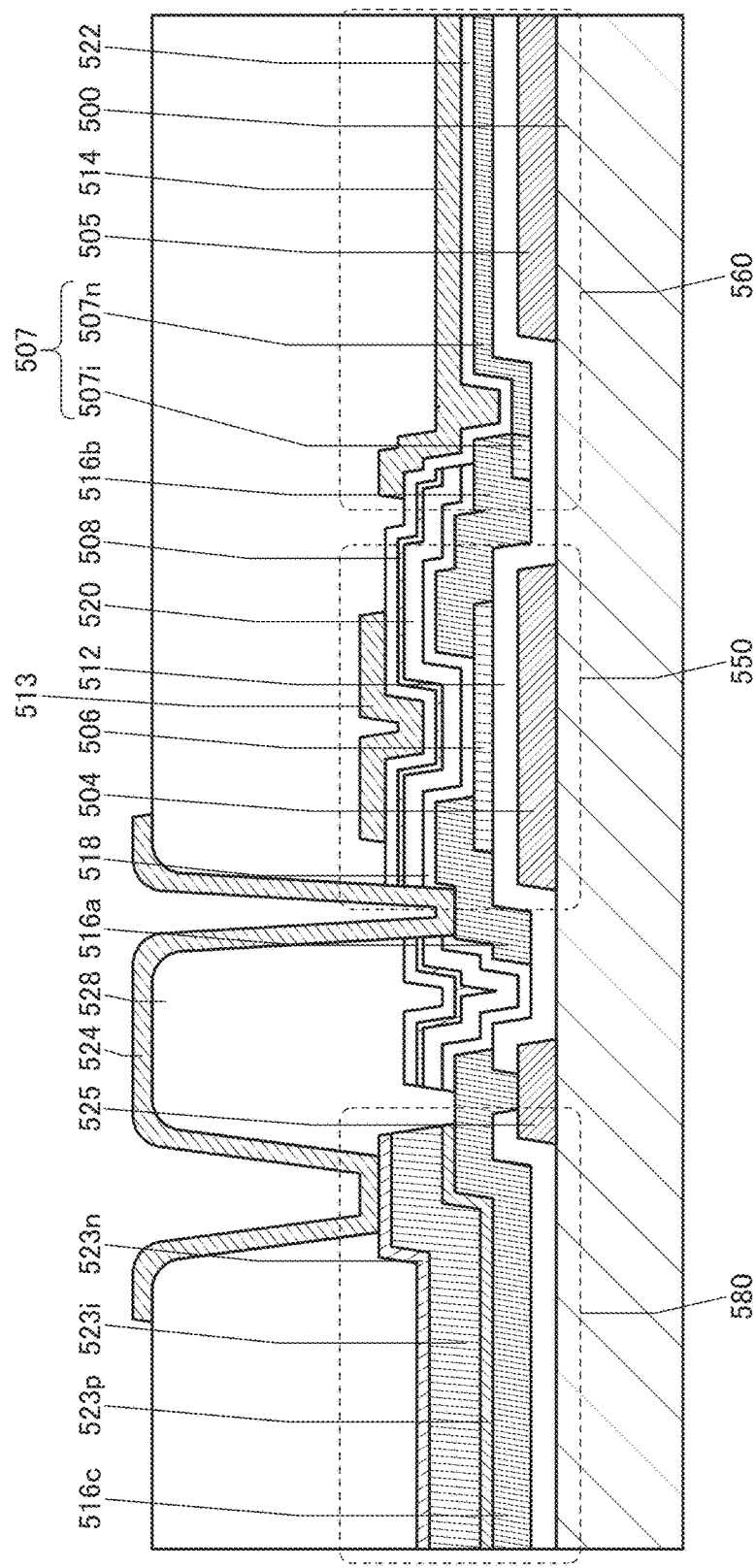
FIG. 24 is a cross-sectional view of a semiconductor device according to one embodiment of the present invention.

FIG. 24 is an example of a cross-sectional view of the semiconductor device including the photosensor. For the transistor 550 and the capacitor 560, the description of the semiconductor device in FIGS. 21A and 21B is referred to.

Figure 21A:
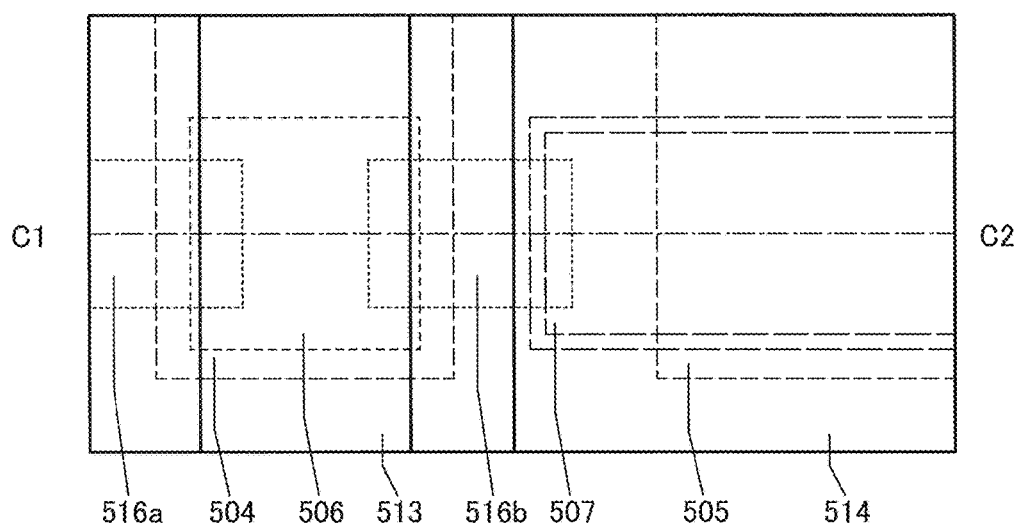
FIGS. 21A and 21B are a top view and a cross-sectional view illustrating a method for manufacturing a semiconductor device according to one embodiment of the present invention.
Figure 21B:
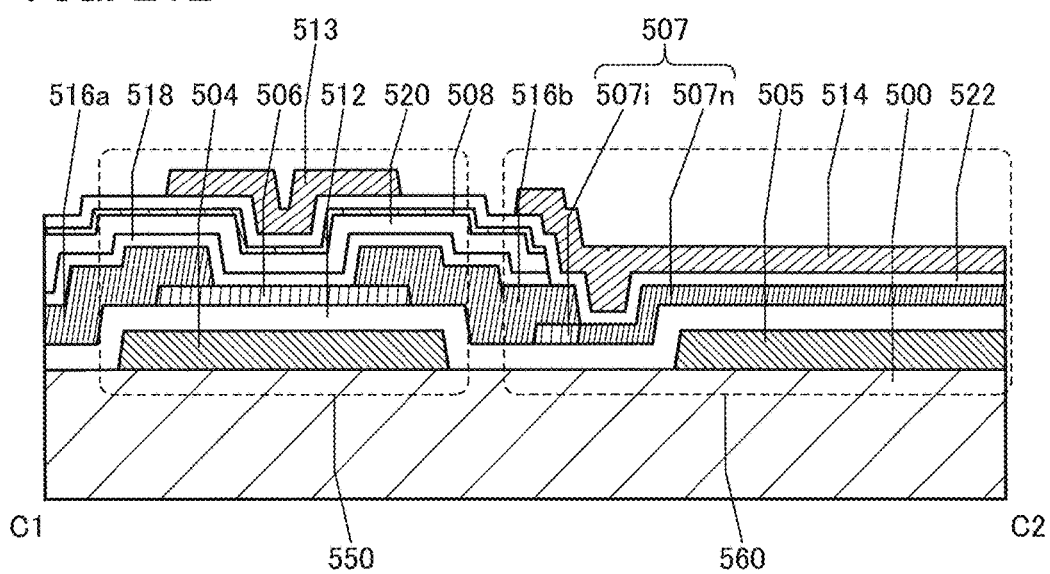

The semiconductor device in FIG. 24 includes the photodiode 580 in addition to the semiconductor device in FIGS. 21A and 21B. The photodiode 580 includes a conductor 525, a conductor 516c, a conductor 524, a layer 523p, a layer 523i, and a layer 523n.

The conductor 525 can be formed through the same step as that of forming the conductor 504 and the conductor 505. Note that the conductor 525 may be formed through a step different from that of forming the conductor 504 and the conductor 505.

The conductor 516c can be formed through the same step as that of forming the conductor 516a and the conductor 516b. Note that the conductor 516c may be formed through a step different from that of forming the conductor 516a and the conductor 516b. The conductor 516c is electrically connected to the conductor 525 through the opening of the insulator 512.

For example, a p-type semiconductor may be used for the layer 523p. For example, an i-type semiconductor may be used for the layer 523i. For example, an n-type semiconductor may be used for the layer 523n. Note that an n-type semiconductor may be used for the layer 523p. An n-type semiconductor or a p-type semiconductor may be used for the layer 523i. Further, a p-type semiconductor may be used for the layer 523n. In addition, the photodiode 580 does not necessarily include the layer 523p, the layer 523i, and the layer 523n.

One or more of the layer 523p, the layer 523i, and the layer 523n preferably function as a hydrogen-containing layer. When one or more of the layer 523p, the layer 523i, and the layer 523n function as the hydrogen-containing layer, the region 507n having conductivity can be formed in the oxide semiconductor 507 without greatly increasing the number of steps.

For the layer 523p, the layer 523i, and the layer 523n, for example, amorphous silicon, microcrystalline silicon, or polycrystalline silicon is preferably used. In particular, amorphous silicon is preferable because of high hydrogen concentration and a large amount of released hydrogen. Note that an elemental semiconductor other than silicon, an oxide semiconductor, or a nitride semiconductor may be used for the layer 523p, the layer 523i, and the layer 523n. Furthermore, an organic semiconductor may be used for the layer 523p, the layer 523i, and the layer 523n. For the layer 523p, the layer 523i, and the layer 523n, for example, a semiconductor including one or more selected from indium, tin, zinc, gallium, aluminum, fluorine, boron, titanium, nitrogen, oxygen, silicon, phosphorus, selenium, germanium, nickel, and tungsten may be used. Specifically, selenium (amorphous selenium or crystalline selenium), tin oxide, gallium nitride, zinc oxide, an In—Sn oxide, an In—Sn—Si oxide, an In—Ga—Zn oxide, an In—Zn oxide, an Al—Zn oxide, a Ga—Zn oxide, or the like may be used.

The conductor 524 includes a region in contact with the layer 523n.

Here, the conductor 525 shown in FIG. 24 corresponds to the wiring PR shown in FIGS. 23A and 23B. Similarly, the conductor 516c corresponds to the first terminal of the photodiode 580. The layer 523p, the layer 523i, and the layer 523n correspond to a photoelectric conversion layer of the photodiode 580. The conductor 524 corresponds to the second terminal of the photodiode 580.

Accordingly, when light enters the layer 523p, the layer 523i, and the layer 523n, current corresponding to the amount of incident light flows to the layers which are between the conductor 516c and the conductor 524.

An insulator 528 is formed over the transistor 550, the capacitor 560, and the photodiode 580. The insulator 528 includes an opening reaching the layer 523n and an opening reaching the conductor 516a. The conductor 524 is also formed over the insulator 528 and is electrically connected to the transistor 550 and the photodiode 580 though the above openings.

The insulator 528 preferably includes silicon oxide, silicon oxynitride, silicon nitride oxide, silicon nitride, resin, or the like. Examples of the resin include polyester, polyolefin, polyamide (e.g., nylon or aramid), polyimide, polycarbonate, and acrylic.

The conductor 524 preferably has a light-transmitting property. As the conductor having a light-transmitting property, for example, a conductor including one or more selected from indium, tin, zinc, gallium, aluminum, fluorine, boron, titanium, nitrogen, oxygen, silicon, phosphorus, nickel, and tungsten may be used. Specifically, tin oxide, an In—Sn oxide, an In—Sn—Si oxide, an In—Ga—Zn oxide, an In—Zn oxide, an Al—Zn oxide, or a Ga—Zn oxide may be used.

In the above manner, a photodiode, a transistor, and a capacitor of the photosensor of one embodiment of the present invention can be manufactured through the common steps. Thus, the photosensor can be manufactured with high productivity. In addition, the photosensor can be manufactured with high yield.

<Circuit>

An example of a circuit of a semiconductor device according to one embodiment of the present invention is described below.

<CMOS Inverter>

Figure 25A:
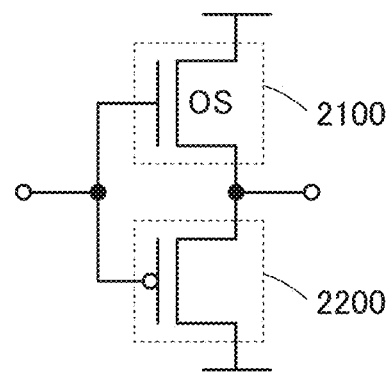
FIGS. 25A and 25B are circuit diagrams each illustrating a semiconductor device according to one embodiment of the present invention.

A circuit diagram in FIG. 25A shows a configuration of what is called a CMOS inverter in which a p-channel transistor 2200 and an n-channel transistor 2100 are connected to each other in series and in which gates of them are connected to each other.

The transistor 2200 is a transistor including a semiconductor substrate. For the semiconductor substrate, a single material semiconductor substrate made of silicon, germanium, or the like or a compound semiconductor substrate made of silicon carbide, silicon germanium, gallium arsenide, indium phosphide, zinc oxide, gallium oxide, or the like may be used, for example. A single crystal silicon substrate is preferably used as the semiconductor substrate.

For the semiconductor substrate, a semiconductor substrate including impurities imparting n-type conductivity is used. However, a semiconductor substrate including impurities imparting p-type conductivity may be used as the semiconductor substrate. In that case, a well including impurities imparting the n-type conductivity may be provided in a region where the transistor 2200 is formed. Alternatively, the semiconductor substrate may be an i-type semiconductor substrate.

The top surface of the semiconductor substrate preferably has a (110) plane. Thus, on-state characteristics of the transistor 2200 can be improved.

For example, the transistor 2100 is a transistor using an oxide semiconductor. For the transistor using the oxide semiconductor, the above description is referred to.

The transistor 2100 can be placed over the transistor 2200. The transistor 2100 and the transistor 2200 are arranged to include a region where the transistor 2100 and the transistor 2200 overlap with each other, whereby the area of the semiconductor device can be reduced. Therefore, a highly integrated semiconductor device can be provided.

<CMOS Analog Switch>

Figure 25B:
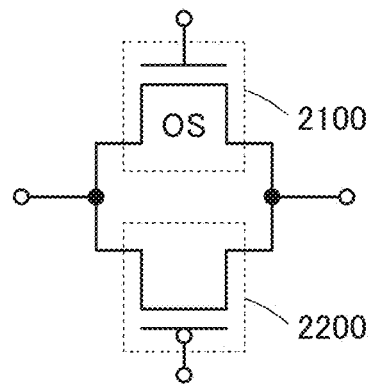

A circuit diagram in FIG. 25B shows a configuration in which sources of the transistors 2100 and 2200 are connected to each other and drains of the transistors 2100 and 2200 are connected to each other. With such a configuration, the transistors can function as what is called a CMOS analog switch.

<Memory Device 1>

Figure 26A:
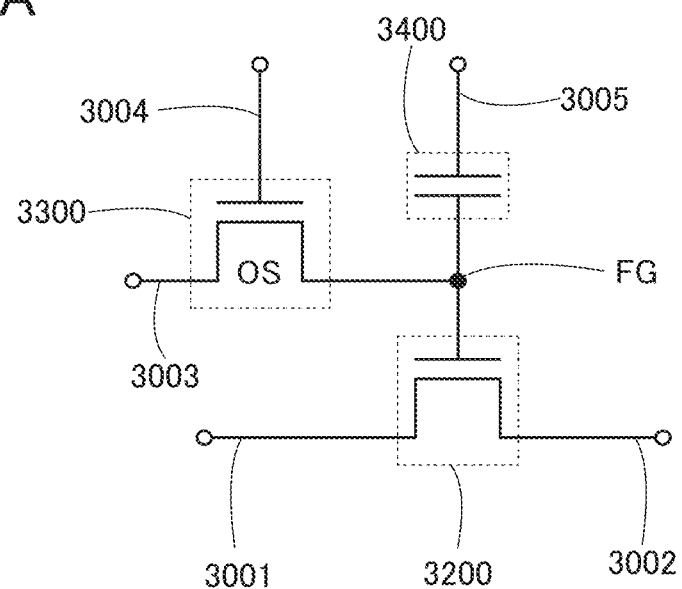
FIGS. 26A and 26B are circuit diagrams each illustrating a memory device according to one embodiment of the present invention.
Figure 26B:
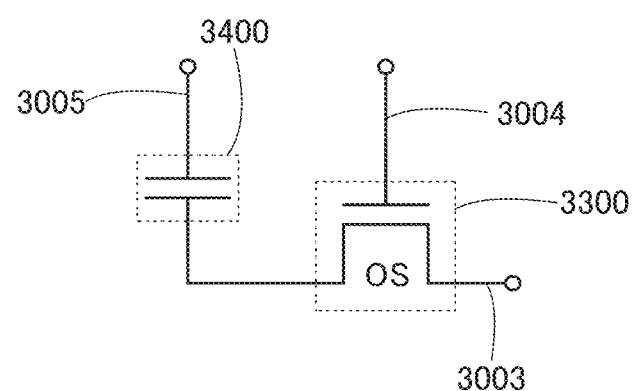

An example of a semiconductor device (memory device) which includes the transistor according to one embodiment of the present invention, which can retain stored data even when not powered, and which has an unlimited number of write cycles is shown in FIGS. 26A and 26B.

The semiconductor device illustrated in FIG. 26A includes a transistor 3200 using a first semiconductor, a transistor 3300 using a second semiconductor, and a capacitor 3400. Note that the above-described transistor can be used as the transistor 3300. In addition, the above-described capacitor can be used as the capacitor 3400.

Note that the transistor 3300 is preferably a transistor with a low off-state current. For example, a transistor including an oxide semiconductor can be used as the transistor 3300. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 26A, a first wiring 3001 is electrically connected to a source of the transistor 3200. A second wiring 3002 is electrically connected to a drain of the transistor 3200. A third wiring 3003 is electrically connected to one of a source and a drain of the transistor 3300. A fourth wiring 3004 is electrically connected to a gate of the transistor 3300. A gate of the transistor 3200 and the other of the source and the drain of the transistor 3300 are electrically connected to one electrode of the capacitor 3400. A fifth wiring 3005 is electrically connected to the other electrode of the capacitor 3400.

The semiconductor device in FIG. 26A has a feature that the potential of the gate of the transistor 3200 can be retained, and thus enables writing, retaining, and reading of data as follows.

Writing and retaining of data are described. First, the potential of the fourth wiring 3004 is set to a potential at which the transistor 3300 is on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined electric charge is supplied to the gate of the transistor 3200 (writing). Here, one of two kinds of electric charges providing different potential levels (hereinafter referred to as a low-level electric charge and a high-level electric charge) is supplied. After that, the potential of the fourth wiring 3004 is set to a potential at which the transistor 3300 is off, so that the transistor 3300 is turned off. Thus, the electric charge is held at the node FG (retaining).

Since the off-state current of the transistor 3300 is low, the electric charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of electric charge retained in the node FG. This is because in the case of using an n-channel transistor as the transistor 3200, an apparent threshold voltage $V_{th\_H}$ at the time when the high-level electric charge is given to the gate of the transistor 3200 is lower than an apparent threshold voltage $V_{th\_L}$ at the time when the low-level electric charge is given to the gate of the transistor 3200. Here, an apparent threshold voltage refers to the potential of the fifth wiring 3005 which is needed to make the transistor 3200 be in "on state." Thus, the potential of the fifth wiring 3005 is set to a potential $V_0$ which is between $V_{th\_H}$ and $V_{th\_L}$, whereby electric charge supplied to the node FG can be determined. For example, in the case where the high-level electric charge is supplied to the node FG in writing and the potential of the fifth wiring 3005 is $V_0$ ($>V_{th\_H}$), the transistor 3200 is in "on state." In the case where the low-level electric charge is supplied to the node FG in writing, even when the potential of the fifth wiring 3005 is $V_0$ ($<V_{th\_L}$), the transistor 3200 still remains in "off state." Thus, the data retained in the node FG can be read by determining the potential of the second wiring 3002.

Note that in the case where memory cells are arrayed, it is necessary that data of a desired memory cell be read in read operation. In the case where data of the other memory cells is not read, the fifth wiring 3005 may be supplied with a potential at which the transistor 3200 is in "off state" regardless of the charge supplied to the node FG, that is, a potential lower than $V_{th\_H}$. Alternatively, the fifth wiring 3005 may be supplied with a potential at which the transistor 3200 is in "on state" regardless of the charge supplied to the node FG, that is, a potential higher than $V_{th\_L}$.

<Memory Device 2>

The semiconductor device in FIG. 26B is different from the semiconductor device in FIG. 26A in that the transistor 3200 is not provided. Also in this case, writing and retaining operation of data can be performed in a manner similar to that of the semiconductor device in FIG. 26A.

Reading of data in the semiconductor device in FIG. 26B is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in potential of the third wiring 3003 varies depending on the potential of the one electrode of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor using an oxide semiconductor and having a low off-state current, the semiconductor device described above can retain stored data for a long time. In other words, refresh operation is unnecessary or the frequency of the refresh operation can be extremely low, which leads to a sufficient reduction in power consumption. Moreover, stored data can be retained for a long time even when power is not supplied (note that a potential is preferably fixed).

In the semiconductor device, high voltage is not needed for writing data and deterioration of elements is unlikely to occur. Unlike in a conventional nonvolatile memory, for example, it is not necessary to inject and extract electrons into and from a floating gate; thus, a problem such as deterioration of an insulator is not caused. That is, the semiconductor device according to one embodiment of the present invention does not have a limit on the number of times data can be rewritten, which is different from a conventional nonvolatile memory, and the reliability thereof is drastically improved. Furthermore, data is written depending on the state of the transistor (on or off), whereby high-speed operation can be easily achieved.

<FPGA>

One embodiment of the present invention can also be applied to an LSI such as a field programmable gate array (FPGA).

Figure 27A:
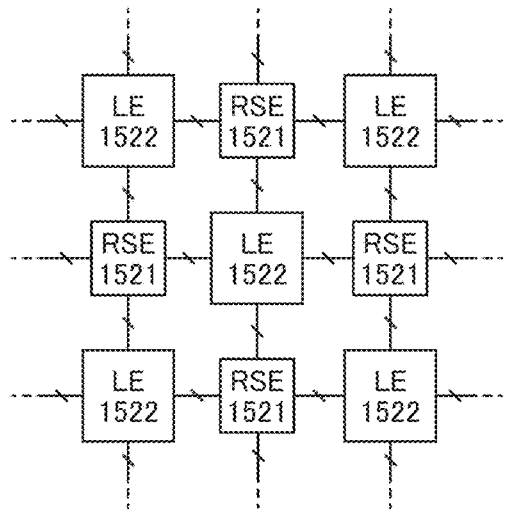
FIGS. 27A to 27E are circuit diagrams illustrating a semiconductor device according to one embodiment of the present invention.

FIG. 27A illustrates an example of a block diagram of an FPGA. The FPGA includes a routing switch element 1521 and a logic element 1522. The logic element 1522 can switch functions of a logic circuit, such as a function of a combination circuit or a function of a sequential circuit, in accordance with configuration data stored in a configuration memory.

Figure 27B:
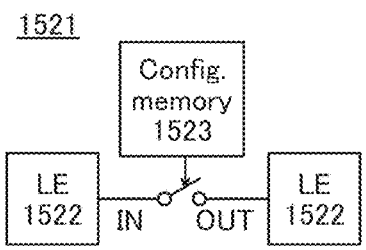

FIG. 27B is a schematic view illustrating a function of the routing switch element 1521. The routing switch element 1521 can switch a connection between the logic element 1522 in accordance with configuration data stored in a configuration memory 1523. Note that although FIG. 27B illustrates one switch which switches a connection between a terminal IN and a terminal OUT, in an actual FPGA, a plurality of switches are provided between a plurality of the logic elements 1522.

Figure 27C:
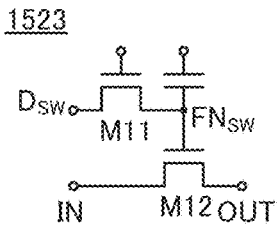

FIG. 27C illustrates a configuration example of a circuit serving as the configuration memory 1523. The configuration memory 1523 includes a transistor M11 that is a transistor including an oxide semiconductor and a transistor M12 that is a transistor including silicon. Configuration data $D_{SW}$ is supplied to a node $FN_{SW}$ through the transistor M11. A potential of the configuration data $D_{SW}$ can be retained by turning off the transistor M11. The on and off states of the transistor M12 can be switched depending on the potential of the retained configuration data $D_{SW}$, so that the connection between the terminal IN and the terminal OUT can be switched.

Figure 27D:
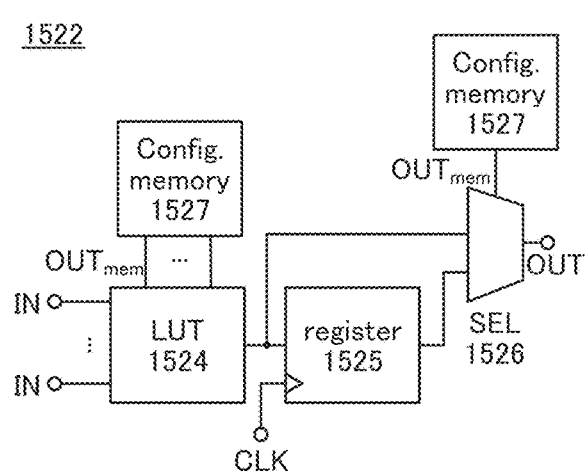

FIG. 27D is a schematic view illustrating a function of the logic element 1522. The logic element 1522 can switch a potential of a terminal OUT$_{mem}$ in accordance with configuration data stored in a configuration memory 1527. A lookup table 1524 can switch functions of a combination circuit that processes a signal of the terminal IN in accordance with the potential of the terminal OUT$_{mem}$. The logic element 1522 includes a register 1525 that is a sequential circuit and a selector 1526 that switches signals of the terminal OUT. The selector 1526 can select to output a signal of the lookup table 1524 or to output a signal of the register 1525 in accordance with the potential of the terminal OUT$_{mem}$, which is output from the configuration memory 1527.

Figure 27E:
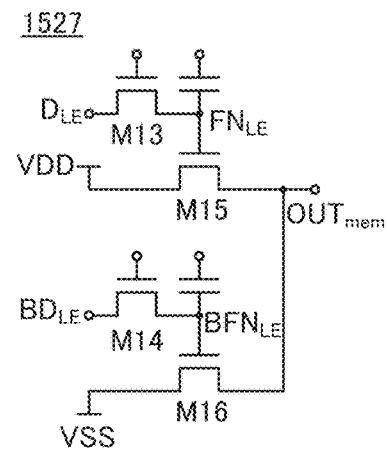

FIG. 27E illustrates a configuration example of a circuit serving as the configuration memory 1527. The configuration memory 1527 includes a transistor M13 and a transistor M14 that are transistors including an oxide semiconductor, and a transistor M15 and a transistor M16 that are transistors including silicon. Configuration data D$_{LE}$ is supplied to a node FN$_{LE}$ through the transistor M13. Configuration data BD$_{LE}$ is supplied to a node BFN$_{LE}$ through the transistor M14. The configuration data BD$_{LE}$ corresponds to a potential of the configuration data D$_{LE}$ whose logic is inverted. The potential of the configuration data D$_{LE}$ and the potential of the configuration data BD$_{LE}$ can be retained by turning off the transistor M13 and the transistor M14, respectively. The on and off states of one of the transistors M15 and M16 are switched in accordance with the retained potential of the configuration data D$_{LE}$ or the configuration data BD$_{LE}$, so that a potential VDD or a potential VSS can be supplied to the terminal OUT$_{mem}$.

For the configuration illustrated in FIGS. 27A to 27E, any of the above-described transistors, logic circuits, memory devices, and the like can be used. For example, transistors including silicon are used as the transistors M12, M15, and M16, and transistors including an oxide semiconductor are used as the transistors M11, M13, and M14. In that case, the transistors including silicon are formed over a silicon substrate and then, the transistors including an oxide semiconductor are formed over the transistors including silicon, in which case the chip size of the FPGA can be reduced. Furthermore, the combination of the low off-state current of the transistors including an oxide semiconductor and the high on-state current of the transistors including silicon enables the FPGA to have small power consumption and high operation speed.

<CPU>

A CPU including a semiconductor device such as any of the above-described transistors or the above-described memory device will be described below.

Figure 28:
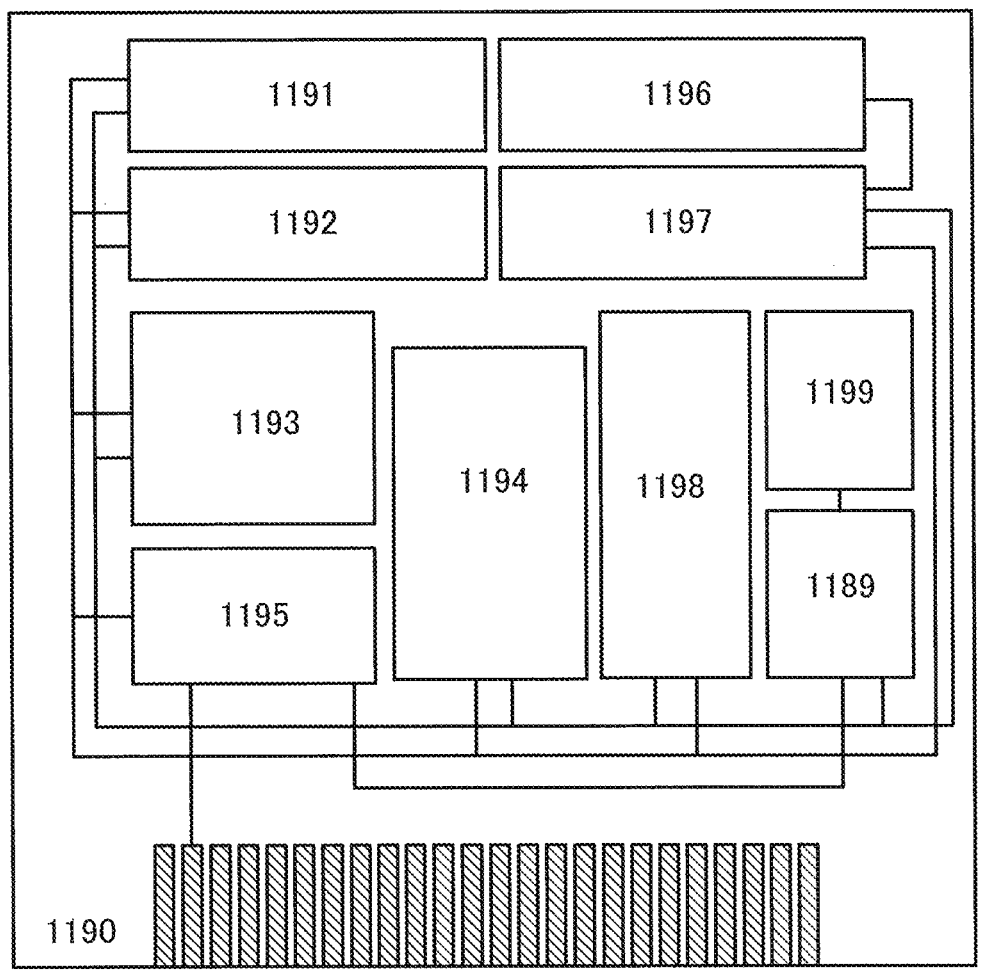
FIG. 28 is a block diagram illustrating a semiconductor device according to one embodiment of the present invention.

FIG. 28 is a block diagram illustrating a configuration example of a CPU including any of the above-described transistors as a component.

The CPU illustrated in FIG. 28 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and a ROM interface 1189. A semiconductor substrate, an SOI substrate, a glass substrate, or the like is used as the substrate 1190. The ROM 1199 and the ROM interface 1189 may be provided over a separate chip. Needless to say, the CPU in FIG. 28 is just an example in which the configuration has been simplified, and an actual CPU may have a variety of configurations depending on the application. For example, the CPU may have the following configuration: a structure including the CPU illustrated in FIG. 28 or an arithmetic circuit is considered as one core; a plurality of such cores is included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 28, a memory cell is provided in the register 1196. For the memory cell of the register 1196, any of the above-described transistors, the above-described memory device, or the like can be used.

In the CPU illustrated in FIG. 28, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retention by the flip-flop is selected, a power supply voltage is supplied to the memory cell in the register 1196. When data retention by the capacitor is selected, the data is rewritten in the capacitor, and supply of a power supply voltage to the memory cell in the register 1196 can be stopped.

Figure 29:
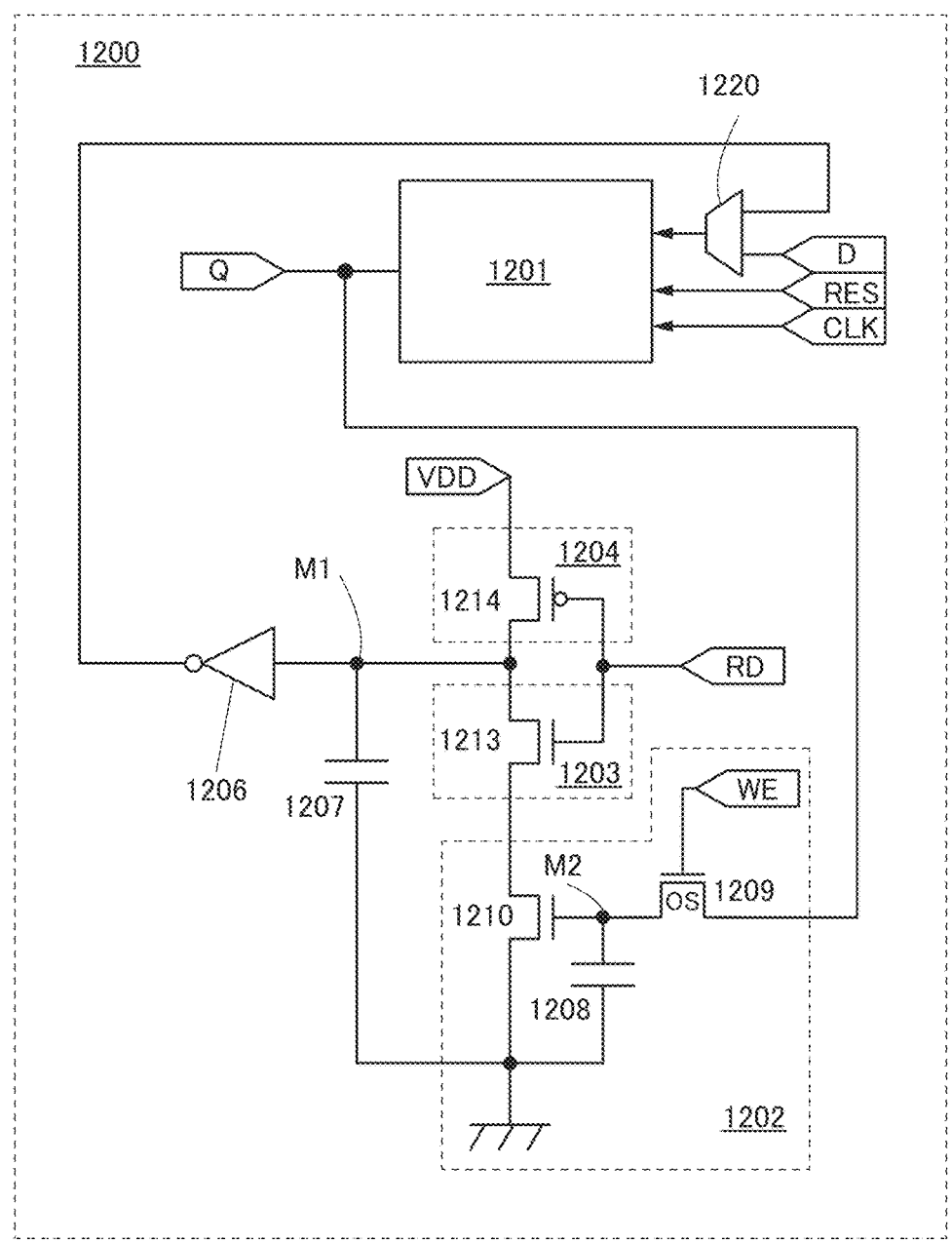
FIG. 29 is a circuit diagram illustrating a semiconductor device according to one embodiment of the present invention.

FIG. 29 is an example of a circuit diagram of a memory element 1200 that can be used as the register 1196. The memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with the low power supply potential (e.g., GND) or the high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 29 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 29, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 29, the transistors included in the memory element 1200 except the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor may be included besides the transistor 1209, and a transistor in which a channel is formed in a film formed using a semiconductor other than an oxide semiconductor or in the substrate 1190 can be used for the rest of the transistors.

As the circuit 1201 in FIG. 29, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the transistor 1210 is brought into the on state or the off state depending on the signal retained by the capacitor 1208, and a signal corresponding to the state can be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU, the memory element 1200 can also be used in an LSI such as a digital signal processor (DSP), a programmable logic device (PLD), or a custom LSI, and a radio frequency (RF) device.

<Display Device>

A display device according to one embodiment of the present invention is described below with reference to FIGS. 30A to 30C, FIGS. 31A and 31B, and FIG. 51.

Examples of a display element provided in the display device include a liquid crystal element (also referred to as a liquid crystal display element) and a light-emitting element (also referred to as a light-emitting display element). The light-emitting element includes, in its category, an element whose luminance is controlled by a current or voltage, and specifically includes, in its category, an inorganic electroluminescent (EL) element, an organic EL element, and the like. A display device including an EL element (EL display device) and a display device including a liquid crystal element (liquid crystal display device) are described below as examples of the display device.

Note that the display device described below includes in its category a panel in which a display element is sealed and a module in which an IC such as a controller is mounted on the panel.

The display device described below refers to an image display device or a light source (including a lighting device). The display device includes any of the following modules: a module provided with a connector such as an FPC or TCP; a module in which a printed wiring board is provided at the end of TCP; and a module in which an integrated circuit (IC) is mounted directly on a display element by a COG method.

Figure 30A:
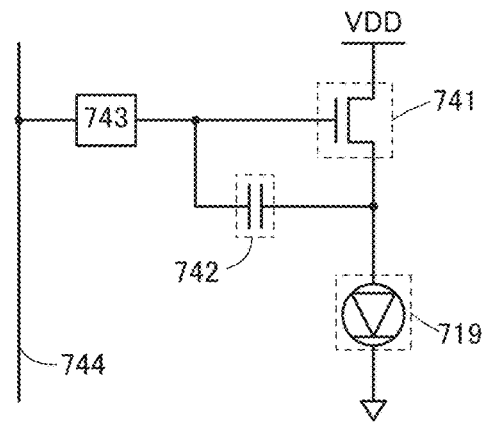
FIGS. 30A to 30C are a circuit diagram, a top view, and a cross-sectional view illustrating a semiconductor device according to one embodiment of the present invention.
Figure 30B:
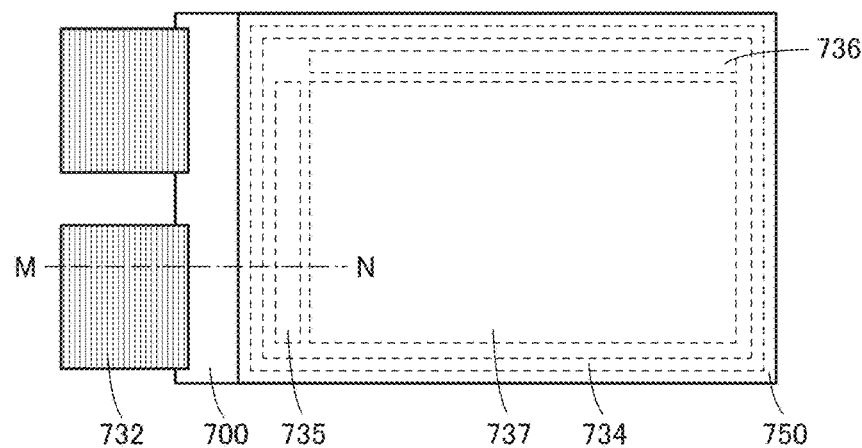
Figure 30C:
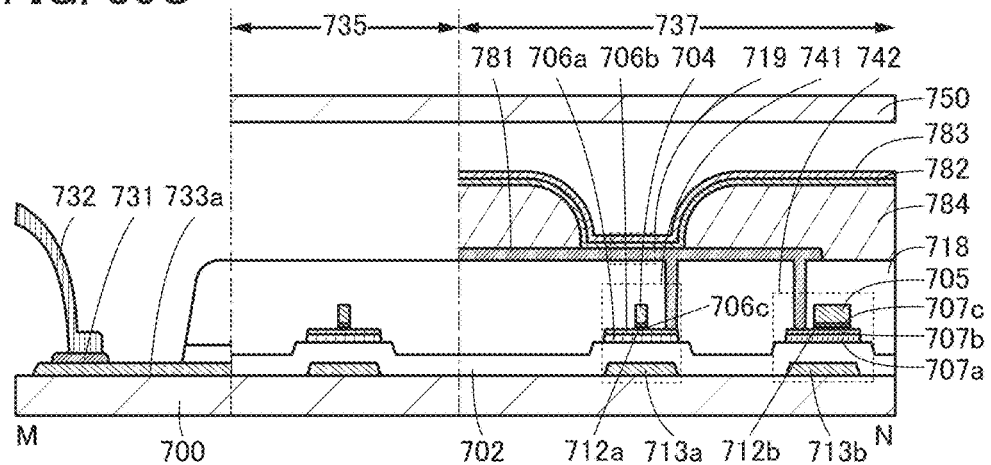

FIGS. 30A to 30C illustrate an example of an EL display device of one embodiment of the present invention. FIG. 30A is a circuit diagram of a pixel in an EL display device. FIG. 30B is a top view showing the whole of the EL display device.

FIG. 30A illustrates an example of a circuit diagram of a pixel used in an EL display device.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Furthermore, in the case where a connection portion is disclosed in this specification and the like, it can be determined that one embodiment of the invention in which a connection portion is not specified is disclosed in this specification and the like, in some cases. Particularly in the case where the number of portions to which a terminal is connected might be more than one, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear, and it can be determined that one embodiment of the present invention whose function is specified is disclosed in this specification and the like in some cases. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device illustrated in FIG. 30A includes a switching element 743, a transistor 741, a capacitor 742, and a light-emitting element 719.

Note that FIG. 30A and the like each illustrate an example of a circuit structure; therefore, a transistor can be provided additionally. In contrast, for each node in FIG. 30A, it is possible not to provide an additional transistor, switch, passive element, or the like.

Figure 50:
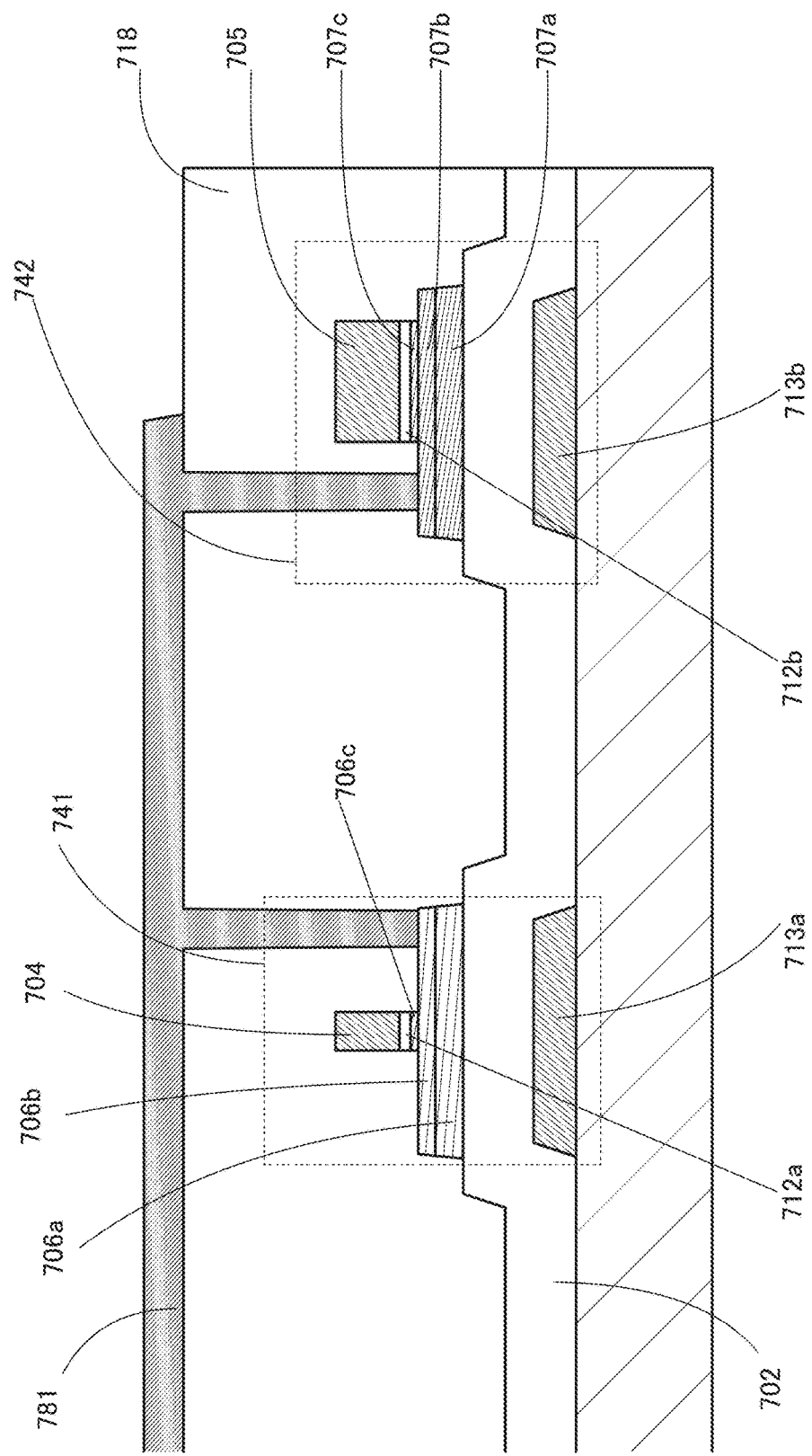
FIG. 50 is a cross-sectional view illustrating a semiconductor device according to one embodiment of the present invention.

A gate of the transistor 741 is electrically connected to one terminal of the switching element 743 and one electrode of the capacitor 742. A source of the transistor 741 is electrically connected to the other electrode of the capacitor 742 and one electrode of the light-emitting element 719. A drain of the transistor 741 is supplied with a power supply potential VDD. The other terminal of the switching element 743 is electrically connected to a signal line 744. A constant potential is supplied to the other electrode of the light-emitting element 719. The constant potential is a ground potential GND or a potential lower than the ground potential GND. Note that FIG. 50 is an enlarged view of the transistor 741 and the capacitor 742.

It is preferable to use a transistor as the switching element 743. When the transistor is used as the switching element, the area of a pixel can be reduced, so that the EL display device can have high resolution. As the switching element 743, a transistor formed through the same step as the transistor 741 can be used, so that EL display devices can be manufactured with high productivity. Note that as the transistor 741 and/or the switching element 743, any of the above-described transistors can be used, for example.

FIG. 30B is a top view of the EL display device. The EL display device includes a substrate 700, a substrate 750, a sealant 734, a driver circuit 735, a driver circuit 736, a pixel 737, and an FPC 732. The sealant 734 is provided between the substrate 700 and the substrate 750 so as to surround the pixel 737, the driver circuit 735, and the driver circuit 736. Note that the driver circuit 735 and/or the driver circuit 736 may be provided outside the sealant 734.

FIG. 30C is a cross-sectional view of the EL display device taken along part of dashed-dotted line M-N in FIG. 30B.

FIG. 30C illustrates a structure in which the transistor 741 includes a conductor 713*a* over the substrate 700, an insulator 702 over the conductor 713*a*, an oxide insulator 706*a* and an oxide semiconductor 706*b* that are over the insulator 702 and overlap with the conductor 713*a*, an oxide insulator 706*c* over the oxide semiconductor 706*b*, an insulator 712*a* over the oxide insulator 706*c*, and a conductor 704 that is over the insulator 712*a* and overlaps with the oxide semiconductor 706*b*. Note that this structure of the transistor 741 is just an example; a structure different from that illustrated in FIG. 30C may be employed.

Thus, in the transistor 741 illustrated in FIG. 30C, the conductor 713*a* functions as a gate electrode, the insulator 702 functions as a gate insulator, the insulator 712*a* functions as a gate insulator, and the conductor 704 functions as a gate electrode. Note that in some cases, electrical characteristics of the oxide semiconductor 706*b* change if light enters the oxide semiconductor 706*b*. To prevent this, it is preferable that the conductor 713*a* and/or the conductor 704 have a light-blocking property.

In the structure illustrated in FIG. 30C, the capacitor 742 includes a conductor 713*b* over the substrate, the insulator 702 over the conductor 713*b*, an oxide conductor 707*a* over the insulator 702, an oxide conductor 707*b* over the oxide conductor 707*a*, an oxide conductor 707*c* over the oxide conductor 707*b*, an insulator 712*b* over the oxide conductor 707*c*, and a conductor 705 over the insulator 712*b*.

The oxide conductor 707*a*, the oxide conductor 707*b*, and the oxide conductor 707*c* are formed through the same step as that of forming the oxide insulator 706*a*, the oxide semiconductor 706*b*, and the oxide insulator 706*c*, and have conductivity imparted by the addition of impurities such as hydrogen. Furthermore, the conductor 713*b*, the conductor 705, and the insulator 712*b* are formed through the same step as that of forming the conductor 713*a*, the conductor 704, and the insulator 712*a*, respectively. Thus, the capacitor 742 can be formed using a film of the transistor 741.

An insulator 718 is provided over the transistor 741 and the capacitor 742. Here, the insulator 718 may have an opening reaching the transistor 741 and an opening reaching the capacitor 742. A conductor 781 is provided over the insulator 718. The conductor 781 may be electrically connected to the transistor 741 through the opening in the insulator 718.

A partition wall 784 having an opening reaching the conductor 781 is provided over the conductor 781. A light-emitting layer 782 in contact with the conductor 781 through the opening provided in the partition wall 784 is provided over the partition wall 784. A conductor 783 is provided over the light-emitting layer 782. A region where the conductor 781, the light-emitting layer 782, and the conductor 783 overlap with one another functions as the light-emitting element 719.

Note that a transistor, a capacitor, a wiring layer, and the like may be stacked to make the EL display device highly integrated.

Figure 51:
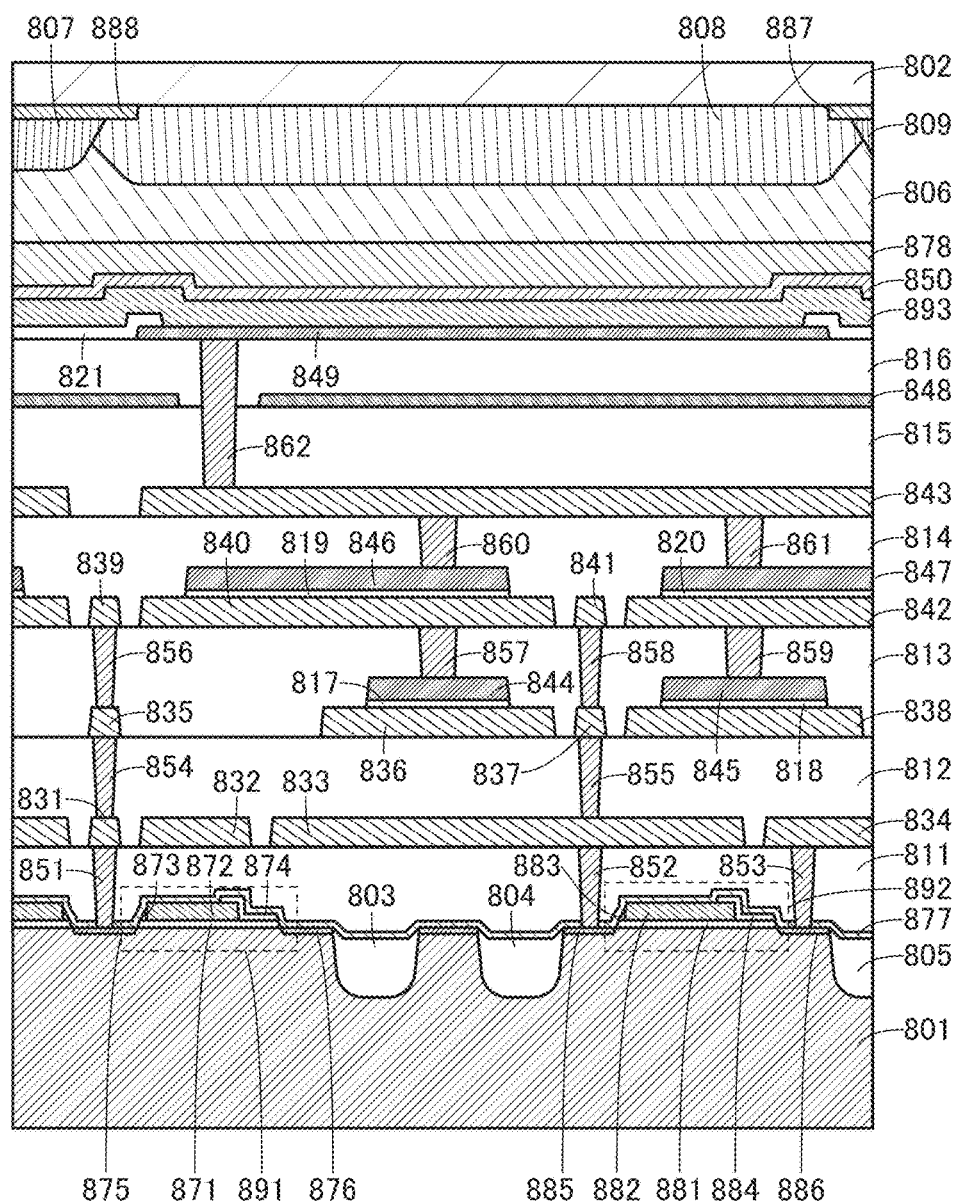
FIG. 51 is a cross sectional view illustrating an EL display device according to one embodiment of the present invention.

FIG. 51 is a cross-sectional view illustrating a pixel of an EL display device fabricated over a semiconductor substrate.

The EL display device shown in FIG. 51 includes a semiconductor substrate 801, a substrate 802, an insulator 803, an insulator 804, an insulator 805, an adhesive layer 806, a filter 807, a filter 808, a filter 809, an insulator 811, an insulator 812, an insulator 813, an insulator 814, an insulator 815, an insulator 816, an insulator 817, an insulator 818, an insulator 819, an insulator 820, an insulator 821, a conductor 831, a conductor 832, a conductor 833, a conductor 834, a conductor 835, a conductor 836, a conductor 837, a conductor 838, a conductor 839, a conductor 840, a conductor 841, a conductor 842, a conductor 843, a conductor 844, a conductor 845, a conductor 846, a conductor 847, a conductor 848, a conductor 849, a conductor 850, a conductor 851, a conductor 852, a conductor 853, a conductor 854, a conductor 855, a conductor 856, a conductor 857, a conductor 858, a conductor 859, a conductor 860, a conductor 861, a conductor 862, an insulator 871, a conductor 872, an insulator 873, an insulator 874, a region 875, a region 876, an insulator 877, an insulator 878, an insulator 881, a conductor 882, an insulator 883, an insulator 884, a region 885, a region 886, a layer 887, a layer 888, and a light-emitting layer 893.

A transistor 891 includes the semiconductor substrate 801, the insulator 871, the conductor 872, the insulator 873, the insulator 874, and the region 875 and the region 876. The semiconductor substrate 801 functions as a channel formation region. The insulator 871 has a function of a gate insulator. The conductor 872 has a function of a gate electrode. The insulator 873 has a function of a sidewall insulator. The insulator 874 has a function of a sidewall insulator. The region 875 has a function of a source region and/or a drain region. The region 876 has a function of a source region and/or a drain region.

The conductor 872 includes a region overlapping with part of the semiconductor substrate 801 with the insulator 871 therebetween. The region 875 and the region 876 are regions where impurities are added to the semiconductor substrate 801. In the case where the semiconductor substrate 801 is a silicon substrate, the region 875 and the region 876 may each be a region including a silicide, such as tungsten silicide, titanium silicide, cobalt silicide, or nickel silicide. The region 875 and the region 876 can be formed in a self-aligned manner using the conductor 872, the insulator 873, the insulator 874, and the like, and the region 875 and the region 876 are accordingly located in the semiconductor substrate 801 such that a channel formation region is provided between the region 875 and the region 876.

Since the transistor 891 includes the insulator 873, the region 875 can be distanced from the channel formation region. Owing to the insulator 873, the transistor 891 can be prevented from being broken or degraded by an electric field generated in the region 875. Since the transistor 891 includes the insulator 874, the region 876 can be distanced from the channel formation region. Owing to the insulator 874, the transistor 891 can be prevented from being broken or degraded by an electric field generated in the region 876. Note that in the transistor 891, the distance between the region 876 and a channel formation region is longer than the distance between the region 875 and a channel formation region. This structure enables both high on-state current and high reliability in the case where a potential difference between the region 876 and a channel formation region is likely to be larger than a potential difference between the region 875 and a channel formation region in operation of the transistor 891.

A transistor 892 includes the semiconductor substrate 801, the insulator 881, the conductor 882, the insulator 883, the insulator 884, the region 885, and the region 886. The semiconductor substrate 801 has a function of a channel formation region. The insulator 881 has a function of a gate insulator. The conductor 882 has a function of a gate electrode. The insulator 883 has a function of a sidewall insulator. The insulator 884 has a function of a sidewall insulator. The region 885 has a function of a source region and/or a drain region. The region 886 has a function of a source region and/or a drain region.

The conductor 882 includes a region overlapping with part of the semiconductor substrate 801 with the insulator 881 therebetween. The region 885 and the region 886 are regions where impurities are added to the semiconductor substrate 801. In the case where the semiconductor substrate 801 is a silicon substrate, the region 885 and the region 886 are a region including a silicide. The region 885 and the region 886 can be formed in a self-aligned manner using the conductor 882, the insulator 883, the insulator 884, and the like, and the region 885 and the region 886 are accordingly located in the semiconductor substrate 801 such that a channel formation region is provided between the region 885 and the region 886.

Since the transistor 892 includes the insulator 883, the region 885 can be distanced from the channel formation region. Owing to the insulator 883, the transistor 892 can be prevented from being broken or degraded by an electric field generated in the region 885. Since the transistor 892 includes the insulator 884, the region 886 can be distanced from the channel formation region. Owing to the insulator 884, the transistor 892 can be prevented from being broken or degraded by an electric field generated in the region 886. Note that in the transistor 892, the distance between the region 886 and a channel formation region is longer than the distance between the region 885 and a channel formation region. This structure can enable both high on-state current and high reliability in the case where a potential difference between the region 886 and a channel formation region is likely to be larger than a potential difference between the region 885 and a channel formation region in operation of the transistor 892.

The insulator 877 is located so as to cover the transistor 891 and the transistor 892 and has a function of a protective film for the transistor 891 and the transistor 892. The insulator 803, the insulator 804, and the insulator 805 have a function of separating elements. For example, the transistor 891 and the transistor 892 are isolated from each other with the insulator 803 and the insulator 804 therebetween.

Each of the conductor 851, the conductor 852, the conductor 853, the conductor 854, the conductor 855, the conductor 856, the conductor 857, the conductor 858, the conductor 859, the conductor 860, the conductor 861, and the conductor 862 has a function of electrically connecting elements, an element and a wiring, and wirings, and the like; therefore these conductors can also be referred to as a wiring or a plug.

Each of the conductor 831, the conductor 832, the conductor 833, the conductor 834, the conductor 835, the conductor 836, the conductor 837, the conductor 838, the conductor 839, the conductor 840, the conductor 841, the conductor 842, the conductor 843, the conductor 844, the conductor 845, the conductor 846, the conductor 847, the conductor 849, and the conductor 850 has a function of a wiring, an electrode, and/or a light-blocking layer.

For example, the conductor 836 and the conductor 844 each have a function of an electrode of a capacitor including the insulator 817; the conductor 838 and the conductor 845 each have a function of an electrode of a capacitor including the insulator 818; the conductor 840 and the conductor 846 each have a function of an electrode of a capacitor including the insulator 819; and the conductor 842 and the conductor 847 each have a function of an electrode of a capacitor including the insulator 820. Note that the conductor 836 and the conductor 838 may be electrically connected to each other. The conductor 844 and the conductor 845 may be electrically connected to each other. The conductor 840 and the conductor 842 may be electrically connected to each other. The conductor 846 and the conductor 847 may be electrically connected to each other.

Each of the insulator 811, the insulator 812, the insulator 813, the insulator 814, the insulator 815, and the insulator 816 has a function of an interlayer insulator. The top surfaces of the insulator 811, the insulator 812, the insulator 813, the insulator 814, the insulator 815, and the insulator 816 are preferably flat.

The conductor 831, the conductor 832, the conductor 833, and the conductor 834 are provided over the insulator 811. The conductor 851 is provided in an opening in the insulator 811. The conductor 851 electrically connects the conductor 831 and the region 875. The conductor 852 is provided in an opening in the insulator 811. The conductor 852 electrically connects the conductor 833 and the region 885. The conductor 853 is provided in an opening in the insulator 811. The conductor 853 electrically connects the conductor 834 and the region 886.

The conductor 835, the conductor 836, the conductor 837, and the conductor 838 are provided over the insulator 812. The insulator 817 is provided over the conductor 836. The conductor 844 is provided over the insulator 817. The insulator 818 is provided over the conductor 838. The conductor 845 is provided over the insulator 818. The conductor 854 is provided in an opening in the insulator 812. The conductor 854 electrically connects the conductor 835 and the conductor 831. The conductor 855 is provided in an opening in the insulator 812. The conductor 855 electrically connects the conductor 837 and the conductor 833.

The conductor 839, the conductor 840, the conductor 841, and the conductor 842 are provided over the insulator 813. The insulator 819 is provided over the conductor 840. The conductor 846 is provided over the insulator 819. The insulator 820 is provided over the conductor 842. The conductor 847 is provided over the insulator 820. The conductor 856 is provided in an opening in the insulator 813. The conductor 856 electrically connects the conductor 839 and the conductor 835. The conductor 857 is provided in an opening in the insulator 813. The conductor 857 electrically connects the conductor 840 and the conductor 844. The conductor 858 is provided in an opening in the insulator 813. The conductor 858 electrically connects the conductor 841 and the conductor 837. The conductor 859 is provided in an opening in the insulator 813. The conductor 859 electrically connects the conductor 842 and the conductor 845.

The conductor 843 is provided over the insulator 814. The conductor 860 is provided in an opening in the insulator 814. The conductor 860 electrically connects the conductor 843 and the conductor 846. The conductor 860 electrically connects the conductor 843 and the conductor 847.

The conductor 848 is provided over the insulator 815 and may be electrically floating. Note that the conductor 848 is not limited to a conductor as long as it has a function of a light-blocking layer: for example, the conductor 848 may be an insulator or a semiconductor having a light-blocking property.

The conductor 849 is provided over the insulator 816. The insulator 821 is provided over the insulator 816 and the conductor 849. The insulator 821 includes an opening exposing the conductor 849. The light-emitting layer 893 is provided over the conductor 849 and the insulator 821. The conductor 850 is provided over the light-emitting layer 893.

The light-emitting layer 893 emits light by a potential difference between the conductor 849 and the conductor 850; thus, the conductor 849, the conductor 850, and the light-emitting layer 893 form a light-emitting element. Note that the insulator 821 has a function of a partition wall.

The insulator 878 is provided over the conductor 850. The insulator 878 covers the light-emitting element and has a function of a protective insulator. The insulator 878 may have a barrier property or may form a structure in which the light-emitting element is surrounded by insulators having barrier properties, for example.

A substrate having a light-transmitting property can be used as the substrate 802. For example, the substrate 750 can be referred to for the substrate 802. The layer 887 and the layer 888 are provided on the substrate 802. The layer 887 and the layer 888 each have a function of a light-blocking layer. A resin, a metal, or the like can be used for the light-blocking layer. The layer 887 and the layer 888 can improve the contrast and reduce color bleeding in the EL display device.

Each of the filter 807, the filter 808, and the filter 809 has a function of a color filter. The filter 2054 can be referred to for the filter 807, the filter 808, and the filter 809, for example. The filter 808 has a region overlapping with the layer 888, the substrate 802, and the layer 887. The filter 807 has a region overlapping with the filter 808 on the layer 888. The filter 809 has a region overlapping with the filter 808 on the layer 887. The filter 807, the filter 808, and the filter 809 may have different thicknesses, in which case light might be extracted more efficiently from the light-emitting element.

An adhesive layer 806 is provided between the insulator 878 and the filter 807, the filter 808, and the filter 809.

Because the EL display device in FIG. 51 has a stacked-layer structure of the transistor, the capacitor, the wiring layer, and the like, the pixel area can be reduced. A highly integrated EL display device can be provided.

So far, examples of the EL display device are described. Next, an example of a liquid crystal display device is described.

Figure 31A:
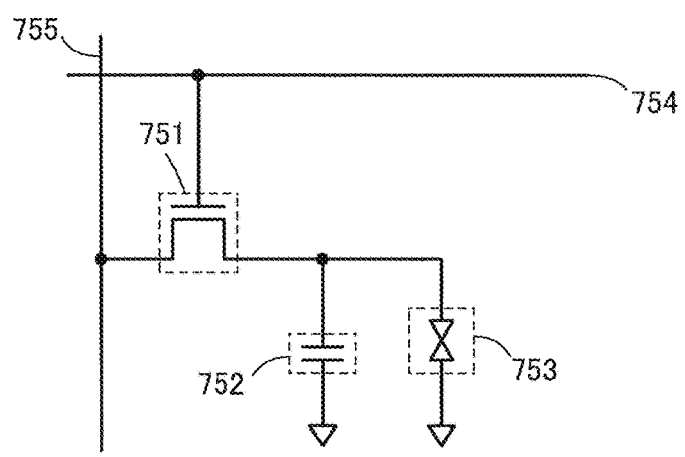
FIGS. 31A and 31B are a circuit diagram and a cross-sectional view illustrating semiconductor devices according to one embodiment of the present invention.

FIG. 31A is a circuit diagram illustrating a configuration example of a pixel of a liquid crystal display device. A pixel shown in FIG. 31A includes a transistor 751, a capacitor 752, and an element (liquid crystal element) 753 in which a space between a pair of electrodes is filled with a liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring to which a common potential is supplied.

One electrode of the liquid crystal element 753 is electrically connected to the other of the source and the drain of the transistor 751, and the other electrode of the liquid crystal element 753 is electrically connected to a wiring to which a common potential is supplied. The common potential supplied to the wiring electrically connected to the other electrode of the capacitor 752 may be different from that supplied to the other electrode of the liquid crystal element 753.

Figure 31B:
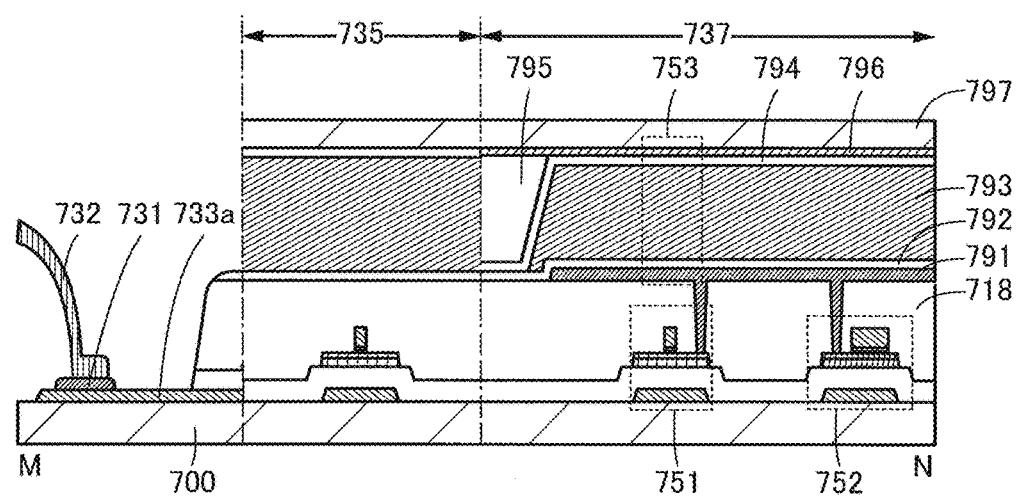

Note that the description of the liquid crystal display device is made on the assumption that the top view of the liquid crystal display device is similar to that of the EL display device. FIG. 31B is a cross-sectional view of the liquid crystal display device taken along dashed-dotted line M-N in FIG. 30B. In FIG. 31B, the FPC 732 is connected to the wiring 733a via the terminal 731. Note that the wiring 733a may be formed using the same kind of conductor as the conductor of the transistor 751 or using the same kind of semiconductor as the semiconductor of the transistor 751.

For the transistor 751, the description of the transistor 741 is referred to. For the capacitor 752, the description of the capacitor 742 is referred to. Note that the structure of the capacitor 752 in FIG. 31B corresponds to, but is not limited to, the structure of the capacitor 742 in FIG. 30C.

Note that in the case where an oxide semiconductor is used as the semiconductor of the transistor 751, the off-state current of the transistor 751 can be extremely low. Therefore, an electric charge held in the capacitor 752 is unlikely to leak, so that the voltage applied to the liquid crystal element 753 can be maintained for a long time. Accordingly, the transistor 751 can be kept off during a period in which moving images with few motions or a still image are/is displayed, whereby power for the operation of the transistor 751 can be saved in that period; accordingly a liquid crystal display device with low power consumption can be provided. Furthermore, the area occupied by the capacitor 752 can be reduced; thus, a liquid crystal display device with a high aperture ratio or a high-resolution liquid crystal display device can be provided.

The insulator 718 is provided over the transistor 751 and the capacitor 752. The insulator 718 has an opening reaching the transistor 751. A conductor 791 is provided over the insulator 718. The conductor 791 is electrically connected to the transistor 751 through the opening in the insulator 718.

An insulator 792 functioning as an alignment film is provided over the conductor 791. A liquid crystal layer 793 is provided over the insulator 792. An insulator 794 functioning as an alignment film is provided over the liquid crystal layer 793. A spacer 795 is provided over the insulator 794. A conductor 796 is provided over the spacer 795 and the insulator 794. A substrate 797 is provided over the conductor 796.

For example, in this specification and the like, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of an EL element; a light-emitting diode (LED) for white, red, green, blue, or the like; a transistor (a transistor that emits light depending on current); an electron emitter; a liquid crystal element; electronic ink; an electrophoretic element; a plasma display panel (PDP); a display element using micro electro mechanical systems (MEMS) such as a grating light valve (GLV), a digital micromirror device (DMD), a digital micro shutter (DMS), an interferometric modulator display (IMOD) element, a MEMS shutter display element, an optical-interference-type MEMS display element, or a piezoelectric ceramic display; an electrowetting element; a display element including a carbon nanotube; and quantum dots. Other than the above, display media whose contrast, luminance, reflectivity, transmittance, or the like is changed by electrical or magnetic effect may be included.

Note that examples of display devices having EL elements include an EL display. Examples of a display device including an electron emitter include a field emission display (FED), an SED-type flat panel display (SED: surface-conduction electron-emitter display), and the like. Examples of display devices containing quantum dots in each pixel include a quantum dot display. The quantum dots are placed in a display element, in a backlight, or between the backlight and the display element. With the use of the quantum dots, a display device with high color purity can be fabricated. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

Note that in the case of using an LED chip, graphene or graphite may be provided under an electrode or a nitride semiconductor of the LED chip. Graphene or graphite may be a multilayer film in which a plurality of layers are stacked. As described above, provision of graphene or graphite enables easy formation of a nitride semiconductor, such as an n-type GaN semiconductor including crystals, over the graphene or graphite. Furthermore, a p-type GaN semiconductor including crystals or the like can be provided thereover, and thus the LED chip can be formed. Note that an AlN layer may be provided between the n-type GaN semiconductor including crystals and graphene or graphite. The GaN semiconductors included in the LED chip may be formed by MOCVD. Note that when the graphene is provided, the GaN semiconductors included in the LED chip can also be formed by a sputtering method.

In a display device including MEMS, a dry agent may be provided in a space where a display element is sealed (or between an element substrate over which the display element is placed and a counter substrate opposed to the element substrate, for example). The dry agent can remove moisture and thus can prevent malfunction or degradation of the MEMS or the like.

<Supply of Single Power>

Examples of a semiconductor device having a function of increasing or decreasing a power supply voltage from a single power source and splitting the voltage to each circuit are described below with reference to FIGS. 32A to 32E to FIGS. 38A and 38B.

Figure 32A:
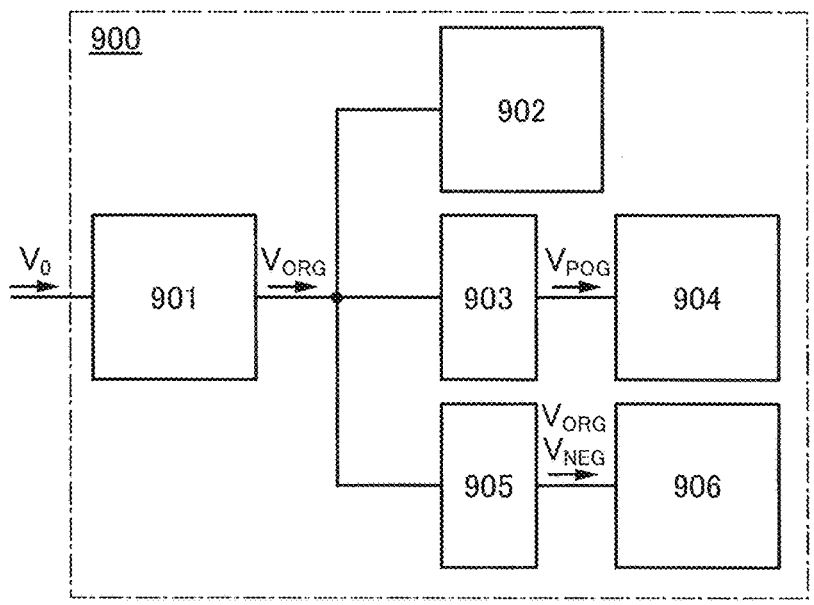
FIGS. 32A to 32E are a block diagram, circuit diagrams, and waveform charts illustrating one embodiment of the present invention.

FIG. 32A is a block diagram of a semiconductor device 900. The semiconductor device 900 includes a power supply circuit 901, a circuit 902, a voltage generation circuit 903, a circuit 904, a voltage generation circuit 905, and a circuit 906.

The power supply circuit 901 is a circuit that generates a potential $V_{ORG}$ used as a reference on the basis of one power supply voltage $V_0$ or the like supplied from the outside of the semiconductor device 900. The potential $V_{ORG}$ is not necessarily one potential and can be a plurality of potentials.

The circuits 902, 904, and 906 operate with different power supply voltages. For example, the power supply voltage of the circuit 902 is a voltage applied on the basis of the potential $V_{ORG}$ and the potential $V_{SS}$ ($V_{ORG} > V_{SS}$). For example, the power supply voltage of the circuit 904 is a voltage applied on the basis of a potential $V_{POG}$ and the potential $V_{SS}$ ($V_{POG} > V_{ORG}$). For example, the power supply voltages of the circuit 906 are voltages applied on the basis of the potential $V_{ORG}$, the potential $V_{SS}$, and a potential $V_{NEG}$ ($V_{ORG} > V_{SS} > V_{NEG}$). When the potential $V_{SS}$ is equal to a ground potential (GND), the kinds of potentials generated in the power supply circuit 901 can be reduced.

The voltage generation circuit 903 is a circuit that generates the potential $V_{POG}$. The voltage generation circuit 903 can generate the potential $V_{POG}$ on the basis of the potential $V_{ORG}$ supplied from the power supply circuit 901. The voltage generation circuit 905 is a circuit that generates the potential $V_{NEG}$. The voltage generation circuit 905 can generate the potential $V_{NEG}$ on the basis of the potential $V_{ORG}$ supplied from the power supply circuit 901. Therefore, even when the semiconductor device 900 includes the circuit 904 and the circuit 906 which operate with different power supply voltages, the semiconductor device 900 can operate with one power supply voltage supplied from the outside.

Figure 32B:
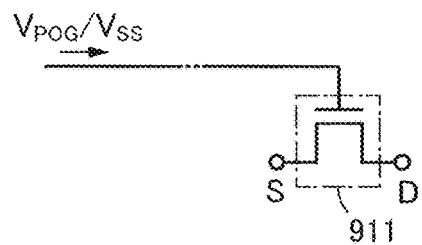
Figure 32C:
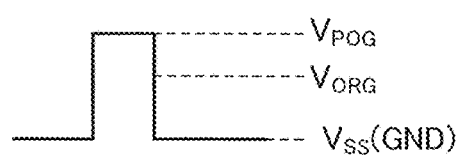

FIG. 32B illustrates an example of the circuit 904 that operates with the potential $V_{POG}$ and FIG. 32C illustrates an example of a waveform of a signal for operating the circuit 904.

FIG. 32B illustrates a transistor 911. A signal supplied to a gate of the transistor 911 is generated on the basis of, for example, the potential $V_{POG}$ and the potential $V_{SS}$. The signal is generated on the basis of the potential $V_{POG}$ at the time when the transistor 911 is turned on and on the basis of the potential $V_{SS}$ at the time when the transistor 911 is turned off. As shown in FIG. 32C, the potential $V_{POG}$ is higher than the potential $V_{ORG}$. Therefore, a conducting state between a source (S) and a drain (D) of the transistor 911 can be obtained more surely. As a result, the frequency of malfunction of the circuit 904 can be reduced.

Figure 32D:
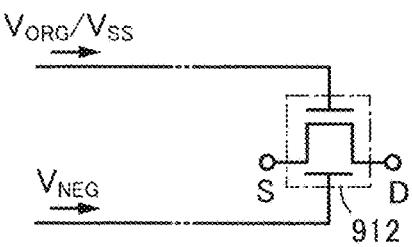
Figure 32E:
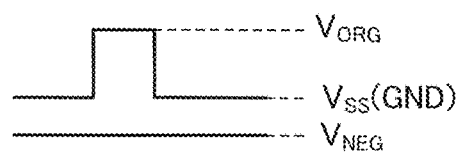

FIG. 32D illustrates an example of the circuit 906 that operates with the potential $V_{NEG}$ and FIG. 32E illustrates an example of a waveform of a signal for operating the circuit 906.

FIG. 32D illustrates a transistor 912 having a back gate. A signal supplied to a gate of the transistor 912 is generated on the basis of, for example, the potential $V_{ORG}$ and the potential $V_{SS}$. The signal is generated on the basis of the potential $V_{ORG}$ at the time when the transistor 911 is turned on and on the basis of the potential $V_{SS}$ at the time when the transistor 911 is turned off. A signal supplied to the back gate of the transistor 912 is generated on the basis of the potential $V_{NEG}$. As shown in FIG. 32E, the potential $V_{NEG}$ is lower than the potential $V_{SS}$ (GND). Therefore, the threshold voltage of the transistor 912 can be shifted in the positive direction. Thus, the transistor 912 can be surely turned off and a current flowing between a source (S) and a drain (D) can be reduced. As a result, the frequency of malfunction of the circuit 906 can be reduced and power consumption thereof can be reduced.

The potential $V_{NEG}$ may be directly supplied to the back gate of the transistor 912. Alternatively, a signal supplied to the gate of the transistor 912 may be generated on the basis of the potential $V_{ORG}$ and the potential $V_{NEG}$ and the generated signal may be supplied to the back gate of the transistor 912.

Figure 33A:
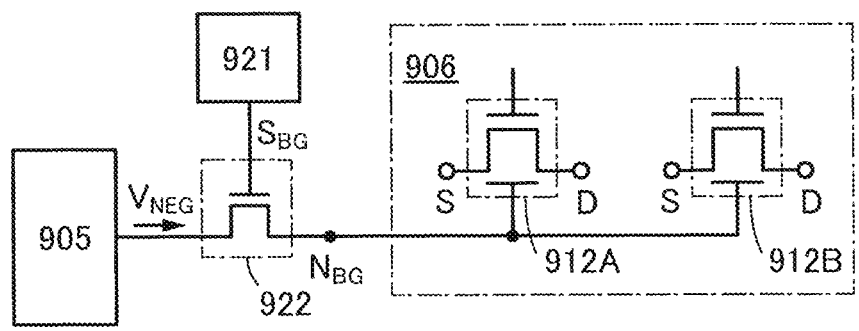
FIGS. 33A and 33B are a circuit diagram and a timing chart illustrating a semiconductor device according to one embodiment of the present invention.
Figure 33B:
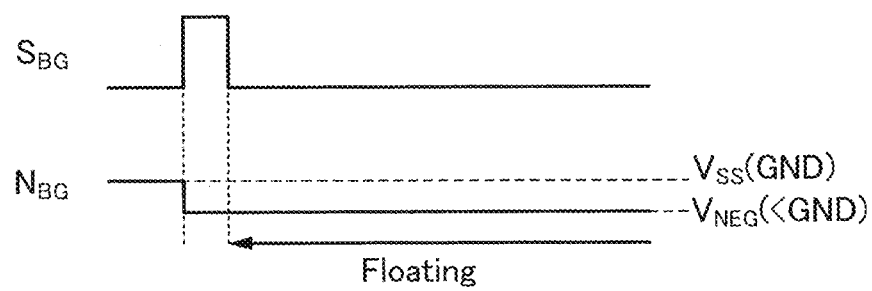

FIGS. 33A and 33B illustrate a modification example of FIGS. 32D and 32E.

In a circuit diagram illustrated in FIG. 33A, a transistor 922 whose conduction state can be controlled by a control circuit 921 is provided between the voltage generation circuit 905 and the circuit 906. The transistor 922 is an n-channel transistor. The control signal $S_{BG}$ output from the control circuit 921 is a signal for controlling the conduction state of the transistor 922. Transistors 912A and 912B included in the circuit 906 are transistors similar to the transistor 922.

A timing chart in FIG. 33B shows changes in the potential of the control signal $S_{BG}$ and the potential of a node $N_{BG}$. The potential of the node $N_{BG}$ indicates the states of potentials of back gates of the transistors 912A and 912B. When the control signal $S_{BG}$ is at a high level, the transistor 922 is turned on and the potential of the node $N_{BG}$ becomes the potential $V_{NEG}$. Then, when the control signal $S_{BG}$ is at a low level, the node $N_{BG}$ is brought into an electrically floating state. In the case where the transistor 922 has a low off-state current, even when the node $N_{BG}$ is in an electrically floating state, the potential $V_{NEG}$ can keep being applied.

Figure 34A:
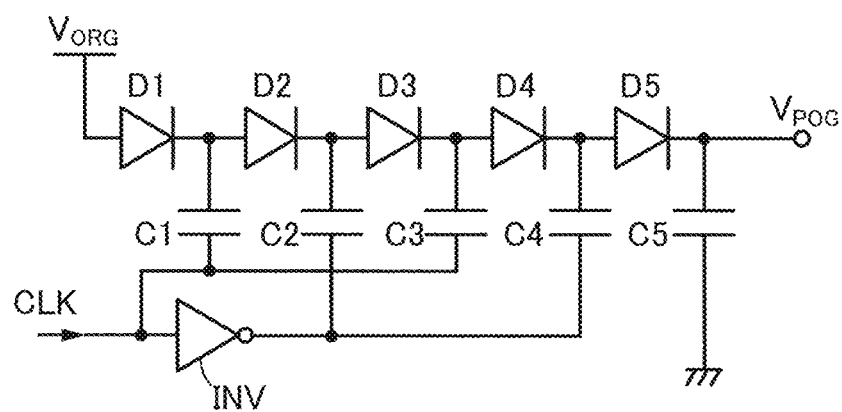
FIGS. 34A and 34B are circuit diagrams illustrating a semiconductor device according to one embodiment of the present invention.

FIG. 34A illustrates an example of a circuit configuration applicable to the above-described voltage generation circuit 903. The voltage generation circuit 903 illustrated in FIG. 34A is a five-stage charge pump including diodes D1 to D5, capacitors C1 to C5, and an inverter INV. A clock signal CLK is supplied to the capacitors C1 to C5 directly or through the inverter INV. When a power supply voltage of the inverter INV is a voltage applied on the basis of the potential $V_{ORG}$ and the potential $V_{SS}$, in response to the application of the clock signal CLK, the potential $V_{POG}$ can be obtained by increasing the potential $V_{ORG}$ by a voltage five times a potential difference between the potential $V_{ORG}$ and the potential $V_{SS}$. Note that a forward voltage of the diodes D1 to D5 is 0 V. A desired potential $V_{POG}$ can be obtained when the number of stages of the charge pump is changed.

Figure 34B:
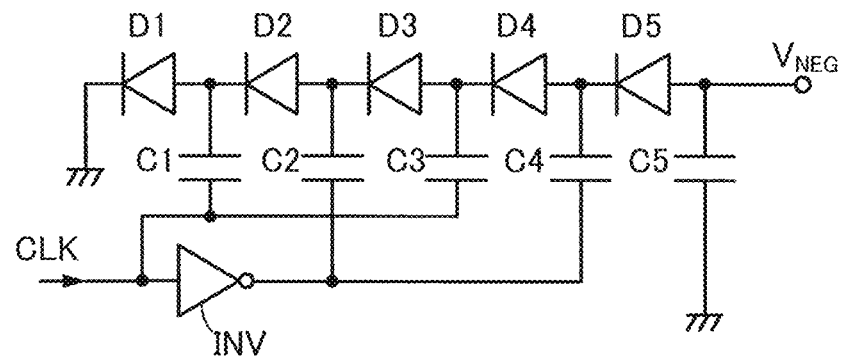

FIG. 34B illustrates an example of a circuit configuration applicable to the above-described voltage generation circuit 905. The voltage generation circuit 905 illustrated in FIG. 34B is a four-stage charge pump including the diodes D1 to D5, the capacitors C1 to C5, and the inverter INV. The clock signal CLK is supplied to the capacitors C1 to C5 directly or through the inverter INV. When a power supply voltage of the inverter INV is a voltage applied on the basis of the potential $V_{ORG}$ and the potential $V_{SS}$, in response to the application of the clock signal CLK, the potential $V_{NEG}$ can be obtained by decreasing the ground voltage, i.e., the potential $V_{SS}$ by a voltage four times the potential difference between the potential $V_{ORG}$ and the potential $V_{SS}$. Note that a forward voltage of the diodes D1 to D5 is 0 V. A desired potential $V_{NEG}$ can be obtained when the number of stages of the charge pump is changed.

The circuit configuration of the voltage generation circuit 903 is not limited to the configuration of the circuit diagram illustrated in FIG. 34A. Modification examples of the voltage generation circuit 903 are shown in FIGS. 35A to 35C and FIGS. 36A and 36B.

Figure 35A:
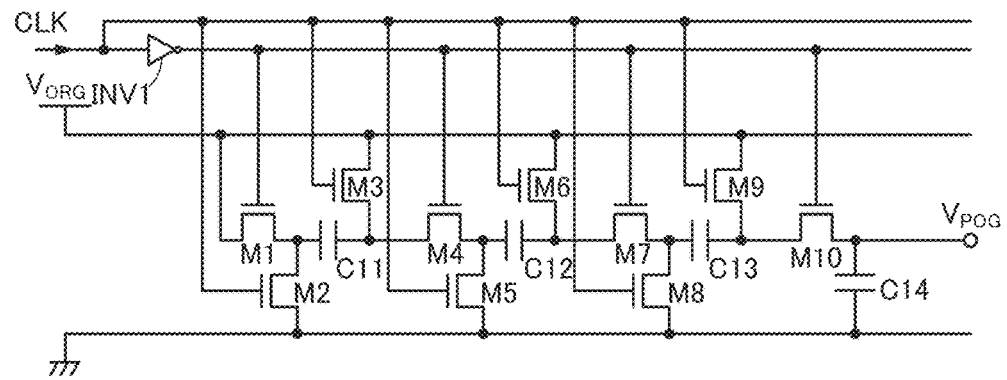
FIGS. 35A to 35C are circuit diagrams each illustrating a semiconductor device according to one embodiment of the present invention.

The voltage generation circuit 903A illustrated in FIG. 35A includes transistors M1 to M10, capacitors C11 to C14, and an inverter INV1. The clock signal CLK is supplied to gates of the transistors M1 to M10 directly or through the inverter INV1. In response to the application of the clock signal CLK, the potential $V_{POG}$ can be obtained by increasing the potential $V_{ORG}$ by a voltage four times the potential difference between the potential $V_{ORG}$ and the potential $V_{SS}$. A desired potential $V_{POG}$ can be obtained when the number of stages is changed. In the voltage generation circuit 903A in FIG. 35A, off-state current of each of the transistors M1 to M10 can be low when the transistors M1 to M10 are the above-described transistors, and leakage of charge held in the capacitors C11 to C14 can be suppressed. Accordingly, raising from the potential $V_{ORG}$ to the potential $V_{POG}$ can be efficiently performed.

Figure 35B:
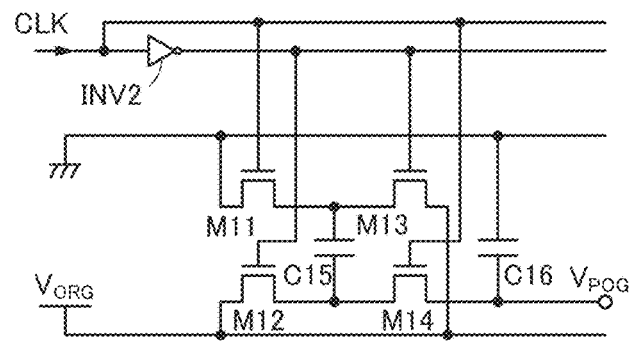

The voltage generation circuit 903B illustrated in FIG. 35B includes transistors M11 to M14, capacitors C15 and C16, and an inverter INV2. The clock signal CLK is supplied to gates of the transistors M11 to M14 directly or through the inverter INV2. In response to the application of the clock signal CLK, the potential $V_{POG}$ can be obtained by increasing the potential $V_{ORG}$ by a voltage twice the potential difference between the potential $V_{ORG}$ and the potential $V_{SS}$. In the voltage generation circuit 903B in FIG. 35B, off-state current of each of the transistors M11 to M14 can be low when the transistors M11 to M14 are the above-described transistors, and leakage of charge held in the capacitors C15 and C16 can be suppressed. Accordingly, raising from the potential $V_{ORG}$ to the potential $V_{POG}$ can be efficiently performed.

Figure 35C:
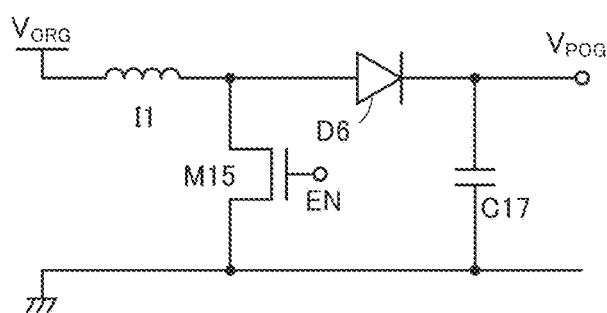

The voltage generation circuit 903C in FIG. 35C includes an inductor I1, a transistor M15, a diode D6, and a capacitor C17. The conduction state of the transistor M15 is controlled by a control signal EN. Owing to the control signal EN, the potential $V_{POG}$ which is obtained by increasing the potential $V_{ORG}$ can be obtained. Since the voltage generation circuit 903C in FIG. 35C increases the voltage using the inductor I1, the voltage can be increased efficiently.

Figure 36A:
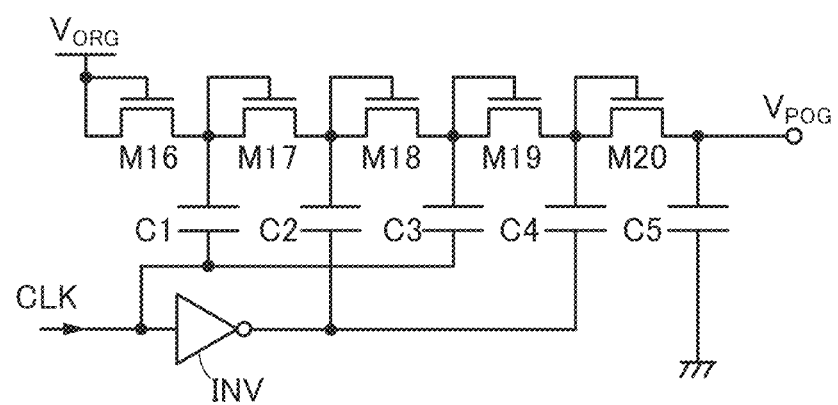
FIGS. 36A and 36B are circuit diagrams each illustrating a semiconductor device according to one embodiment of the present invention.

A voltage generation circuit 903D in FIG. 36A has a configuration in which the diodes D1 to D5 of the voltage generation circuit 903 in FIG. 34A are replaced with diode-connected transistors M16 to M20. In the voltage generation circuit 903D in FIG. 36A, when the above-described transistors are used as the transistors M16 to M20, the off-state current can be reduced, so that leakage of charge held in the capacitors C1 to C5 can be inhibited. Thus, efficient voltage increase from the potential $V_{ORG}$ to the potential $V_{POG}$ is possible.

Figure 36B:
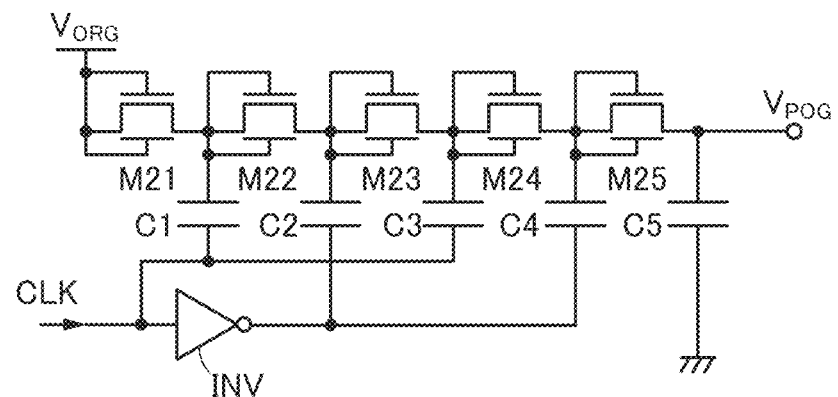

A voltage generation circuit 903E in FIG. 36B has a configuration in which the transistors M16 to M20 of the voltage generation circuit 903D in FIG. 36A are replaced with transistor M21 to M25 having back gates. In the voltage generation circuit 903E in FIG. 36B, the back gates can be supplied with potentials that are the same as those of the gates, so that the on-state current of the transistors can be increased. Thus, efficient voltage increase from the potential $V_{ORG}$ to the potential $V_{POG}$ is possible.

Figure 37A:
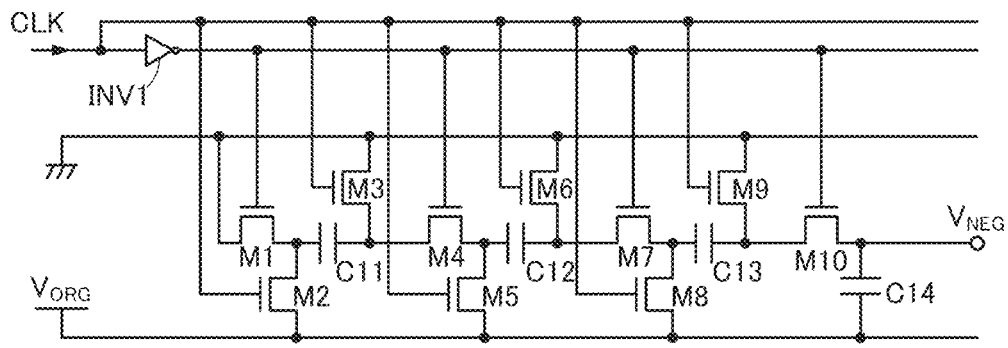
FIGS. 37A to 37C are circuit diagrams each illustrating a semiconductor device according to one embodiment of the present invention.
Figure 37B:
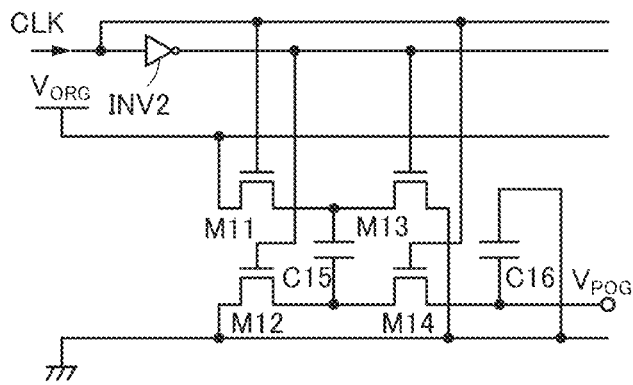
Figure 37C:
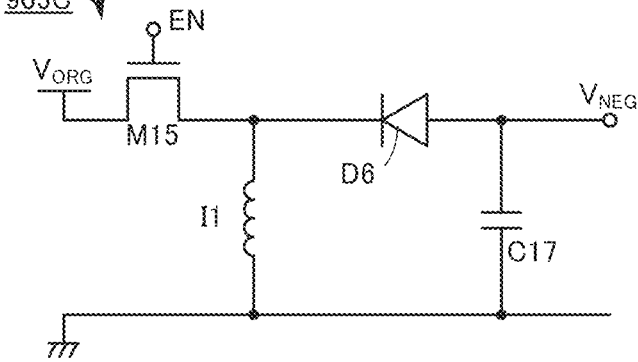
Figure 38A:
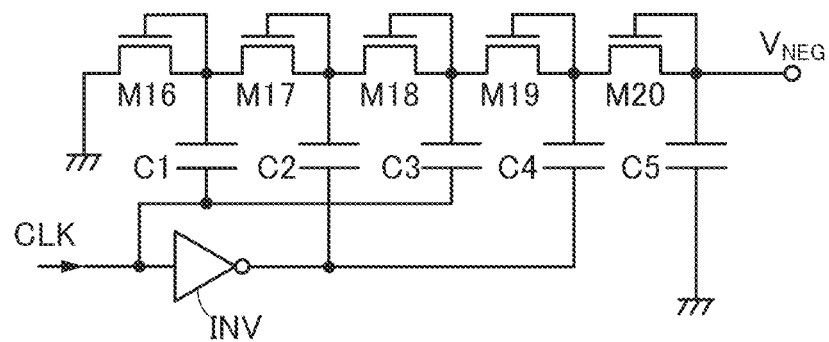
FIGS. 38A and 38B are circuit diagrams each illustrating a semiconductor device according to one embodiment of the present invention.
Figure 38B:
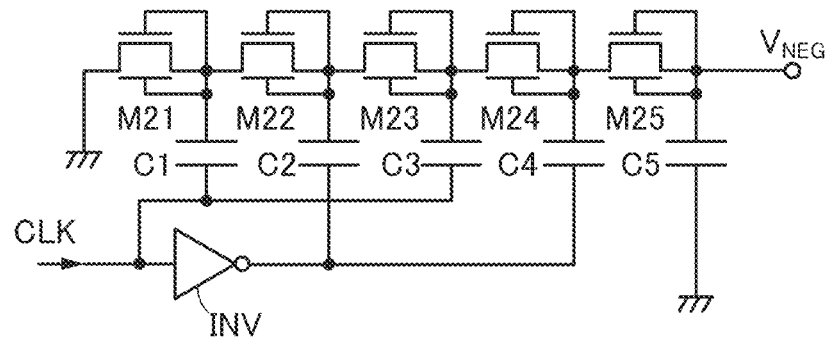

Note that the modification examples of the voltage generation circuit 903 can also be applied to the voltage generation circuit 905 in FIG. 34B. The configurations of a circuit diagram in this case are illustrated in FIGS. 37A to 37C and FIGS. 38A and 38B. When a voltage generation circuit 905A illustrated in FIG. 37A is supplied with the clock signal CLK, the potential $V_{NEG}$ can be obtained by decreasing the potential $V_{SS}$ by a voltage three times the potential difference between the potential $V_{ORG}$ and the potential $V_{SS}$. When a voltage generation circuit 905B illustrated in FIG. 37B is supplied with the clock signal CLK, the potential $V_{NEG}$ can be obtained by decreasing the potential $V_{SS}$ by a voltage twice the potential difference between the potential $V_{ORG}$ and the potential $V_{SS}$.

The voltage generation circuits 905A to 905E in FIGS. 37A to 37C and FIGS. 38A and 38B have configurations in which the potential applied to each wiring or the arrangement of the elements are changed in the voltage generation circuits 903A to 903E in FIGS. 35A to 35C and FIGS. 36A and 36B. In the voltage generation circuits 905A to 905E in FIGS. 37A to 37C and FIGS. 38A and 38B, as in the voltage generation circuits 903A to 903E, efficient voltage decrease from the potential $V_{SS}$ to the potential $V_{NEG}$ is possible.

In the above-described semiconductor device, a plurality of power supply voltages required for circuits included in the semiconductor device can be internally generated. Thus, in the semiconductor device, the kinds of power supply voltages supplied from the outside can be reduced.

<Electronic Device>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 39A to 39F illustrate specific examples of these electronic devices.

Figure 39A:
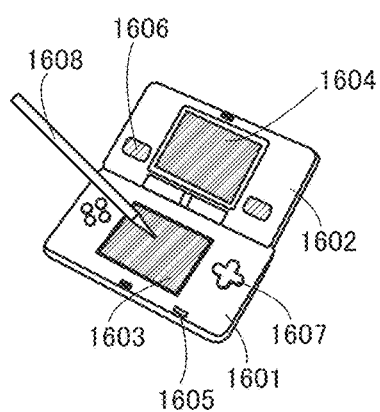
FIGS. 39A to 39F are perspective views each illustrating an electronic device according to one embodiment of the present invention.

FIG. 39A illustrates a portable game console including a housing 1601, a housing 1602, a display portion 1603, a display portion 1604, a microphone 1605, a speaker 1606, an operation key 1607, a stylus 1608, and the like. Although the portable game console in FIG. 39A has the two display portions 1603 and 1604, the number of display portions included in a portable game console is not limited to this.

Figure 39B:
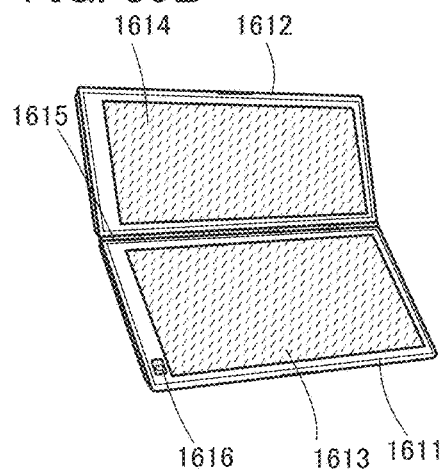

FIG. 39B illustrates a portable data terminal including a first housing 1611, a second housing 1612, a first display portion 1613, a second display portion 1614, a joint 1615, an operation key 1616, and the like. The first display portion 1613 is provided in the first housing 1611, and the second display portion 1614 is provided in the second housing 1612. The first housing 1611 and the second housing 1612 are connected to each other with the joint 1615, and the angle between the first housing 1611 and the second housing 1612 can be changed with the joint 1615. An image on the first display portion 1613 may be switched in accordance with the angle at the joint 1615 between the first housing 1611 and the second housing 1612. A display device with a position input function may be used as at least one of the first display portion 1613 and the second display portion 1614. Note that the position input function can be added by providing a touch panel in a display device. Alternatively, the position input function can be added by providing a photoelectric conversion element called a photosensor in a pixel portion of a display device.

Figure 39C:
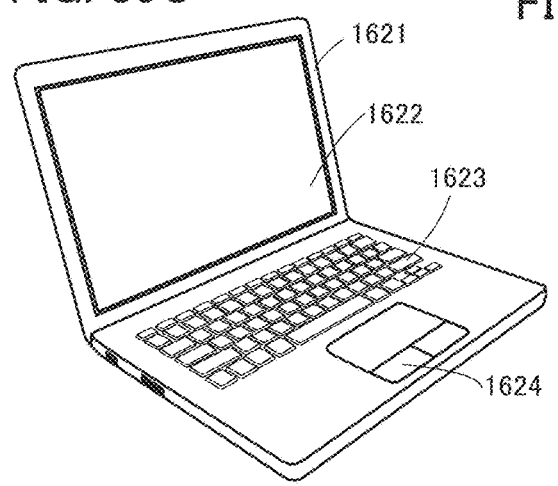

FIG. 39C illustrates a notebook personal computer, which includes a housing 1621, a display portion 1622, a keyboard 1623, a pointing device 1624, and the like.

Figure 39D:
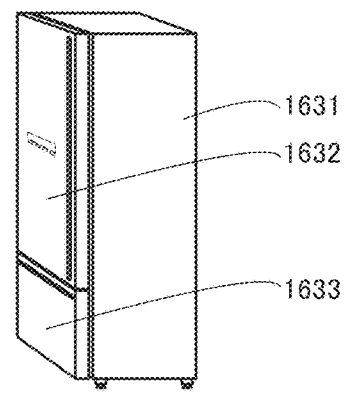

FIG. 39D illustrates an electric refrigerator-freezer, which includes a housing 1631, a door for a refrigerator 1632, a door for a freezer 1633, and the like.

Figure 39E:
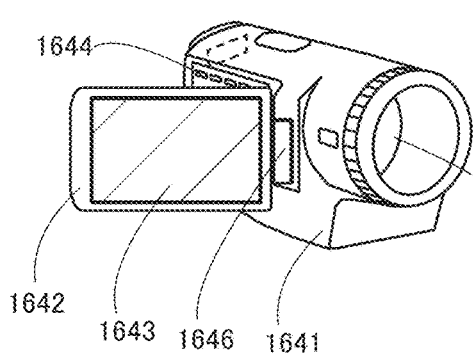

FIG. 39E illustrates a video camera, which includes a first housing 1641, a second housing 1642, a display portion 1643, operation keys 1644, a lens 1645, a joint 1646, and the like. The operation keys 1644 and the lens 1645 are provided for the first housing 1641, and the display portion 1643 is provided for the second housing 1642. The first housing 1641 and the second housing 1642 are connected to each other with the joint 1646, and the angle between the first housing 1641 and the second housing 1642 can be changed with the joint 1646. Images displayed on the display portion 1643 may be switched in accordance with the angle at the joint 1646 between the first housing 1641 and the second housing 1642.

Figure 39F:
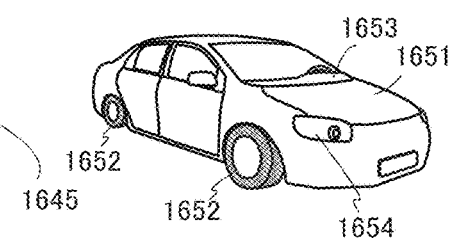

FIG. 39F illustrates a car including a car body 1651, wheels 1652, a dashboard 1653, lights 1654, and the like.

<Electronic Device with Curved Display Region or Curved Light-Emitting Region>

Electronic devices with curved display regions or curved light-emitting regions, which are embodiments of the present invention, will be described below with reference to FIGS. 40A1 to 40C2. Here, information devices, in particular, portable information devices (portable devices) are described as examples of the electronic devices. The portable information devices include, for example, mobile phone devices (e.g., phablets and smartphones) and tablet terminals (slate PCs).

Figures 1, 40A:
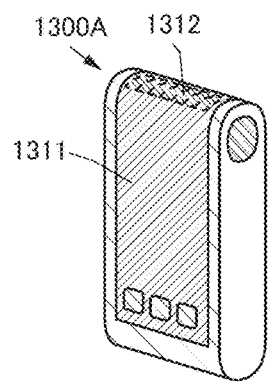
FIGS. 40A1 to 40C2 are perspective views each illustrating an electronic device according to one embodiment of the present invention.
Figures 2, 40A:
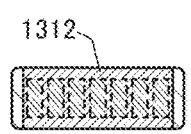
Figures 3, 40A:
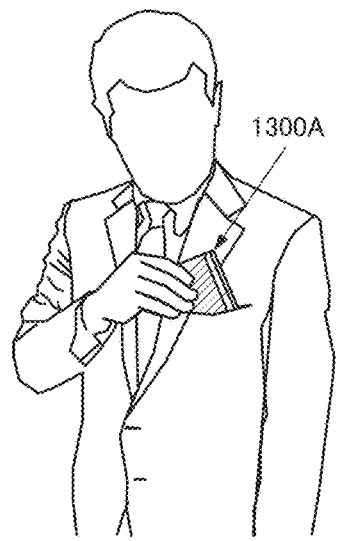

FIG. 40A1 is a perspective view illustrating the outward form of a portable device 1300A. FIG. 40A2 is a top view illustrating the portable device 1300A. FIG. 40A3 illustrates a usage state of the portable device 1300A.

Figures 1, 40B:
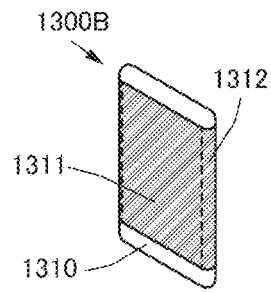
Figures 2, 40B:
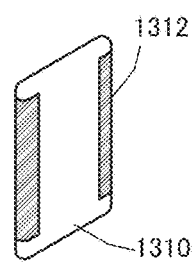

FIGS. 40B1 and 40B2 are perspective views illustrating the outward form of a portable device 1300B.

Figures 1, 40C:
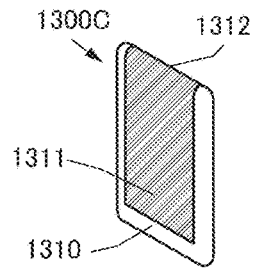
Figures 2, 40C:
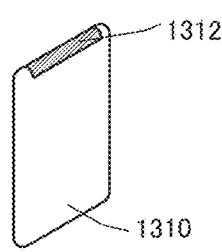

FIGS. 40C1 and 40C2 are perspective views illustrating the outward form of a portable device 1300C.

<Portable Device>

The portable device 1300A has one or more of a telephone function, an email creating and reading function, a notebook function, an information browsing function, and the like.

A display portion of the portable device 1300A is provided along plural surfaces of a housing. In that case, for example, a flexible display device may be provided along the inner side of the housing. Accordingly, text data, image data, or the like can be displayed on a first region 1311 and/or a second region 1312.

Note that images used for three operations can be displayed on the first region 1311 (see FIG. 40A1), for example. Furthermore, text data or the like can be displayed on the second region 1312 as indicated by dashed rectangles in the drawing (see FIG. 40A2).

In the case where the second region 1312 is on the upper portion of the portable device 1300A, a user can easily see text data or image data displayed on the second region 1312 of the portable device 1300A while the portable device 1300A is placed in a breast pocket of the user's clothes (see FIG. 40A3). The user can see, for example, the phone number, name, or the like of the caller of an incoming call, from above the portable device 1300A.

The portable device 1300A may include an input device or the like between the display device and the housing, in the display device, or over the housing. As the input device, for example, a touch sensor, a light sensor, or an ultrasonic sensor may be used. In the case where the input device is provided between the display device and the housing or over the housing, for example, a matrix switch type, resistive type, ultrasonic surface acoustic wave type, infrared type, electromagnetic induction type, or electrostatic capacitance type touch panel may be used. In the case where the input device is provided in the display device, an in-cell sensor, an on-cell sensor, or the like may be used.

The portable device 1300A can be provided with a vibration sensor or the like and a memory device that stores a program for shifting a mode into an incoming call rejection mode based on vibration sensed by the vibration sensor or the like. In that case, the user can shift the mode into the incoming call rejection mode by tapping the portable device 1300A over his/her clothes to apply vibration.

The portable device 1300B includes a display portion including the first region 1311 and the second region 1312 and a housing 1310 that supports the display portion.

The housing 1310 has a plurality of bend portions, and the longest bend portion of the housing 1310 is between the first region 1311 and the second region 1312.

The portable device 1300B can be used with the second region 1312 provided along the longest bend portion facing sideward.

The portable device 1300C includes a display portion including the first region 1311 and the second region 1312 and the housing 1310 that supports the display portion.

The housing 1310 has a plurality of bend portions, and the second longest bend portion in the housing 1310 is between the first region 1311 and the second region 1312.

The portable device 1300C can be used with the second region 1312 facing upward.

EXAMPLE 1

In this example, a sample in which a hydrogen-containing layer was formed over an oxide semiconductor with silicon oxide provided therebetween was manufactured and the electrical characteristic after heat treatment was measured.

A method for forming samples will be described below.

First, a 50-nm-thick In—Ga—Zn oxide that was an oxide semiconductor was formed over a glass substrate. The In—Ga—Zn oxide was formed by a sputtering method using an In—Ga—Zn oxide (In:Ga:Zn=4:2:4.1 [atomic ratio]) target. As a deposition gas, a mixed gas of an argon gas and an oxygen gas, which contains an oxygen gas at 30 vol. %, was used. The deposition pressure was set to 0.6 Pa. As a power source, an alternating-current (AC) power source was used and a power of 2500 W was applied.

Next, a part of the In—Ga—Zn oxide was etched in a photolithography step, so that an In—Ga—Zn oxide having a substantially square shape was formed when seen from the above.

After that, heat treatment was performed at 450° C. in a nitrogen gas atmosphere for one hour. Next, heat treatment was performed at 450° C. in an oxygen gas atmosphere for one hour without exposure to the air.

Then, 50-nm-thick tungsten, 400-nm-thick aluminum, and 100-nm-thick titanium were sequentially formed by a sputtering method.

After that, parts of the tungsten, the aluminum, and the titanium were etched in a photolithography step, whereby four electrodes were formed. Note that the four electrodes were arranged in four corners of the In—Ga—Zn oxide having a substantially square shape such that the nearest neighbor distance was 10 mm.

Next, a 50-nm-thick first silicon oxide and a 400-nm-thick second silicon oxide were sequentially formed by a PECVD method.

As a deposition gas for the first silicon oxide, a mixed gas of a monosilane gas at 30 sccm and a nitrous oxide gas at 4000 sccm was used. The deposition pressure was set to 40 Pa. As a power source, an RF power source with a frequency of 13.56 MHz was used and a power of 150 W was applied. The substrate temperature was set to 220° C.

As a deposition gas for the second silicon oxide, a mixed gas of a monosilane gas at 160 sccm and a nitrous oxide gas at 4000 sccm was used. The deposition pressure was set to 200 Pa. As a power source, an RF power source with a frequency of 13.56 MHz was used and a power of 1500 W was applied. The substrate temperature was set to 220° C.

Heat treatment was performed at 350° C. in an atmosphere of a nitrogen gas at 80 vol. % and an oxygen gas at 20 vol. % for one hour, thus Sample A was manufactured.

Next, for a sample that was under the same condition as that of Sample A, 400-nm-thick amorphous silicon was formed by a PECVD method.

As a deposition gas for the amorphous silicon, a mixed gas of a monosilane gas at 150 sccm and a hydrogen gas at 400 sccm was used. The deposition pressure was set to 80 Pa. As a power source, an RF power source with a frequency of 13.56 MHz was used and a power of 200 W was applied. The substrate temperature was set to 220° C.

Next, a part of the amorphous silicon was etched to provide an amorphous silicon region of 10 mm×10 mm in a photolithography step, so that Sample B was manufactured.

Note that, for measurement, openings were formed in Sample A and Sample B, whereby four electrodes were partly exposed. Further, heat treatment was performed on Sample A and Sample B in a nitrogen gas atmosphere at 250° C. for one hour before the measurement.

Next, the electric characteristic of each sample was evaluated. ResiTest8300 series manufactured by TOYO Corporation was used for the evaluation of the electric characteristic. The measurement result is shown in Table 1.

TABLE 1

|  | Carrier density [1/cm$^3$] | Resistivity [Ω · cm] |
| --- | --- | --- |
| Sample A | 3.9E+18 | 1.1E−02 |
| Sample B | 2.1E+19 | 7.7E−03 |

According to Table 1, Sample B in which the amorphous silicon was formed had high carrier density and low resistivity compared with Sample A. A result obtained by examining factors that made differences of carrier density and resistivity among samples will be described below.

First, 400-nm-thick amorphous silicon was formed over a quartz substrate by a PECVD method.

As a deposition gas for the amorphous silicon, a mixed gas of a monosilane gas at 150 sccm and a hydrogen gas at 400 sccm was used. The deposition pressure was set to 80 Pa. As a power source, an RF power source with a frequency of 13.56 MHz was used and a power of 200 W was applied. The substrate temperature was 220° C. In other words, the condition was the same as that of amorphous silicon used in Sample B.

After that, the quartz substrate over which the amorphous silicon was formed was divided into 10 mm square parts, thus Sample C was manufactured.

Next, Sample C was subjected to TDS analysis. A thermal desorption spectroscopy apparatus EMD-WA1000S/W manufactured by ESCO Ltd. was used for the TDS analysis.

Figure 41A:
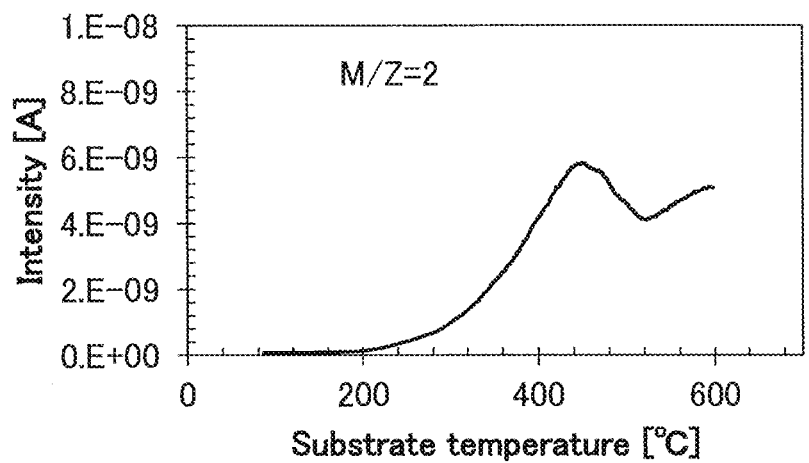
FIGS. 41A to 41C are diagrams illustrating results of TDS analysis of a hydrogen-containing layer.
Figure 41B:
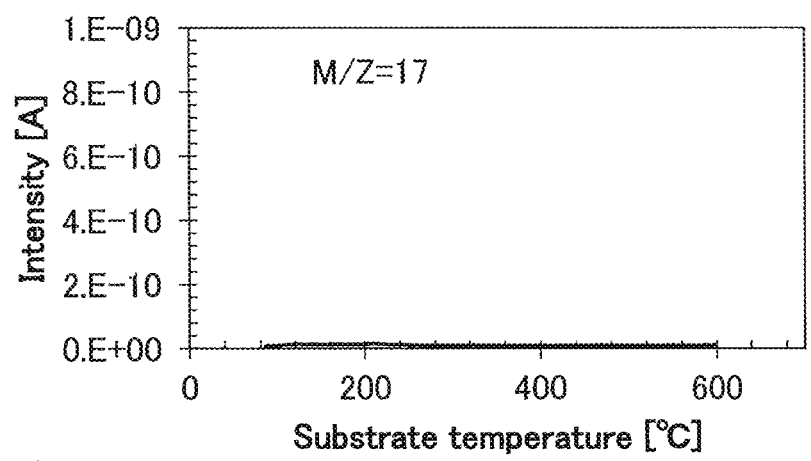
Figure 41C:
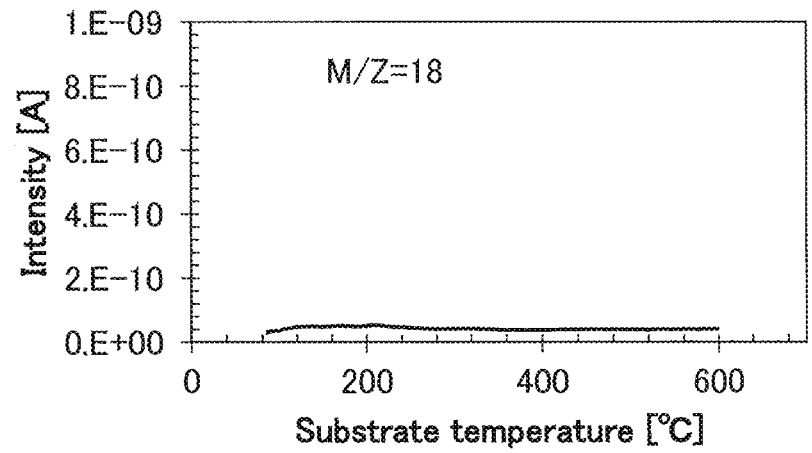

The results are shown in FIGS. 41A to 41C. Note that FIG. 41A shows the result with a mass-to-charge ratio (M/Z)=2 (e.g., H$_2$), FIG. 41B shows the result with M/Z=17 (e.g., OH and NH$_3$), and FIG. 41C shows the result with M/Z=18 (e.g., H$_2$O).

According to FIG. 41A, Sample C released a hydrogen gas. Furthermore, the amount of released hydrogen gas of Sample E was reduced compared with that of Sample D. Specifically, the amount of released hydrogen gas was 1.2×10$^{17}$/cm$^2$ at a temperature range of 53° C. to 584° C. and the amount of released hydrogen gas was 1.3×10$^{16}$/cm$^2$ at a temperature range of 53° C. to 250° C. According to FIGS. 41B and 41C, from Sample C, OH, NH$_3$, H$_2$O, and the like were hardly released compared with the hydrogen gas.

Therefore, the amorphous silicon used in Sample B functioned as a hydrogen-containing layer and released hydrogen. It is highly likely that the carrier density was increased because hydrogen in the amorphous silicon was diffused into an In—Ga—Zn oxide.

Note that hydrogen concentration of the amorphous silicon measured by SIMS was 6×10$^{21}$ atoms/cm$^3$.

This application is based on Japanese Patent Application serial no. 2015-206186 filed with Japan Patent Office on Oct. 20, 2015, the entire contents of which are hereby incorporated by reference.

What is claimed is:

1. A method for manufacturing a semiconductor device, comprising:
forming an oxide semiconductor over a first insulator;
forming a second insulator over the first insulator and the oxide semiconductor;
forming a first conductor over the second insulator;
forming a second conductor including a region overlapping with the oxide semiconductor by processing the first conductor; and
performing heat treatment after forming a hydrogen-containing layer over the second insulator and the second conductor.

2. The method according to claim 1, further comprising:
forming a third insulator in contact with a side surface of the second conductor before forming the hydrogen-containing layer.

3. The method according to claim 1, further comprising:
adding an ion to the oxide semiconductor before forming the hydrogen-containing layer.

4. The method according to claim 1, wherein the oxide semiconductor includes indium and zinc.

5. The method according to claim 1, wherein the second insulator includes at least one of silicon oxide and silicon oxynitride.

6. The method according to claim 1, wherein a hydrogen concentration of the hydrogen-containing layer measured by secondary ion mass spectrometry before the heat treatment is in a range of $1 \times 10^{21}$ atoms/cm$^3$ or higher and $5 \times 10^{22}$ atoms/cm$^3$ or lower.

7. The method according to claim 1, wherein the hydrogen-containing layer includes at least one of amorphous silicon and a hydrogen compound of a metal.

8. A method for manufacturing a semiconductor device, comprising:
forming a first conductor over a first insulator;
forming a second insulator over the first insulator and the first conductor;
forming a first oxide semiconductor and a second oxide semiconductor over the second insulator;
forming a third insulator over the second insulator and the first oxide semiconductor;
forming a fourth insulator over the second oxide semiconductor and the third insulator; and
performing heat treatment after forming a hydrogen-containing layer over the fourth insulator.

9. The method according to claim 8, further comprising:
adding an ion to the second oxide semiconductor before forming the hydrogen-containing layer.

10. The method according to claim 8, further comprising:
removing the hydrogen-containing layer after the heat treatment;
forming a second conductor over the fourth insulator; and
forming a third conductor including a region overlapping with the second oxide semiconductor by processing the second conductor.

11. The method according to claim 8, further comprising:
forming a fourth conductor including a region overlapping with the second oxide semiconductor by processing the hydrogen-containing layer.

12. The method according to claim 8, wherein each of the first oxide semiconductor and the second oxide semiconductor includes indium and zinc.

13. The method according to claim 8, wherein the third insulator has a function of blocking hydrogen.

14. The method according to claim 8, wherein the fourth insulator includes at least one of silicon oxide and silicon oxynitride.

15. The method according to claim 8, wherein a hydrogen concentration of the hydrogen-containing layer measured by secondary ion mass spectrometry before the heat treatment is in a range of $1 \times 10^{21}$ atoms/cm$^3$ or higher and $5 \times 10^{22}$ atoms/cm$^3$ or lower.

16. The method according to claim 8, wherein the hydrogen-containing layer includes at least one of amorphous silicon and a hydrogen compound of a metal.

17. A method for manufacturing a semiconductor device, comprising:
forming an oxide semiconductor;
forming an insulator over the oxide semiconductor;
forming a conductor over the insulator, the conductor including a region overlapping with the oxide semiconductor;
forming a hydrogen-containing layer over the insulator and the conductor; and
performing heat treatment on the hydrogen-containing layer at a temperature in a range of 150° C. or higher and 450° C. or lower.

18. The method according to claim 17, further comprising:
forming a second insulator in contact with a side surface of the conductor before forming the hydrogen-containing layer.

19. The method according to claim 17, further comprising:
adding an ion to the oxide semiconductor before forming the hydrogen-containing layer.

20. The method according to claim 17, wherein the oxide semiconductor includes indium and zinc.

21. The method according to claim 17, wherein the insulator includes at least one of silicon oxide and silicon oxynitride.

22. The method according to claim 17, wherein a hydrogen concentration of the hydrogen-containing layer measured by secondary ion mass spectrometry before the heat treatment is in a range of $1 \times 10^{21}$ atoms/cm$^3$ or higher and $5 \times 10^{22}$ atoms/cm$^3$ or lower.

23. The method according to claim 17, wherein the hydrogen-containing layer includes at least one of amorphous silicon and a hydrogen compound of a metal.

24. A method for manufacturing a semiconductor device, comprising:
forming a first conductor;
forming a first insulator over the first conductor;
forming a first oxide semiconductor and a second oxide semiconductor over the first insulator;
forming a second insulator over the first insulator and the first oxide semiconductor;
forming a third insulator over the second oxide semiconductor and the second insulator;
forming a hydrogen-containing layer over the third insulator; and
performing heat treatment on the hydrogen-containing layer at a temperature in a range of 150° C. or higher and 450° C. or lower.

25. The method according to claim 24, further comprising:
adding an ion to the second oxide semiconductor before forming the hydrogen-containing layer.

26. The method according to claim 24, further comprising:
   removing the hydrogen-containing layer after the heat treatment; and
   forming a second conductor over the third insulator, the second conductor including a region overlapping with the second oxide semiconductor.

27. The method according to claim 24, further comprising:
   forming a third conductor including a region overlapping with the second oxide semiconductor by processing the hydrogen-containing layer.

28. The method according to claim 24, wherein each of the first oxide semiconductor and the second oxide semiconductor includes indium and zinc.

29. The method according to claim 24, wherein the second insulator has a function of blocking hydrogen.

30. The method according to claim 24, wherein the third insulator includes at least one of silicon oxide and silicon oxynitride.

31. The method according to claim 24, wherein a hydrogen concentration of the hydrogen-containing layer measured by secondary ion mass spectrometry before the heat treatment is in a range of $1\times10^{21}$ atoms/cm$^3$ or higher and $5\times10^{22}$ atoms/cm$^3$ or lower.

32. The method according to claim 24, wherein the hydrogen-containing layer includes at least one of amorphous silicon and a hydrogen compound of a metal.

* * * * *